United States Patent
Landsberg et al.

(10) Patent No.: US 12,066,517 B2
(45) Date of Patent: Aug. 20, 2024

(54) RADAR APPARATUS, SYSTEM, AND METHOD

(71) Applicant: Intel Corporation, Santa Clara, CA (US)

(72) Inventors: Naftali Landsberg, Kiryat Ono (IL); Woorim Shin, Portland, OR (US); Dan Ohev Zion, Ra'anana (IL); Meir Gordon, Holon (IL); Omer Asaf, Oranit (IL); Danniel Nahmanny, Givat Shapira (IL); Mustafijur Rahman, Hillsboro, OR (US); Stefano Pellerano, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 472 days.

(21) Appl. No.: 17/326,133

(22) Filed: May 20, 2021

(65) Prior Publication Data
US 2021/0364619 A1 Nov. 25, 2021

Related U.S. Application Data

(63) Continuation of application No. PCT/US2020/052423, filed on Sep. 24, 2020.
(Continued)

(51) Int. Cl.
*G01S 13/34* (2006.01)
*G01S 13/88* (2006.01)
(Continued)

(52) U.S. Cl.
CPC ......... *G01S 13/342* (2013.01); *G01S 13/881* (2013.01); *H04B 1/0483* (2013.01);
(Continued)

(58) Field of Classification Search
CPC .... G01S 13/342; G01S 13/881; G01S 13/931; G01S 2013/93271; G01S 13/4454;
(Continued)

(56) References Cited

U.S. PATENT DOCUMENTS 7,221,919 B2   5/2007   Takagi
7,911,269 B2   3/2011   Yang et al.
(Continued)

FOREIGN PATENT DOCUMENTS

JP   H11-174146     7/1999
JP   2011-259083 A  12/2011
(Continued)

OTHER PUBLICATIONS

Search Report and Written Opinion for PCT/US2020/052423, mailed on Feb. 9, 2021, 9 pages.
(Continued)

*Primary Examiner* — Hieu P Nguyen
(74) *Attorney, Agent, or Firm* — Shichrur & Co.

(57) ABSTRACT

Some demonstrative aspects include radar apparatuses, devices, systems and methods. In one example, an apparatus may include a plurality of Transmit (Tx) chains to transmit radar Tx signals, and a plurality of Receive (Rx) chains to process radar Rx signals. For example, the radar Rx signals may be based on the radar Tx signals. The apparatus may be implemented, for example, as part of a radar device, for example, as part of a vehicle including the radar device. In other aspects, the apparatus may include any other additional or alternative elements and/or may be implemented as part of any other device.

25 Claims, 30 Drawing Sheets

Related U.S. Application Data

(60) Provisional application No. 63/027,970, filed on May 21, 2020, provisional application No. 63/027,983, filed on May 21, 2020, provisional application No. 63/029,515, filed on May 24, 2020.

(51) Int. Cl.
  *H03F 3/21* (2006.01)
  *H04B 1/04* (2006.01)
  *G01S 13/931* (2020.01)
(52) U.S. Cl.
  CPC ... *G01S 13/931* (2013.01); *G01S 2013/93271* (2020.01); *H04B 2001/0408* (2013.01)
(58) Field of Classification Search
  CPC ..... G01S 2013/9323; G01S 2013/9324; G01S 7/032; G01S 7/356; G01S 13/343; G01S 7/352; G01S 7/285; H04B 1/0483; H04B 2001/0408; H03F 1/0261; H03F 3/195; H03F 3/211; H03F 2200/294; H03F 2200/451
  USPC ..................... 330/277, 285, 296, 295, 124 R
  See application file for complete search history.

(56) References Cited

U.S. PATENT DOCUMENTS

| | | | |
|---|---|---|---|
| 9,178,473 | B2 | 11/2015 | Sankaranarayanan |
| 9,325,535 | B2 * | 4/2016 | Khoury ............... H03F 3/245 |
| 10,921,436 | B2 * | 2/2021 | Jansen ................ G01S 13/583 |
| 2007/0037544 | A1 | 2/2007 | Heikkinen |
| 2009/0124227 | A1 | 5/2009 | Ishiguro |
| 2015/0301163 | A1 | 10/2015 | Kim et al. |
| 2016/0233900 | A1 | 8/2016 | Garrec et al. |
| 2018/0059216 | A1 | 3/2018 | Onic et al. |
| 2019/0199293 | A1 | 6/2019 | Choi |
| 2020/0132805 | A1 | 4/2020 | Lehne et al. |

FOREIGN PATENT DOCUMENTS

| | | |
|---|---|---|
| KR | 10-2018-0099936 | 9/2018 |
| WO | 2008/145604 | 12/2008 |

OTHER PUBLICATIONS

Chunyu Xin, Edgar Sánchez-Sinencio, "A linearization technique for RF low noise amplifier", Texas A&M University Department of Electrical Engineering College Station, TX 77843, 2004 IEEE International Symposium on Circuits and Systems, pp. 313-316.

Ester Boampong, "Auxiliary-Path-Assisted Digital Linearization of Wideband Wireless Receivers", Submitted to the Office of Graduate and Professional Studies of Texas A&M University in partial fulfillment of the requirements for the degree of Master of Science, May 2018, 89 pages.

A. Rungta and K. Kandpal, "IIP3 Improvement in Subthreshold LNAs Using Modified Derivative Superposition Technique for IoT Applications," 2019 32nd International Conference on VLSI Design and 2019 18th International Conference on Embedded Systems (VLSID), Delhi, NCR, India, 2019, pp. 130-134.

Y. M. Kim, H. Han and T. W. Kim, "A 0.6-V +4 dBm IIP3 LC Folded Cascode CMOS LNA With gm Linearization," in IEEE Transactions on Circuits and Systems II: Express Briefs, vol. 60, No. 3, pp. 122-126, Mar. 2013.

H. G. Han and T. W. Kim, "A Cmos Rf Programmable-Gain Amplifier for Digital TV With a +9dBm IIP3 Cross-Coupled Common-Gate LNA," in IEEE Transactions on Circuits and Systems II: Express Briefs, vol. 59, No. 9, pp. 543-547, Sep. 2012.

M. Mollaalipour and H. M. Naimi, "Volterra series analysis of down-conversion CMOS mixer with high IIP2 and IIP3," 2012 International Conference on Synthesis, Modeling, Analysis and Simulation Methods and Applications to Circuit Design (SMACD), Seville, 2012, pp. 201-204.

Y. Zhang, J. Zhu and p. R. Kinget, "An FTNC receiver with +32.5dBm effective OB-IIP3 using baseband IM3 cancellation," 2017 IEEE Radio Frequency Integrated Circuits Symposium (RFIC), Honolulu, HI, 2017, pp. 3-6.

International Preliminary Report on Patentability for International Application No. PCT/US2020/052423, mailed on Dec. 1, 2022, 6 pages.

Office Action for Dutch Patent Application No. 2028246, mailed on Apr. 21, 2022, 16 pages.

Arash Daghighi, "Output-Conductance Transition-Free Method for Improving the Radio-Frequency Linearity of Silicon-on-Insulator MOSFET Circuits", IEEE Transactions on Electron Devices, vol. 61, No. 7, Jul. 2014, pp. 2257-2263.

Search Report for European Patent Application No. 20936538.6, mailed on Jan. 5, 2024, 11 pages.

Office Action for Japanese Patent Application No. 2022-562850, mailed on May 28, 2024, 2 pages.

Figueroa et al. "Intermediate frequency variation in a long-range FMCW radar for harmonics cancellation", IET Radar Sonar & Navigation, 2020, vol. 14, Iss 5, pp. 764-772, 10 pages.

Harker et al., "Dynamic range improvements and measurements in radar system", IET Radar Sonar & Navigation, vol. 1, No. 6, Dec. 2007, pp. 398-406, 10 pages.

* cited by examiner

RADAR APPARATUS, SYSTEM, AND METHOD

CROSS REFERENCE

This application claims the benefit of, and priority from, U.S. Provisional Patent Application No. 63/027,983 entitled "APPARATUS, SYSTEM, AND METHOD OF A RECEIVE (RX) CHAIN", filed May 21, 2020, U.S. Provisional Patent Application No. 63/027,970 entitled "APPARATUS, SYSTEM, AND METHOD OF DIRECT-CONVERSION RECEIVE (RX) CHAIN WITH ACTIVE MIXER", filed May 21, 2020, and U.S. Provisional Patent Application No. 63/029,515 entitled "APPARATUS, SYSTEM, AND METHOD OF A RECEIVE (RX) CHAIN WITH A MULTI-CORE LOW NOISE AMPLIFIER (LNA)", filed May 24, 2020, the entire disclosures of which are incorporated herein by reference.

TECHNICAL FIELD

Aspects described herein generally relate to radar devices.

BACKGROUND

Various types of devices and systems, for example, autonomous and/or robotic devices, e.g., autonomous vehicles and robots, may be configured to perceive and navigate through their environment using sensor data of one or more sensor types.

Conventionally, autonomous perception relies heavily on light-based sensors, such as image sensors, e.g., cameras, and/or Light Detection and Ranging (LIDAR) sensors. Such light-based sensors may perform poorly under certain conditions, such as, conditions of poor visibility, or in certain inclement weather conditions, e.g., rain, snow, hail, or other forms of precipitation, thereby limiting their usefulness or reliability.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
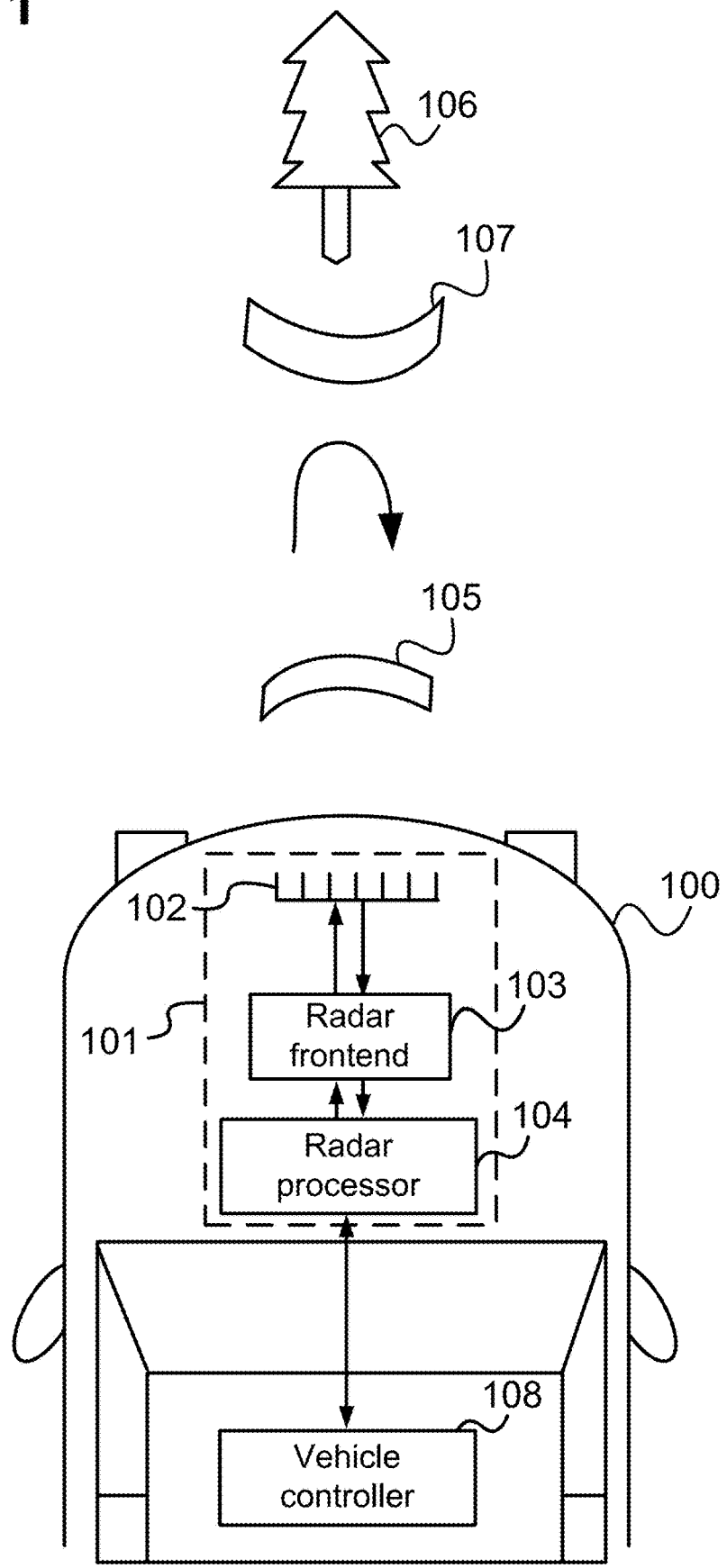
FIG. 1 is a schematic block diagram illustration of a vehicle implementing a radar, in accordance with some demonstrative aspects.

In the following detailed description, numerous specific details are set forth in order to provide a thorough understanding of some aspects. However, it will be understood by persons of ordinary skill in the art that some aspects may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

The words "exemplary" and "demonstrative" are used herein to mean "serving as an example, instance, demonstration, or illustration". Any aspect, embodiment, or design described herein as "exemplary" or "demonstrative" is not necessarily to be construed as preferred or advantageous over other aspects, embodiments, or designs.

References to "one embodiment", "an embodiment", "demonstrative embodiment", "various embodiments" "one aspect", "an aspect", "demonstrative aspect", "various aspects" etc., indicate that the embodiment(s) and/or aspects so described may include a particular feature, structure, or characteristic, but not every embodiment or aspect necessarily includes the particular feature, structure, or characteristic. Further, repeated use of the phrase "in one embodiment" or "in one aspect" does not necessarily refer to the same embodiment or aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The phrases "at least one" and "one or more" may be understood to include a numerical quantity greater than or equal to one, e.g., one, two, three, four, [ . . . ], etc. The phrase "at least one of" with regard to a group of elements may be used herein to mean at least one element from the group consisting of the elements. For example, the phrase "at least one of" with regard to a group of elements may be used herein to mean one of the listed elements, a plurality of one of the listed elements, a plurality of individual listed elements, or a plurality of a multiple of individual listed elements.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and/or may represent any information as understood in the art.

The terms "processor" or "controller" may be understood to include any kind of technological entity that allows handling of any suitable type of data and/or information. The data and/or information may be handled according to one or more specific functions executed by the processor or controller. Further, a processor or a controller may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), and the like, or any combination thereof. Any other kind of implementation of the respective functions, which will be described below in further detail, may also be understood as a processor, controller, or logic circuit. It is understood that any two (or more) processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" is understood as a computer-readable medium (e.g., a non-transitory computer-readable medium) in which data or information can be stored for retrieval. References to "memory" may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" may be used to refer to any type of executable instruction and/or logic, including firmware.

A "vehicle" may be understood to include any type of driven object. By way of example, a vehicle may be a driven object with a combustion engine, an electric engine, a reaction engine, an electrically driven object, a hybrid driven object, or a combination thereof. A vehicle may be, or may include, an automobile, a bus, a mini bus, a van, a truck, a mobile home, a vehicle trailer, a motorcycle, a bicycle, a tricycle, a train locomotive, a train wagon, a moving robot, a personal transporter, a boat, a ship, a submersible, a submarine, a drone, an aircraft, a rocket, among others.

A "ground vehicle" may be understood to include any type of vehicle, which is configured to traverse the ground, e.g., on a street, on a road, on a track, on one or more rails, off-road, or the like.

An "autonomous vehicle" may describe a vehicle capable of implementing at least one navigational change without driver input. A navigational change may describe or include a change in one or more of steering, braking, acceleration/deceleration, or any other operation relating to movement, of the vehicle. A vehicle may be described as autonomous even in case the vehicle is not fully autonomous, for example, fully operational with driver or without driver input. Autonomous vehicles may include those vehicles that can operate under driver control during certain time periods, and without driver control during other time periods. Additionally or alternatively, autonomous vehicles may include vehicles that control only some aspects of vehicle navigation, such as steering, e.g., to maintain a vehicle course between vehicle lane constraints, or some steering operations under certain circumstances, e.g., not under all circumstances, but may leave other aspects of vehicle navigation to the driver, e.g., braking or braking under certain circumstances. Additionally or alternatively, autonomous vehicles may include vehicles that share the control of one or more aspects of vehicle navigation under certain circumstances, e.g., hands-on, such as responsive to a driver input; and/or vehicles that control one or more aspects of vehicle navigation under certain circumstances, e.g., hands-off, such as independent of driver input. Additionally or alternatively, autonomous vehicles may include vehicles that control one or more aspects of vehicle navigation under certain circumstances, such as under certain environmental conditions, e.g., spatial areas, roadway conditions, or the like. In some aspects, autonomous vehicles may handle some or all aspects of braking, speed control, velocity control, steering, and/or any other additional operations, of the vehicle. An autonomous vehicle may include those vehicles that can operate without a driver. The level of autonomy of a vehicle may be described or determined by the Society of Automotive Engineers (SAE) level of the vehicle, e.g., as defined by the SAE, for example in *SAE J3016 2018: Taxonomy and definitions for terms related to driving automation systems for on road motor vehicles*, or by other relevant professional organizations. The SAE level may have a value ranging from a minimum level, e.g., level 0 (illustratively, substantially no driving automation), to a maximum level, e.g., level 5 (illustratively, full driving automation).

The phrase "vehicle operation data" may be understood to describe any type of feature related to the operation of a vehicle. By way of example, "vehicle operation data" may describe the status of the vehicle, such as, the type of tires of the vehicle, the type of vehicle, and/or the age of the manufacturing of the vehicle. More generally, "vehicle operation data" may describe or include static features or static vehicle operation data (illustratively, features or data not changing over time). As another example, additionally or alternatively, "vehicle operation data" may describe or include features changing during the operation of the vehicle, for example, environmental conditions, such as weather conditions or road conditions during the operation of the vehicle, fuel levels, fluid levels, operational parameters of the driving source of the vehicle, or the like. More generally, "vehicle operation data" may describe or include varying features or varying vehicle operation data (illustratively, time varying features or data).

Some aspects may be used in conjunction with various devices and systems, for example, a radar sensor, a radar device, a radar system, a vehicle, a vehicular system, an autonomous vehicular system, a vehicular communication system, a vehicular device, an airborne platform, a waterborne platform, road infrastructure, sports-capture infrastructure, city monitoring infrastructure, static infrastructure platforms, indoor platforms, moving platforms, robot platforms, industrial platforms, a sensor device, a User Equipment (UE), a Mobile Device (MD), a wireless station (STA), a sensor device, a non-vehicular device, a mobile or portable device, and the like.

Some aspects may be used in conjunction with Radio Frequency (RF) systems, radar systems, vehicular radar systems, autonomous systems, robotic systems, detection systems, or the like.

Some demonstrative aspects may be used in conjunction with an RF frequency in a frequency band having a starting frequency above 10 Gigahertz (GHz), for example, a frequency band having a starting frequency between 10 GHz and 120 GHz. For example, some demonstrative aspects may be used in conjunction with an RF frequency having a starting frequency above 30 GHz, for example, above 45 GHz, e.g., above 60 GHz. For example, some demonstrative aspects may be used in conjunction with an automotive radar frequency band, e.g., a frequency band between 76 GHz and 81 GHz. However, other aspects may be implemented utilizing any other suitable frequency bands, for example, a frequency band above 140 GHz, a frequency band of 300 GHz, a sub Terahertz (THz) band, a THz band, an Infra Red (IR) band, and/or any other frequency band.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, the circuitry may be implemented in, or functions associated with the circuitry may be implemented by, one or more software or firmware modules. In some aspects, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "communicating" as used herein with respect to a signal includes transmitting the signal and/or receiving the signal. For example, an apparatus, which is capable of communicating a signal, may include a transmitter to transmit the signal, and/or a receiver to receive the signal. The verb communicating may be used to refer to the action of transmitting or the action of receiving. In one example, the phrase "communicating a signal" may refer to the action of transmitting the signal by a transmitter, and may not necessarily include the action of receiving the signal by a receiver. In another example, the phrase "communicating a signal" may refer to the action of receiving the signal by a receiver, and may not necessarily include the action of transmitting the signal by a transmitter.

The term "antenna", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like. In one example, an antenna may be implemented as a separate element or an integrated element, for example, as an on-module antenna, an on-chip antenna, or according to any other antenna architecture.

Some demonstrative aspects are described herein with respect to RF radar signals. However, other aspects may be implemented with respect to, or in conjunction with, any other radar signals, wireless signals, IR signals, acoustic signals, optical signals, wireless communication signals, communication scheme, network, standard, and/or protocol. For example, some demonstrative aspects may be implemented with respect to systems, e.g., Light Detection Ranging (LiDAR) systems, and/or sonar systems, utilizing light and/or acoustic signals.

Reference is now made to FIG. 1, which schematically illustrates a block diagram of a vehicle 100 implementing a radar, in accordance with some demonstrative aspects.

In some demonstrative aspects, vehicle 100 may include a car, a truck, a motorcycle, a bus, a train, an airborne vehicle, a waterborne vehicle, a cart, a golf cart, an electric cart, a road agent, or any other vehicle.

In some demonstrative aspects, vehicle 100 may include a radar device 101, e.g., as described below. For example, radar device 101 may include a radar detecting device, a radar sensing device, a radar sensor, or the like, e.g., as described below.

In some demonstrative aspects, radar device 101 may be implemented as part of a vehicular system, for example, a system to be implemented and/or mounted in vehicle 100.

In one example, radar device 101 may be implemented as part of an autonomous vehicle system, an automated driving system, a driver assistance and/or support system, and/or the like.

For example, radar device 101 may be installed in vehicle 101 for detection of nearby objects, e.g., for autonomous driving.

In some demonstrative aspects, radar device 101 may be configured to detect targets in a vicinity of vehicle 100, e.g., in a far vicinity and/or a near vicinity, for example, using RF and analog chains, capacitor structures, large spiral transformers and/or any other electronic or electrical elements, e.g., as described below. In one example, radar device 101 may be mounted onto, placed, e.g., directly, onto, or attached to, vehicle 100.

In some demonstrative aspects, vehicle 100 may include a single radar device 101. In other aspects, vehicle 100 may include a plurality of radar devices 101, for example, at a plurality of locations, e.g., around vehicle 100.

In some demonstrative aspects, radar device 101 may be implemented as a component in a suite of sensors used for driver assistance and/or autonomous vehicles, for example, due to the ability of radar to operate in nearly all-weather conditions.

In some demonstrative aspects, radar device 101 may be configured to support autonomous vehicle usage, e.g., as described below.

In one example, radar device 101 may determine a class, a location, an orientation, a velocity, an intention, a perceptional understanding of the environment, and/or any other information corresponding to an object in the environment.

In another example, radar device 101 may be configured to determine one or more parameters and/or information for one or more operations and/or tasks, e.g., path planning, and/or any other tasks.

In some demonstrative aspects, radar device 101 may be configured to map a scene by measuring targets' echoes (reflectivity) and discriminating them, for example, mainly in range, velocity, azimuth and/or elevation, e.g., as described below.

In some demonstrative aspects, radar device 101 may be configured to detect, and/or sense, one or more objects, which are located in a vicinity, e.g., a far vicinity and/or a near vicinity, of the vehicle 100, and to provide one or more parameters, attributes, and/or information with respect to the objects.

In some demonstrative aspects, the objects may include other vehicles; pedestrians; traffic signs; traffic lights; roads, road elements, e.g., a pavement-road meeting, an edge line; a hazard, e.g., a tire, a box, a crack in the road surface; and/or the like.

In some demonstrative aspects, the one or more parameters, attributes and/or information with respect to the object may include a range of the objects from the vehicle 100, an angle of the object with respect to the vehicle 100, a location of the object with respect to the vehicle 100, a relative speed of the object with respect to vehicle 100, and/or the like.

In some demonstrative aspects, radar device 101 may include a Multiple Input Multiple Output (MIMO) radar device 101, e.g., as described below. In one example, the MIMO radar device may be configured to utilize "spatial filtering" processing, for example, beamforming and/or any other mechanism, for one or both of Transmit (Tx) signals and/or Receive (Rx) signals.

Some demonstrative aspects are described below with respect to a radar device, e.g., radar device 101, implemented as a MIMO radar. However, in other aspects, radar device 101 may be implemented as any other type of radar utilizing a plurality of antenna elements, e.g., a Single Input Multiple Output (SIMO) radar or a Multiple Input Single output (MISO) radar.

Some demonstrative aspects may be implemented with respect to a radar device, e.g., radar device 101, implemented as a MIMO radar, e.g., as described below. However, in other aspects, radar device 101 may be implemented as any other type of radar, for example, an Electronic Beam Steering radar, a Synthetic Aperture Radar (SAR), adaptive and/or cognitive radars that change their transmission according to the environment and/or ego state, a reflect array radar, or the like.

In some demonstrative aspects, radar device 101 may include an antenna arrangement 102, a radar frontend 103 configured to communicate radar signals via the antenna arrangement 102, and a radar processor 104 configured to generate radar information based on the radar signals, e.g., as described below.

In some demonstrative aspects, radar processor 104 may be configured to process radar information of radar device 101 and/or to control one or more operations of radar device 101, e.g., as described below.

In some demonstrative aspects, radar processor 104 may include, or may be implemented, partially or entirely, by circuitry and/or logic, e.g., one or more processors including circuitry and/or logic, memory circuitry and/or logic. Additionally or alternatively, one or more functionalities of radar processor 104 may be implemented by logic, which may be executed by a machine and/or one or more processors, e.g., as described below.

In one example, radar processor 104 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In other aspects, radar processor 104 may be implemented by one or more additional or alternative elements of vehicle 100.

In some demonstrative aspects, radar frontend 103 may include, for example, one or more (radar) transmitters, and a one or more (radar) receivers, e.g., as described below.

In some demonstrative aspects, antenna arrangement 102 may include a plurality of antennas to communicate the radar signals. For example, antenna arrangement 102 may include multiple transmit antennas in the form of a transmit antenna array, and multiple receive antennas in the form of a receive antenna array. In another example, antenna arrangement 102 may include one or more antennas used both as transmit and receive antennas. In the latter case, the radar frontend 103, for example, may include a duplexer, e.g., a circuit to separate transmitted signals from received signals.

In some demonstrative aspects, as shown in FIG. 1, the radar frontend 103 and the antenna arrangement 102 may be controlled, e.g., by radar processor 104, to transmit a radio transmit signal 105.

In some demonstrative aspects, as shown in FIG. 1, the radio transmit signal 105 may be reflected by an object 106, resulting in an echo 107.

In some demonstrative aspects, the radar device 101 may receive the echo 107, e.g., via antenna arrangement 102 and radar frontend 103, and radar processor 104 may generate radar information, for example, by calculating information about position, radial velocity (Doppler), and/or direction of the object 106, e.g., with respect to vehicle 100.

In some demonstrative aspects, radar processor 104 may be configured to provide the radar information to a vehicle controller 108 of the vehicle 100, e.g., for autonomous driving of the vehicle 100.

In some demonstrative aspects, at least part of the functionality of radar processor 104 may be implemented as part of vehicle controller 108. In other aspects, the functionality of radar processor 104 may be implemented as part of any other element of radar device 101 and/or vehicle 100. In other aspects, radar processor 104 may be implemented, as a separate part of, or as part of any other element of radar device 101 and/or vehicle 100.

In some demonstrative aspects, vehicle controller 108 may be configured to control one or more functionalities, modes of operation, components, devices, systems and/or elements of vehicle 100.

In some demonstrative aspects, vehicle controller 108 may be configured to control one or more vehicular systems of vehicle 100, e.g., as described below.

In some demonstrative aspects, the vehicular systems may include, for example, a steering system, a braking system, a driving system, and/or any other system of the vehicle 100.

In some demonstrative aspects, vehicle controller 108 may configured to control radar device 101, and/or to process one or parameters, attributes and/or information from radar device 101.

In some demonstrative aspects, vehicle controller 108 may be configured, for example, to control the vehicular systems of the vehicle 100, for example, based on radar information from radar device 101 and/or one or more other sensors of the vehicle 100, e.g., Light Detection and Ranging (LIDAR) sensors, camera sensors, and/or the like.

In one example, vehicle controller 108 may control the steering system, the braking system, and/or any other vehicular systems of vehicle 100, for example, based on the information from radar device 101, e.g., based on one or more objects detected by radar device 101.

In other aspects, vehicle controller 108 may be configured to control any other additional or alternative functionalities of vehicle 100.

Some demonstrative aspects are described herein with respect to a radar device 101 implemented in a vehicle, e.g., vehicle 100. In other aspects a radar device, e.g., radar device 101, may be implemented as part of any other element of a traffic system or network, for example, as part of a road infrastructure, and/or any other element of a traffic network or system. Other aspects may be implemented with respect to any other system, environment and/or apparatus, which may be implemented in any other object, environment, location, or place. For example, radar device 101 may be part of a non-vehicular device, which may be implemented, for example, in an indoor location, a stationary infrastructure outdoors, or any other location.

In some demonstrative aspects, radar device 101 may be configured to support security usage. In one example, radar device 101 may be configured to determine a nature of an operation, e.g., a human entry, an animal entry, an environmental movement, and the like, to identity a threat level of a detected event, and/or any other additional or alternative operations.

Some demonstrative aspects may be implemented with respect to any other additional or alternative devices and/or systems, for example, for a robot, e.g., as described below.

In other aspects, radar device 101 may be configured to support any other usages and/or applications.

Figure 2:
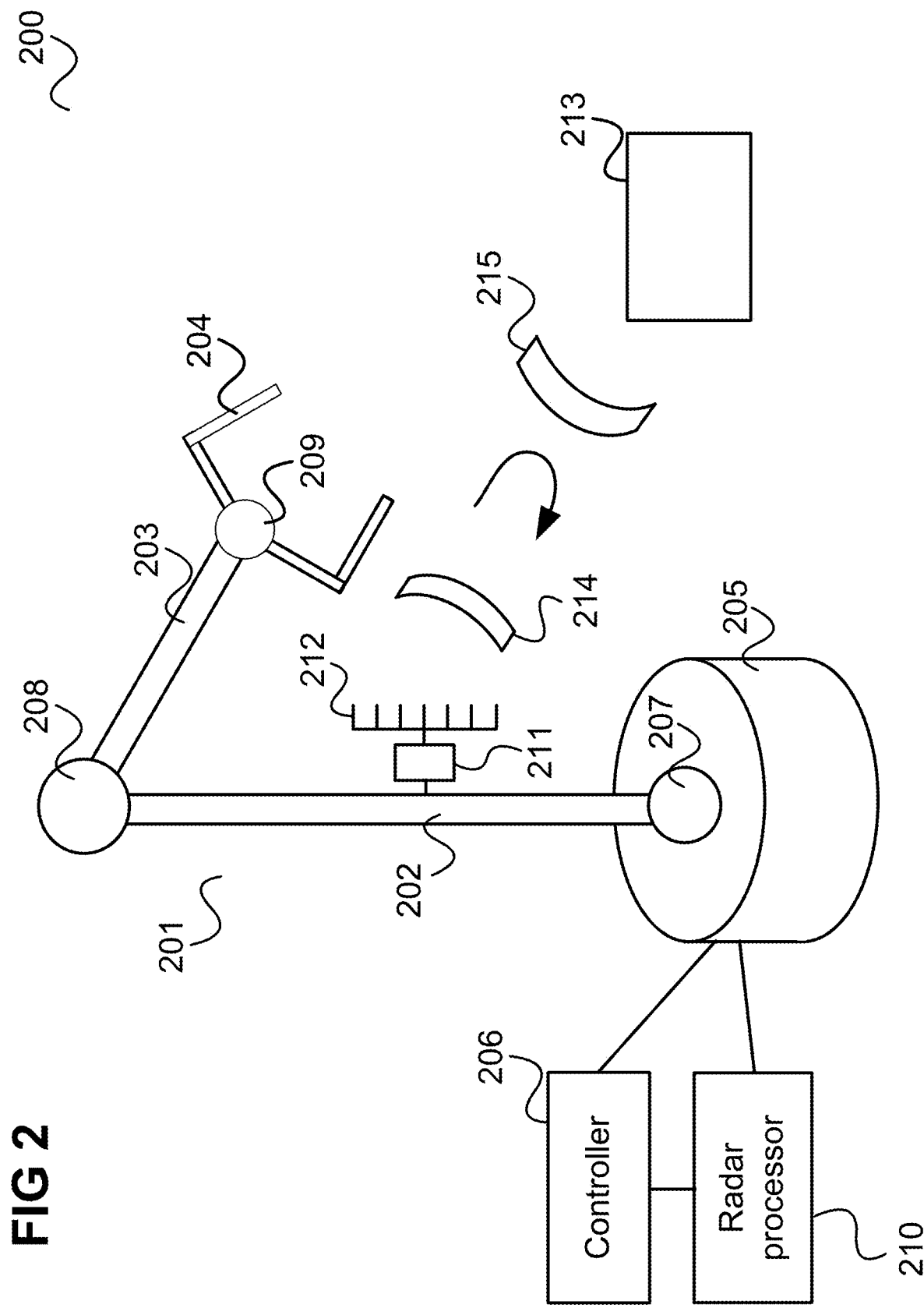
FIG. 2 is a schematic block diagram illustration of a robot implementing a radar, in accordance with some demonstrative aspects.

Reference is now made to FIG. 2, which schematically illustrates a block diagram of a robot 200 implementing a radar, in accordance with some demonstrative aspects.

In some demonstrative aspects, robot 200 may include a robot arm 201. The robot 200 may be implemented, for example, in a factory for handling an object 213, which may be, for example, a part that should be affixed to a product that is being manufactured. The robot arm 201 may include a plurality of movable members, for example, movable members 202, 203, 204, and a support 205. Moving the movable members 202, 203, and/or 204 of the robot arm 201, e.g., by actuation of associated motors, may allow physical interaction with the environment to carry out a task, e.g., handling the object 213.

In some demonstrative aspects, the robot arm 201 may include a plurality of joint elements, e.g., joint elements 207, 208, 209, which may connect, for example, the members 202, 203, and/or 204 with each other, and with the support 205. For example, a joint element 207, 208, 209 may have one or more joints, each of which may provide rotatable motion, e.g., rotational motion, and/or translatory motion, e.g., displacement, to associated members and/or motion of members relative to each other. The movement of the members 202, 203, 204 may be initiated by suitable actuators.

In some demonstrative aspects, the member furthest from the support 205, e.g., member 204, may also be referred to as the end-effector 204 and may include one or more tools, such as, a claw for gripping an object, a welding tool, or the like. Other members, e.g., members 202, 203, closer to the support 205, may be utilized to change the position of the end-effector 204, e.g., in three-dimensional space. For example, the robot arm 201 may be configured to function similarly to a human arm, e.g., possibly with a tool at its end.

In some demonstrative aspects, robot 200 may include a (robot) controller 206 configured to implement interaction with the environment, e.g., by controlling the robot arm's actuators, according to a control program, for example, in order to control the robot arm 201 according to the task to be performed.

In some demonstrative aspects, an actuator may include a component adapted to affect a mechanism or process in response to being driven. The actuator can respond to commands given by the controller 206 (the so-called activation) by performing mechanical movement. This means that an actuator, typically a motor (or electromechanical converter), may be configured to convert electrical energy into mechanical energy when it is activated (i.e. actuated).

In some demonstrative aspects, controller 206 may be in communication with a radar processor 210 of the robot 200.

In some demonstrative aspects, a radar fronted 211 and a radar antenna arrangement 212 may be coupled to the radar processor 210. In one example, radar fronted 211 and/or radar antenna arrangement 212 may be included, for example, as part of the robot arm 201.

In some demonstrative aspects, the radar frontend 211, the radar antenna arrangement 212 and the radar processor 210 may be operable as, and/or may be configured to form, a radar device. For example, antenna arrangement 212 may be configured to perform one or more functionalities of antenna arrangement 102 (FIG. 1), radar frontend 211 may be configured to perform one or more functionalities of radar frontend 103 (FIG. 1), and/or radar processor 210 may be configured to perform one or more functionalities of radar processor 104 (FIG. 1), e.g., as described above.

In some demonstrative aspects, for example, the radar frontend 211 and the antenna arrangement 212 may be controlled, e.g., by radar processor 210, to transmit a radio transmit signal 214.

In some demonstrative aspects, as shown in FIG. 2, the radio transmit signal 214 may be reflected by the object 213, resulting in an echo 215.

In some demonstrative aspects, the echo 215 may be received, e.g., via antenna arrangement 212 and radar frontend 211, and radar processor 210 may generate radar information, for example, by calculating information about position, speed (Doppler) and/or direction of the object 213, e.g., with respect to robot arm 201.

In some demonstrative aspects, radar processor 210 may be configured to provide the radar information to the robot controller 206 of the robot arm 201, e.g., to control robot arm 201. For example, robot controller 206 may be configured to control robot arm 201 based on the radar information, e.g., to grab the object 213 and/or to perform any other operation.

Figure 3:
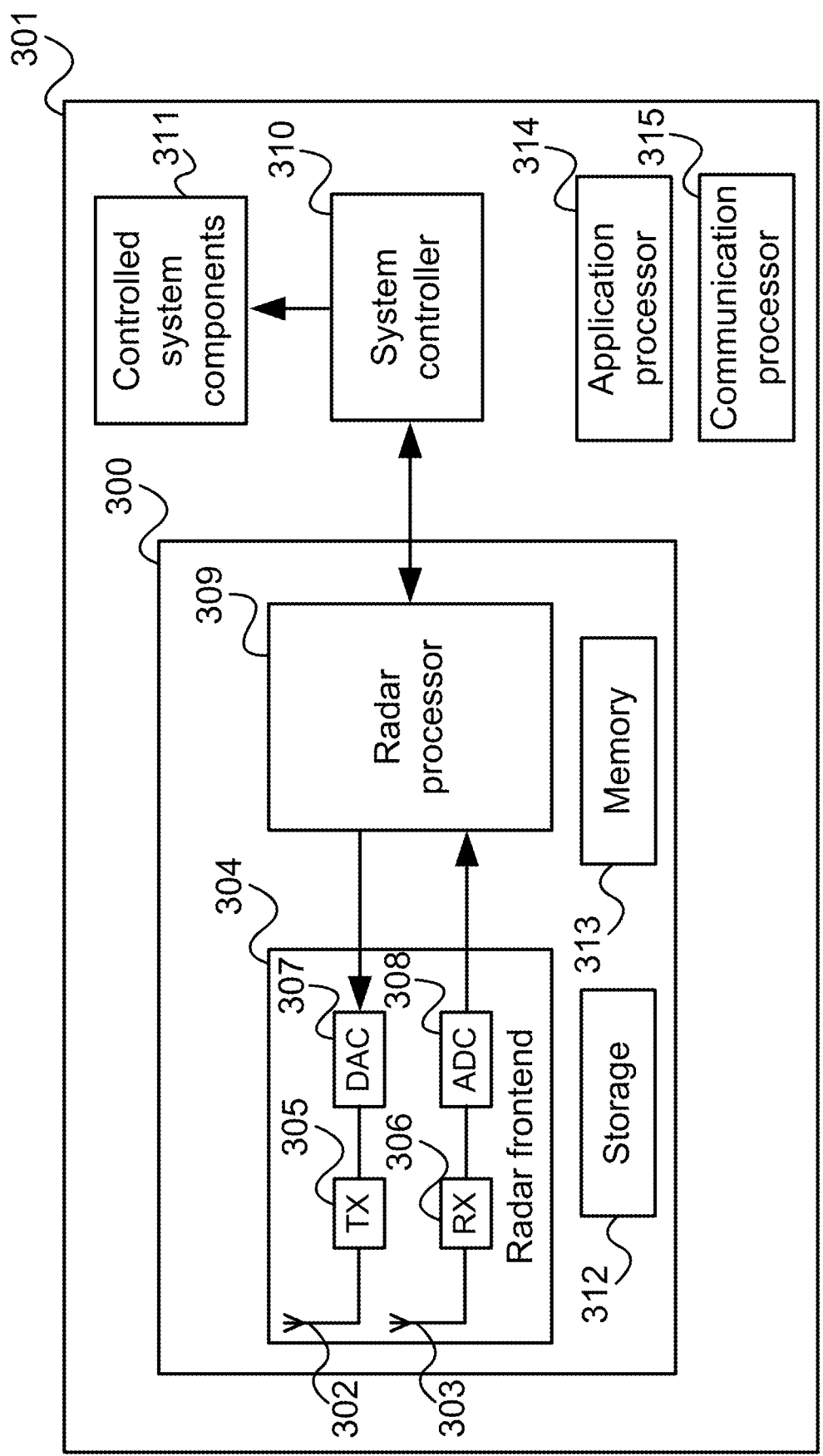
FIG. 3 is a schematic block diagram illustration of a radar apparatus, in accordance with some demonstrative aspects.

Reference is made to FIG. 3, which schematically illustrates a radar apparatus 300, in accordance with some demonstrative aspects.

In some demonstrative aspects, radar apparatus 300 may be implemented as part of a device or system 301, e.g., as described below.

For example, radar apparatus 300 may be implemented as part of, and/or may configured to perform one or more operations and/or functionalities of, the devices or systems described above with reference to FIG. 1 an/or FIG. 2. In other aspects, radar apparatus 300 may be implemented as part of any other device or system 301.

In some demonstrative aspects, radar device 300 may include an antenna arrangement, which may include one or more transmit antennas 302 and one or more receive antennas 303. In other aspects, any other antenna arrangement may be implemented.

In some demonstrative aspects, radar device 300 may include a radar frontend 304, and a radar processor 309.

In some demonstrative aspects, as shown in FIG. 3, the one or more transmit antennas 302 may be coupled with a transmitter (or transmitter arrangement) 305 of the radar frontend 304; and/or the one or more receive antennas 303 may be coupled with a receiver (or receiver arrangement) 306 of the radar frontend 304, e.g., as described below.

In some demonstrative aspects, transmitter 305 may include one or more elements, for example, an oscillator, a power amplifier and/or one or more other elements, configured to generate radio transmit signals to be transmitted by the one or more transmit antennas 302, e.g., as described below.

In some demonstrative aspects, for example, radar processor 309 may provide digital radar transmit data values to the radar frontend 304. For example, radar frontend 304 may include a Digital-to-Analog Converter (DAC) 307 to convert the digital radar transmit data values to an analog transmit signal. The transmitter 305 may convert the analog transmit signal to a radio transmit signal which is to be transmitted by transmit antennas 302.

In some demonstrative aspects, receiver 306 may include one or more elements, for example, one or more mixers, one or more filters and/or one or more other elements, configured to process, down-convert, radio signals received via the one or more receive antennas 303, e.g., as described below.

In some demonstrative aspects, for example, receiver 306 may convert a radio receive signal received via the one or more receive antennas 303 into an analog receive signal. The radar frontend 304 may include an Analog-to-Digital (ADC) Converter 308 to generate digital radar reception data values based on the analog receive signal. For example, radar frontend 304 may provide the digital radar reception data values to the radar processor 309.

In some demonstrative aspects, radar processor 309 may be configured to process the digital radar reception data values, for example, to detect one or more objects, e.g., in an environment of the device/system 301. This detection may include, for example, the determination of information including one or more of range, speed (Doppler), direction, and/or any other information, of one or more objects, e.g., with respect to the system 301.

In some demonstrative aspects, radar processor 309 may be configured to provide the determined radar information to a system controller 310 of device/system 301. For example, system controller 310 may include a vehicle controller, e.g., if device/system 301 includes a vehicular device/system, a robot controller, e.g., if device/system 301 includes a robot device/system, or any other type of controller for any other type of device/system 301.

In some demonstrative aspects, system controller 310 may be configured to control one or more controlled system components 311 of the system 301, e.g. a motor, a brake, steering, and the like, e.g. by one or more corresponding actuators.

In some demonstrative aspects, radar device 300 may include a storage 312 or a memory 313, e.g., to store information processed by radar 300, for example, digital radar reception data values being processed by the radar processor 309, radar information generated by radar processor 309, and/or any other data to be processed by radar processor 309.

In some demonstrative aspects, device/system 301 may include, for example, an application processor 314 and/or a communication processor 315, for example, to at least partially implement one or more functionalities of system controller 310 and/or to perform communication between system controller 310, radar device 300, the controlled system components 311, and/or one or more additional elements of device/system 301.

In some demonstrative aspects, radar device 300 may be configured to generate and transmit the radio transmit signal in a form, which may support determination of range, speed, and/or direction, e.g., as described below.

For example, a radio transmit signal of a radar may be configured to include a plurality of pulses. For example, a pulse transmission may include the transmission of short high-power bursts in combination with times during which the radar device listens for echoes.

For example, in order to more optimally support a highly dynamic situation, e.g., in an automotive scenario, a continuous wave (CW) may instead be used as the radio transmit signal. However, a continuous wave, e.g., with constant frequency, may support velocity determination, but may not allow range determination, e.g., due to the lack of a time mark that could allow distance calculation.

In some demonstrative aspects, radio transmit signal 105 (FIG. 1) may be transmitted according to technologies such as, for example, Frequency-Modulated continuous wave (FMCW) radar, Phase-Modulated Continuous Wave (PMCW) radar, Orthogonal Frequency Division Multiplexing (OFDM) radar, and/or any other type of radar technology, which may support determination of range, velocity, and/or direction, e.g., as described below.

Figure 4:
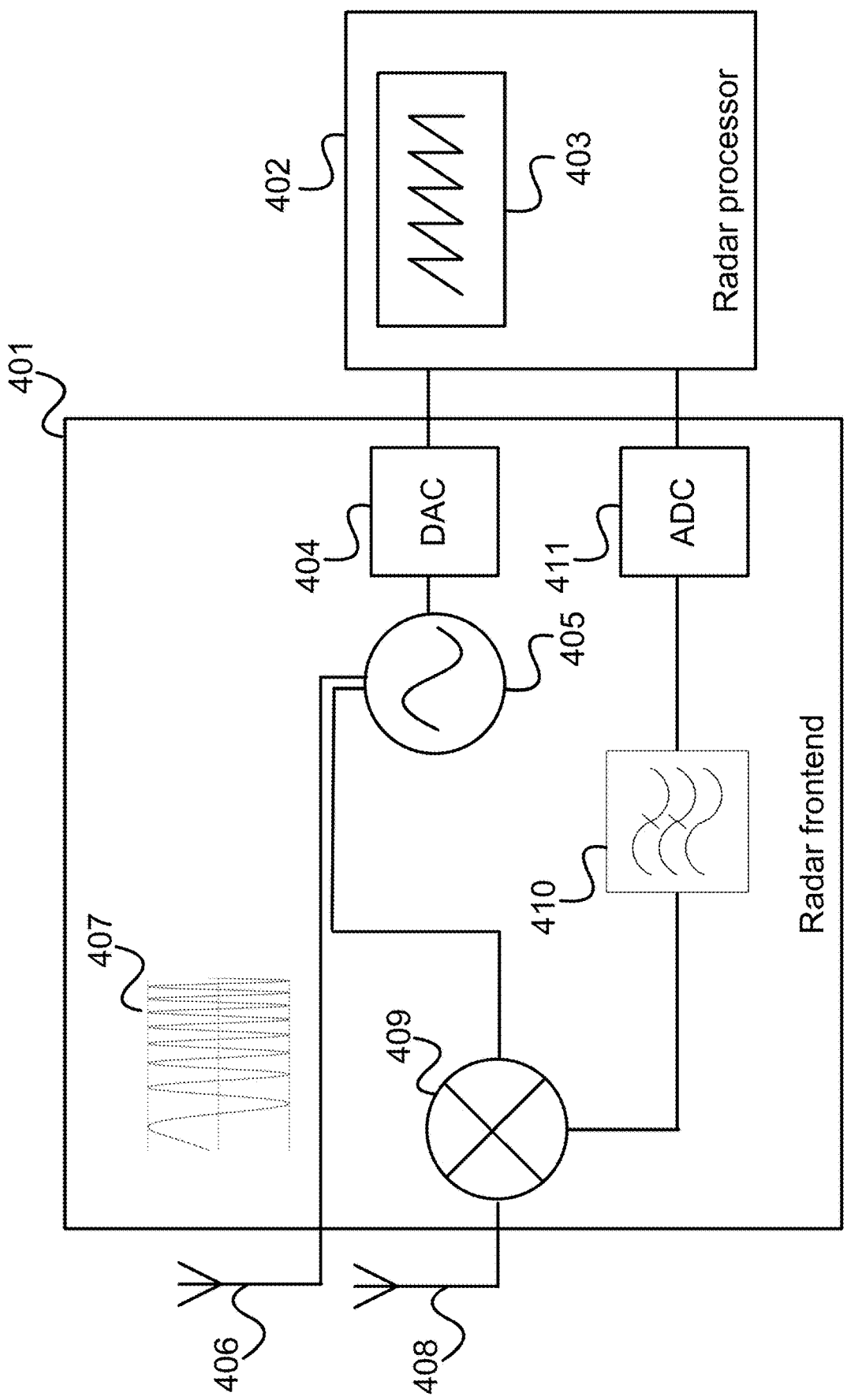
FIG. 4 is a schematic block diagram illustration of a Frequency-Modulated Continuous Wave (FMCW) radar apparatus, in accordance with some demonstrative aspects.

Reference is made to FIG. 4, which schematically illustrates a FMCW radar apparatus, in accordance with some demonstrative aspects.

In some demonstrative aspects, FMCW radar device 400 may include a radar frontend 401, and a radar processor 402. For example, radar frontend 304 (FIG. 3) may include one or more elements of, and/or may perform one or more operations and/or functionalities of, radar frontend 401; and/or radar processor 309 (FIG. 3) may include one or more elements of, and/or may perform one or more operations and/or functionalities of, radar processor 402.

In some demonstrative aspects, FMCW radar device 400 may be configured to communicate radio signals according to an FMCW radar technology, e.g., rather than sending a radio transmit signal with a constant frequency.

In some demonstrative aspects, radio frontend 401 may be configured to ramp up and reset the frequency of the transmit signal, e.g., periodically, for example, according to a saw tooth waveform 403. In other aspects, a triangle waveform, or any other suitable waveform may be used.

In some demonstrative aspects, for example, radar processor 402 may be configured to provide waveform 403 to frontend 401, for example, in digital form, e.g., as a sequence of digital values.

In some demonstrative aspects, radar frontend 401 may include a DAC 404 to convert waveform 403 into analog form, and to supply it to a voltage-controlled oscillator 405. For example, oscillator 405 may be configured to generate an output signal, which may be frequency-modulated in accordance with the waveform 403.

In some demonstrative aspects, oscillator 405 may be configured to generate the output signal including a radio transmit signal, which may be fed to and sent out by one or more transmit antennas 406.

In some demonstrative aspects, the radio transmit signal generated by the oscillator 405 may have the form of a sequence of chirps 407, which may be the result of the modulation of a sinusoid with the saw tooth waveform 403.

In one example, a chirp 407 may correspond to the sinusoid of the oscillator signal frequency-modulated by a "tooth" of the saw tooth waveform 403, e.g., from the minimum frequency to the maximum frequency.

In some demonstrative aspects, FMCW radar device 400 may include one or more receive antennas 408 to receive a radio receive signal. The radio receive signal may be based on the echo of the radio transmit signal, e.g., in addition to any noise, interference, or the like.

In some demonstrative aspects, radar frontend 401 may include a mixer 409 to mix the radio transmit signal with the radio receive signal into a mixed signal.

In some demonstrative aspects, radar frontend 401 may include a filter, e.g., a Low Pass Filter (LPF) 410, which may be configured to filter the mixed signal from the mixer 409 to provide a filtered signal. For example, radar frontend 401 may include an ADC 411 to convert the filtered signal into digital reception data values, which may be provided to radar processor 402. In another example, the filter 410 may be a digital filter, and the ADC 411 may be arranged between the mixer 409 and the filter 410.

In some demonstrative aspects, radar processor 402 may be configured to process the digital reception data values to provide radar information, for example, including range, speed (velocity/Doppler), and/or direction (AoA) information of one or more objects.

In some demonstrative aspects, radar processor 402 may be configured to perform a first Fast Fourier Transform (FFT) (also referred to as "range FFT") to extract a delay response, which may be used to extract range information, and/or a second FFT (also referred to as "Doppler FFT") to extract a Doppler shift response, which may be used to extract velocity information, from the digital reception data values.

In other aspects, any other additional or alternative methods may be utilized to extract range information. In one example, in a digital radar implementation, a correlation with the transmitted signal may be used, e.g., according to a matched filter implementation.

Figure 5:
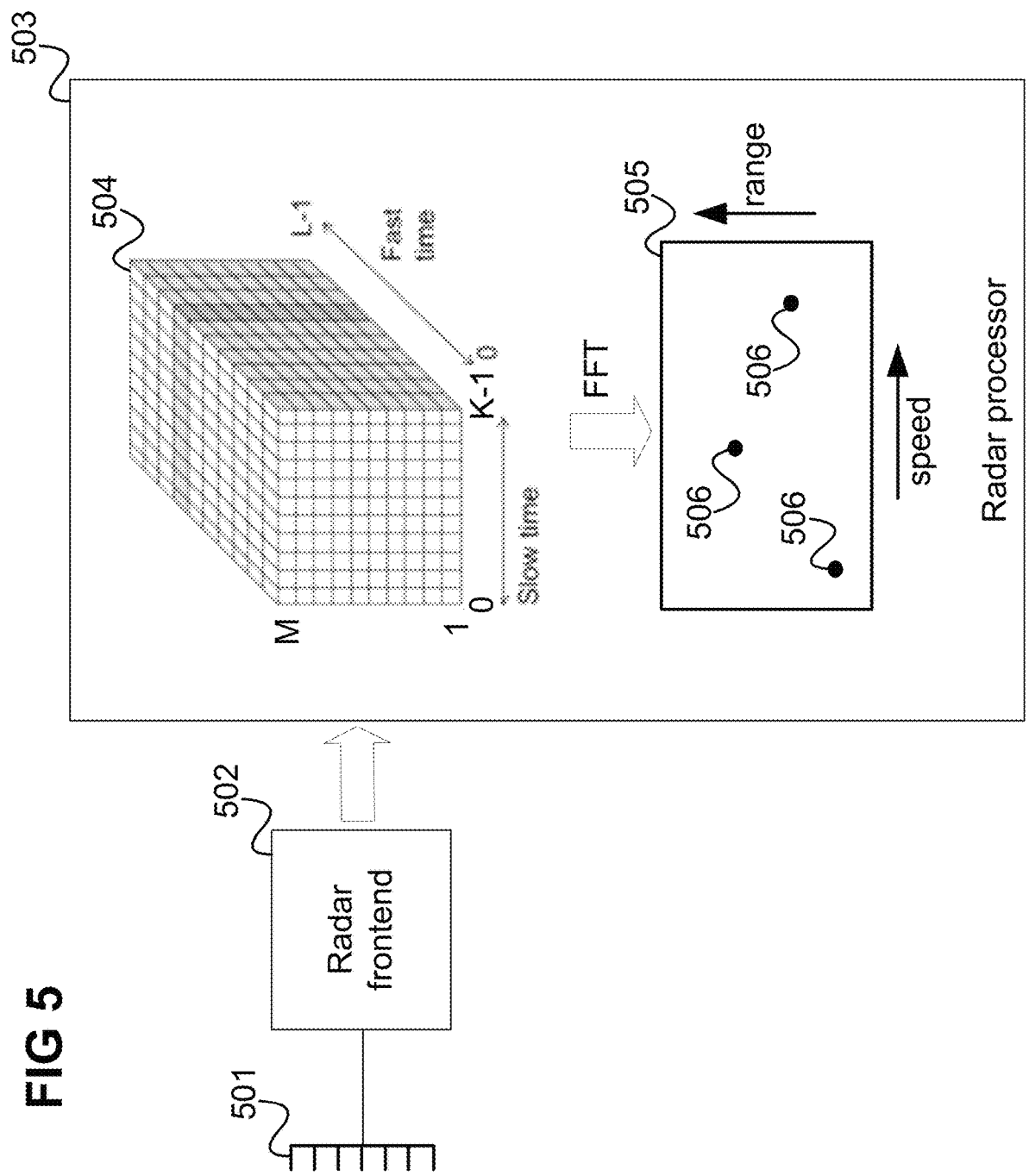
FIG. 5 is a schematic illustration of an extraction scheme, which may be implemented to extract range and speed (Doppler) estimations from digital reception radar data values, in accordance with some demonstrative aspects.

Reference is made to FIG. 5, which schematically illustrates an extraction scheme, which may be implemented to extract range and speed (Doppler) estimations from digital reception radar data values, in accordance with some demonstrative aspects. For example, radar processor 104 (FIG. 1), radar processor 210 (FIG. 2), radar processor 309 (FIG. 3), and/or radar processor 402 (FIG. 4), may be configured to extract range and/or speed (Doppler) estimations from digital reception radar data values according to one or more aspects of the extraction scheme of FIG. 5.

In some demonstrative aspects, as shown in FIG. 5, a radio receive signal, e.g., including echoes of a radio transmit signal, may be received by a receive antenna array 501. The radio receive signal may be processed by a radio radar frontend 502 to generate digital reception data values, e.g., as described above. The radio radar frontend 502 may provide the digital reception data values to a radar processor 503, which may process the digital reception data values to provide radar information, e.g., as described above.

In some demonstrative aspects, the digital reception data values may be represented in the form of a data cube 504. For example, the data cube 504 may include digitized samples of the radio receive signal, which is based on a radio signal transmitted from a transmit antenna and received by M receive antennas. In some demonstrative aspects, for example, with respect to a MIMO implementation, there may be multiple transmit antennas, and the number of samples may be multiplied accordingly.

In some demonstrative aspects, a layer of the data cube 504, for example, a horizontal layer of the data cube 504, may include samples of an antenna, e.g., a respective antenna of the M antennas.

In some demonstrative aspects, data cube 504 may include samples for K chirps. For example, as shown in FIG. 5, the samples of the chirps may be arranged in a so-called "slow time"-direction.

In some demonstrative aspects, the data cube 504 may include L samples, e.g., L=512 or any other number of samples, for a chirp, e.g., per each chirp. For example, as shown in FIG. 5, the samples per chirp may be arranged in a so-called "fast time"-direction of the data cube 504.

In some demonstrative aspects, radar processor 503 may be configured to process a plurality of samples, e.g., L samples collected for each chirp and for each antenna, by a first FFT. The first FFT may be performed, for example, for each chirp and each antenna, such that a result of the processing of the data cube 504 by the first FFT may again have three dimensions, and may have the size of the data cube 504 while including values for L range bins, e.g., instead of the values for the L sampling times.

In some demonstrative aspects, radar processor 503 may be configured to process the result of the processing of the data cube 504 by the first FFT, for example, by processing the result according to a second FFT along the chirps, e.g., for each antenna and for each range bin.

For example, the first FFT may be in the "fast time" direction, and the second FFT may be in the "slow time" direction.

In some demonstrative aspects, the result of the second FFT may provide, e.g., when aggregated over the antennas, a range/Doppler (R/D) map 505. The R/D map may have FFT peaks 506, for example, including peaks of FFT output values (in terms of absolute values) for certain range/speed combinations, e.g., for range/Doppler bins. For example, a range/Doppler bin may correspond to a range bin and a Doppler bin. For example, radar processor 503 may consider a peak as potentially corresponding to an object, e.g., of the range and speed corresponding to the peak's range bin and speed bin.

In some demonstrative aspects, the extraction scheme of FIG. 5 may be implemented for an FMCW radar, e.g., FMCW radar 400 (FIG. 4), as described above. In other aspects, the extraction scheme of FIG. 5 may be implemented for any other radar type. In one example, the radar processor 503 may be configured to determine a range/Doppler map 505 from digital reception data values of a PMCW radar, an OFDM radar, or any other radar technologies. For example, in adaptive or cognitive radar, the pulses in a frame, the waveform and/or modulation may be changed over time, e.g., according to the environment.

Referring back to FIG. 3, in some demonstrative aspects, receive antenna arrangement 303 may be implemented using a receive antenna array having a plurality of receive antennas (or receive antenna elements). For example, radar processor 309 may be configured to determine an angle of arrival of the received radio signal, e.g., echo 105 (FIG. 1) and/or echo 215 (FIG. 2). For example, radar processor 309 may be configured to determine a direction of a detected object, e.g., with respect to the device/system 301, for example, based on the angle of arrival of the received radio signal, e.g., as described below.

Figure 6:
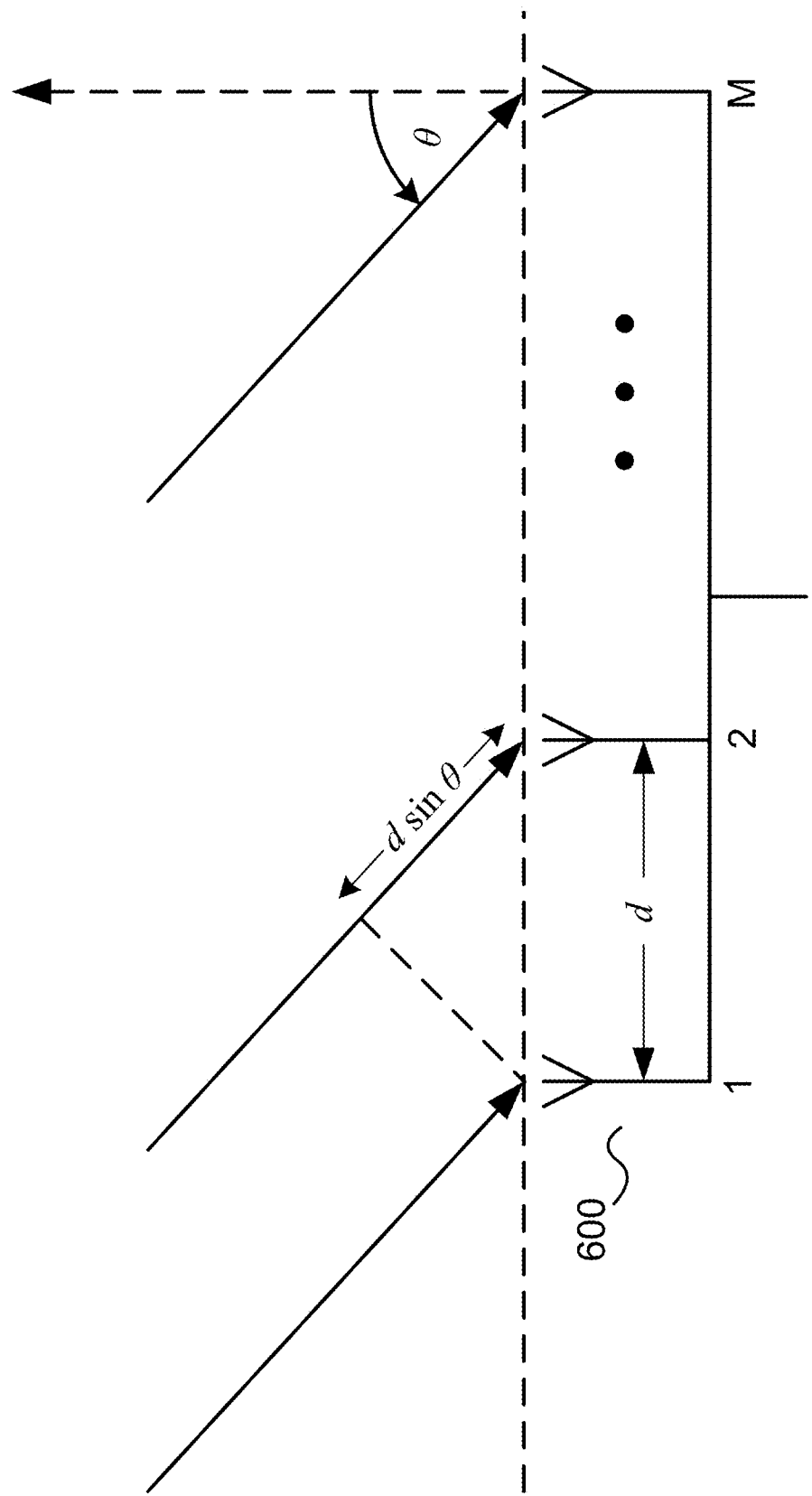
FIG. 6 is a schematic illustration of an angle-determination scheme, which may be implemented to determine Angle of Arrival (AoA) information based on an incoming radio signal received by a receive antenna array, in accordance with some demonstrative aspects.

Reference is made to FIG. 6, which schematically illustrates an angle-determination scheme, which may be implemented to determine Angle of Arrival (AoA) information based on an incoming radio signal received by a receive antenna array 600, in accordance with some demonstrative aspects.

FIG. 6 depicts an angle-determination scheme based on received signals at the receive antenna array. In some demonstrative aspects, for example, in a virtual MIMO array, the angle-determination may also be based on the signals transmitted by the array of Tx antennas.

FIG. 6 depicts a one-dimensional angle-determination scheme. Other multi-dimensional angle determination schemes, e.g., a two-dimensional scheme or a three-dimensional scheme, may be implemented.

In some demonstrative aspects, as shown in FIG. 6, the receive antenna array 600 may include M antennas (numbered, from left to right, 1 to M).

As shown by the arrows in FIG. 6, it is assumed that an echo is coming from an object located at the top left direction. Accordingly, the direction of the echo, e.g., the incoming radio signal, may be towards the bottom right. According to this example, the further to the left a receive antenna is located, the earlier it will receive a certain phase of the incoming radio signal.

For example, a phase difference, denoted $\Delta\varphi$, between two antennas of the receive antenna array 601 may be determined, e.g., as follows:

$$\Delta\varphi = \frac{2\pi}{\lambda} \cdot d \cdot \sin(\theta)$$

wherein $\lambda$ denotes a wavelength of the incoming radio signal, d denotes a distance between the two antennas, and $\theta$ denotes an angle of arrival of the incoming radio signal, e.g., with respect to a normal direction of the array.

In some demonstrative aspects, radar processor 309 (FIG. 3) may be configured to utilize this relationship between phase and angle of the incoming radio signal, for example, to determine the angle of arrival of echoes, for example by performing an FFT, e.g., a third FFT ("angular FFT") over the antennas.

In some demonstrative aspects, multiple transmit antennas, e.g., in the form of an antenna array having multiple transmit antennas, may be used, for example, to increase the spatial resolution, e.g., to provide high-resolution radar information. For example, a MIMO radar device may utilize a virtual MIMO radar antenna, which may be formed as a convolution of a plurality of transmit antennas convolved with a plurality of receive antennas.

Figure 7:
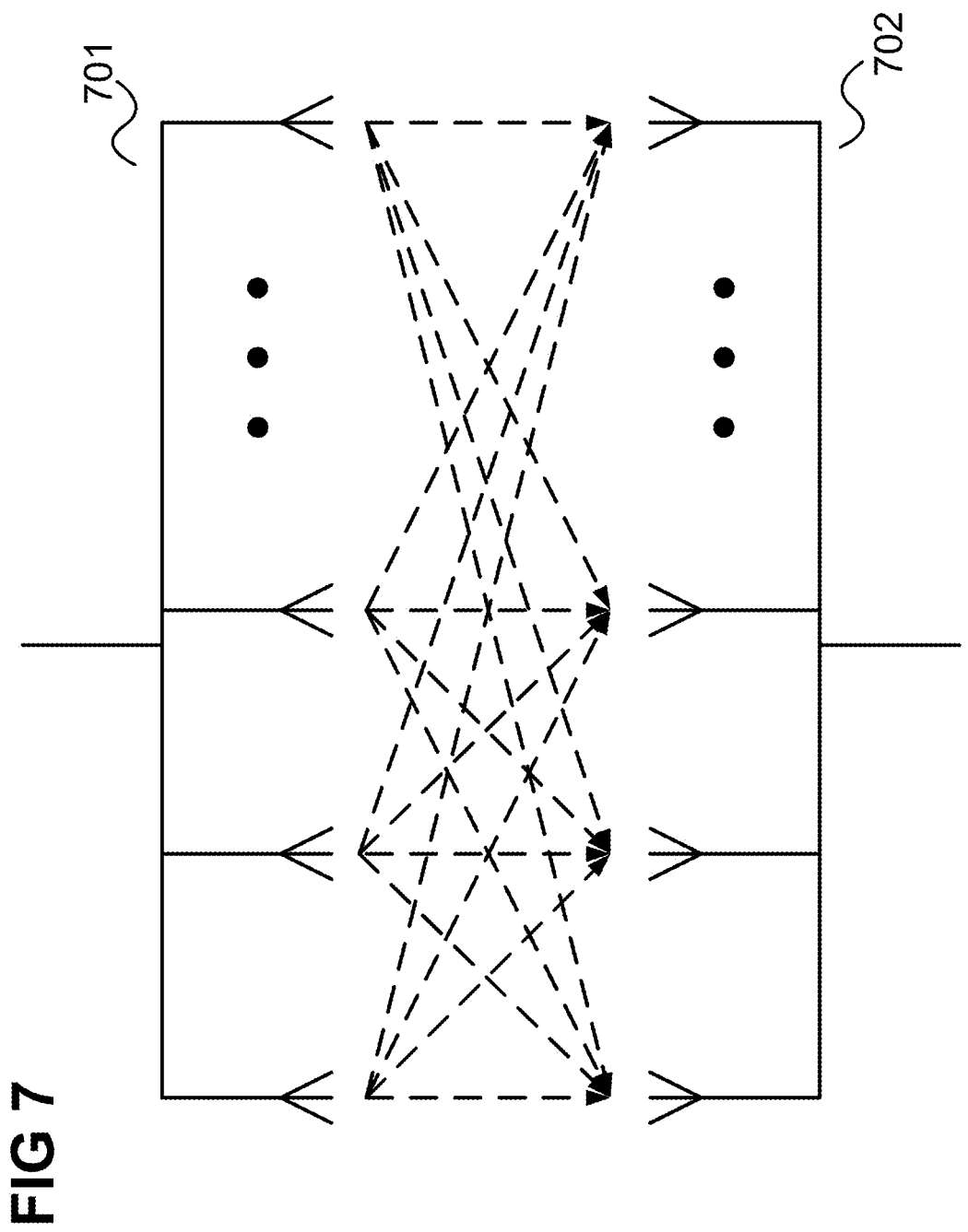
FIG. 7 is a schematic illustration of a Multiple-Input-Multiple-Output (MIMO) radar antenna scheme, which may be implemented based on a combination of Transmit (Tx) and Receive (Rx) antennas, in accordance with some demonstrative aspects.

Reference is made to FIG. 7, which schematically illustrates a MIMO radar antenna scheme, which may be implemented based on a combination of Transmit (Tx) and Receive (Rx) antennas, in accordance with some demonstrative aspects.

In some demonstrative aspects, as shown in FIG. 7, a radar MIMO arrangement may include a transmit antenna array 701 and a receive antenna array 702. For example, the one or more transmit antennas 302 (FIG. 3) may be implemented to include transmit antenna array 701, and/or the one or more receive antennas 303 (FIG. 3) may be implemented to include receive antenna array 702.

In some demonstrative aspects, antenna arrays including multiple antennas both for transmitting the radio transmit signals and for receiving echoes of the radio transmit signals, may be utilized to provide a plurality of virtual channels as illustrated by the dashed lines in FIG. 7. For example, a virtual channel may be formed as a convolution, for example, as a Kronecker product, between a transmit antenna and a receive antenna, e.g., representing a virtual steering vector of the MIMO radar.

In some demonstrative aspects, a transmit antenna, e.g., each transmit antenna, may be configured to send out an individual radio transmit signal, e.g., having a phase associated with the respective transmit antenna.

For example, an array of N transmit antennas and M receive antennas may be implemented to provide a virtual MIMO array of size N×M. For example, the virtual MIMO array may be formed according to the Kronecker product operation applied to the Tx and Rx steering vectors.

Figure 8:
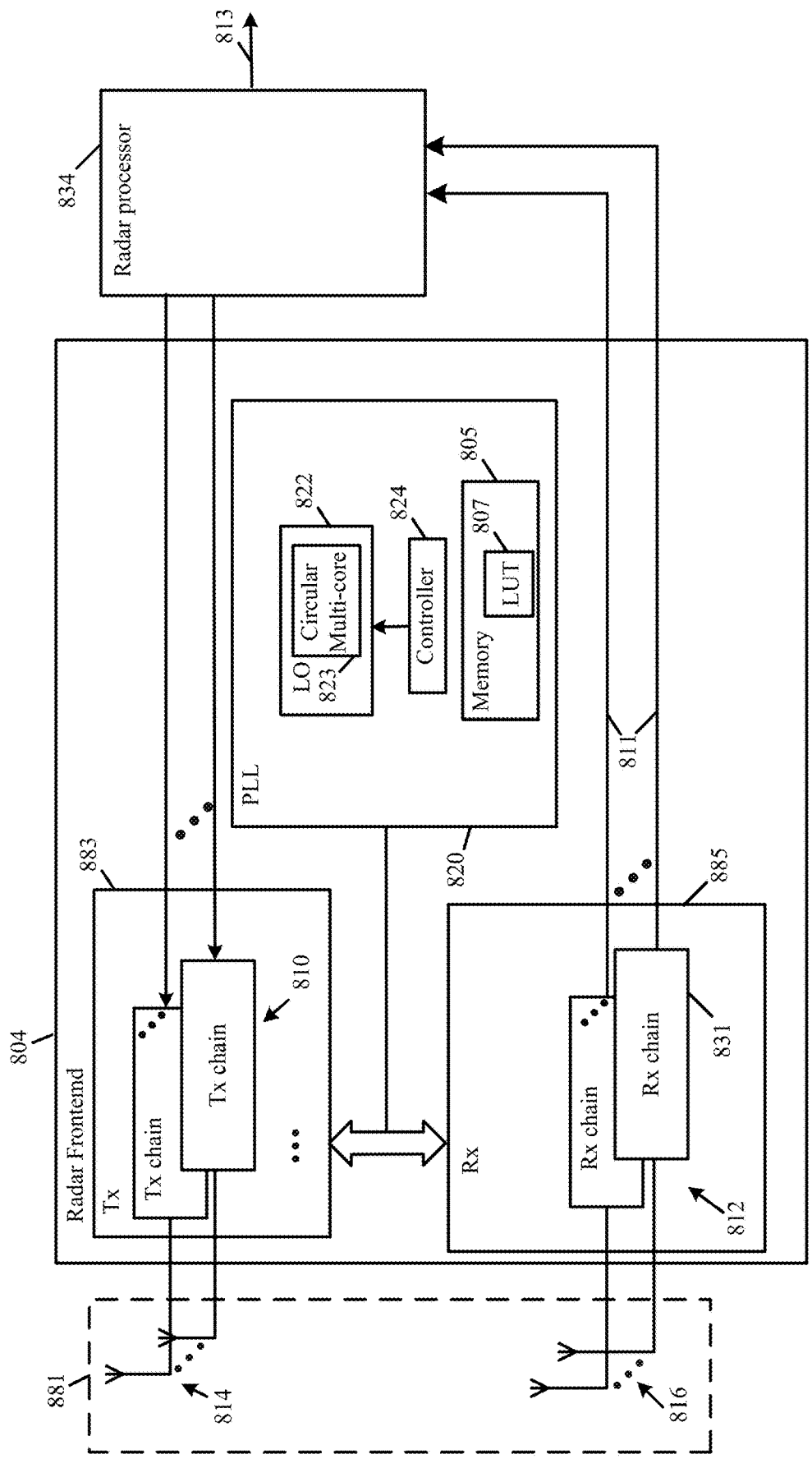
FIG. 8 is a schematic block diagram illustration of a radar frontend, in accordance with some demonstrative aspects.

FIG. 8 is a schematic block diagram illustration of a radar frontend 804, in accordance with some demonstrative aspects. For example, radar frontend 103 (FIG. 1), radar frontend 211 (FIG. 1), radar frontend 304 (FIG. 3), radar frontend 401 (FIG. 4), and/or radar frontend 502 (FIG. 5), may include one or more elements of radar frontend 804, and/or may perform one or more operations and/or functionalities of radar frontend 804.

In some demonstrative aspects, radar frontend 804 may be implemented as part of a MIMO radar utilizing a MIMO radar antenna 881 including a plurality of Tx antennas 814 configured to transmit a plurality of Tx RF signals (also referred to as "Tx radar signals"); and a plurality of Rx antennas 816 configured to receive a plurality of Rx RF signals (also referred to as "Rx radar signals"), for example, based on the Tx radar signals, e.g., as described below.

In some demonstrative aspects, MIMO antenna array 881, antennas 814, and/or antennas 816 may include or may be part of any type of antennas suitable for transmitting and/or receiving radar signals. For example, MIMO antenna array 881, antennas 814, and/or antennas 816, may be implemented as part of any suitable configuration, structure, and/or arrangement of one or more antenna elements, components, units, assemblies, and/or arrays. For example, MIMO antenna array 881, antennas 814, and/or antennas 816, may be implemented as part of a phased array antenna, a multiple element antenna, a set of switched beam antennas, and/or the like. In some aspects, MIMO antenna array 881, antennas 814, and/or antennas 816, may be implemented to support transmit and receive functionalities using separate transmit and receive antenna elements. In some aspects, MIMO antenna array 881, antennas 814, and/or antennas 816, may be implemented to support transmit and receive functionalities using common and/or integrated transmit/receive elements.

In some demonstrative aspects, MIMO radar antenna 881 may include a rectangular MIMO antenna array, and/or curved array, e.g., shaped to fit a vehicle design. In other aspects, any other form, shape and/or arrangement of MIMO radar antenna 881 may be implemented.

In some demonstrative aspects, radar frontend 804 may include one or more radios configured to generate and transmit the Tx RF signals via Tx antennas 814; and/or to process the Rx RF signals received via Rx antennas 816, e.g., as described below.

In some demonstrative aspects, radar frontend 804 may include at least one transmitter (Tx) 883 including circuitry and/or logic configured to generate and/or transmit the Tx radar signals via Tx antennas 814.

In some demonstrative aspects, radar frontend 804 may include at least one receiver (Rx) 885 including circuitry and/or logic to receive and/or process the Rx radar signals received via Rx antennas 816, for example, based on the Tx radar signals.

In some demonstrative aspects, transmitter 883, and/or receiver 885 may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative aspects, transmitter 883 may include a plurality of Tx chains 810 configured to generate and transmit the Tx RF signals via Tx antennas 814, e.g., respectively; and/or receiver 885 may include a plurality of Rx chains 812 configured to receive and process the Rx RF signals received via the Rx antennas 816, e.g., respectively.

In some demonstrative aspects, a radar processor 834 may be configured to generate radar information 813, for example, based on the radar signals communicated by MIMO radar antenna 881, e.g., as described below. For example, radar processor 104 (FIG. 1), radar processor 210 (FIG. 1), radar processor 309 (FIG. 3), radar processor 402 (FIG. 4), and/or radar processor 503 (FIG. 5), may include one or more elements of radar processor 834, and/or may perform one or more operations and/or functionalities of radar processor 834.

In some demonstrative aspects, radar processor 834 may be configured to generate radar information 813, for example, based on Radar Rx data 811 received from the plurality of Rx chains 812. For example, radar Rx data 811 may be based on the Rx RF signals received via the Rx antennas 816.

In some demonstrative aspects, radar processor 834 may be configured to generate the radar information 813 including one or more of range information, Doppler information, and/or AoA information, e.g., as described below.

In some demonstrative aspects, the radar information 813 may include Point Cloud 1 (PC1) information, for example, including raw point cloud estimations, e.g., Range, Radial Velocity, Azimuth and/or Elevation.

In some demonstrative aspects, the radar information 813 may include Point Cloud 2 (PC2) information, which may be generated, for example, based on the PC1 information. For example, the PC2 information may include clustering information, tracking information, e.g., tracking of probabilities and/or density functions, bounding box information, classification information, orientation information, and the like.

In some demonstrative aspects, radar processor 834 may be configured to generate the radar information 813 in the form of four Dimensional (4D) image information, e.g., a cube, which may represent 4D information corresponding to one or more detected targets.

In some demonstrative aspects, the 4D image information may include, for example, range values, e.g., based on the range information, velocity values, e.g., based on the Doppler information, azimuth values, e.g., based on azimuth AoA information, elevation values, e.g., based on elevation AoA information, and/or any other values.

In some demonstrative aspects, radar processor 834 may be configured to generate the radar information 813 in any other form, and/or including any other additional or alternative information.

In some demonstrative aspects, radar processor 834 may be configured to process the signals communicated via MIMO radar antenna 881 as signals of a virtual MIMO array formed by a convolution of the plurality of Rx antennas 816 and the plurality of Tx antennas 814.

In some demonstrative aspects, radar frontend 804 and/or radar processor 834 may be configured to utilize MIMO techniques, for example, to support a reduced physical array aperture, e.g., an array size, and/or utilizing a reduced number of antenna elements. For example, radar frontend 804 and/or radar processor 834 may be configured to transmit orthogonal signals via a Tx array including a plurality of N elements, e.g., Tx antennas 814, and processing received signals via an Rx array including a plurality of M elements, e.g., Rx antennas 816.

In some demonstrative aspects, utilizing the MIMO technique of transmission of the orthogonal signals from the Tx array with N elements and processing the received signals in the Rx array with M elements may be equivalent, e.g., under a far field approximation, to a radar utilizing transmission from one antenna and reception with N*M antennas. For example, radar frontend 804 and/or radar processor 834 may be configured to utilize MIMO antenna array 881 as a virtual array having an equivalent array size of N*M, which may define locations of virtual elements, for example, as a convolution of locations of physical elements, e.g., the antennas 814 and/or 816.

In some demonstrative aspects, radar frontend 804 may include a Phased Lock Loop (PLL) 820, e.g., as described below.

In some demonstrative aspects, PLL 820 may be configured to provide a frequency signal to one or more RF chains, for example, Tx chains 810 and/or Rx chains 812, e.g., as described below.

In some demonstrative aspects, PLL 820 may include a Digital PLL (DPLL), e.g., as described below.

In some demonstrative aspects, radar frontend 804 may include a Local Oscillator (LO) 822. In some demonstrative aspects, LO 822 may be implemented as part of PLL 820, e.g., as described below. In other aspects, LO 822 may be implemented as part of any other additional or alterative element of radar frontend 804.

In some demonstrative aspects, LO 822 may include a Digitally Controlled Oscillator (DCO), e.g., as described below.

In some demonstrative aspects, an Rx chain 831 of Rx chains 812 may include a multi-core Low Noise Amplifier (LNA), e.g., as described below.

Figure 9:
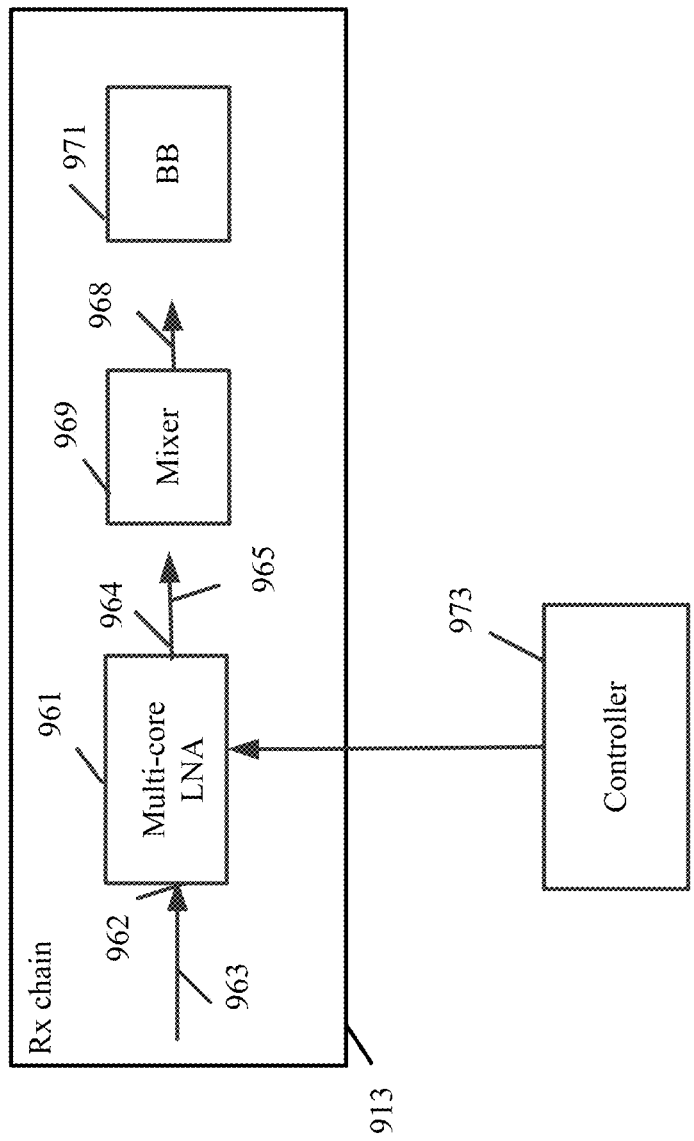
FIG. 9 is a schematic block diagram illustration of an Rx chain, in accordance with some demonstrative aspects.

Reference is made to FIG. 9, which schematically illustrates an Rx chain 913, in accordance with some demonstrative aspects. For example, Rx chain 831 (FIG. 8) may include one or more elements of Rx chain 913, and/or may perform one or more operations and/or functionalities of Rx chain 913.

In some demonstrative aspects, Rx chain 913 may include a multi-core LNA 961, which may be configured to provide an amplified RF signal 965 at an output node 964 based on an input RF signal 963 at an input node 962, e.g., as described below.

In some demonstrative aspects, the input RF signal 963 may include a radar signal. For example, input RF signal 963 may include, or may be based on, a radio signal, e.g., an Rx RF signal, received via an Rx antenna 816 (FIG. 8), which may be connected to the Rx chain 913.

In some demonstrative aspects, for example, each of Rx chains 812 (FIG. 8) may be configured according to the configuration of RX chain 913, e.g., including the multi-core LNA 961. In other aspects, only some of Rx chains 812 (FIG. 8) may include multi-core LNA 961, while one or more other Rx chains of Rx chains 812 (FIG. 8) may include any other LNA, e.g., a single-core LNA, and/or Rx chain scheme.

In some demonstrative aspects, multi-core LNA 961 may include a plurality of LNA cores connected in parallel between the input node 962 and the output node 964, e.g., as described below.

In some demonstrative aspects, the plurality of LNA cores may include a first LNA core including a first LNA core input connected to the input node 962, and a first LNA core output connected to the output node 964, e.g., as described below.

In some demonstrative aspects, the first LNA core may be biased by a first bias voltage, e.g., as described below.

In some demonstrative aspects, the plurality of LNA cores may include a second LNA core including a second LNA core input connected to the input node 962, and a second LNA core output connected to the output node 964, e.g., as described below.

In some demonstrative aspects, the second LNA core may be biased by a second bias voltage, which may be, for example, different from the first bias voltage, e.g., as described below.

In some demonstrative aspects, multi-core LNA 961 may include, or may be implemented by, a dual-core LNA including the first and second LAN cores, e.g., as described below.

In other aspects, multi-core LNA 961 may include any other m-core LNA including any other count of m>2 LNA cores, e.g., a 3-core LNA, a 4-core LNA, or the like.

In some demonstrative aspects, for example, in some use cases, implementations, and/or scenarios, there may be a technical need to address a technical issue of improving one or more performance parameters, for example, Rx chain linearity, of an Rx chain, e.g., Rx chain 913.

In some demonstrative aspects, there may be one or more technical problems, disadvantages, and/or inefficiencies in an implementation, which is based on increasing transistor size, for improving an Rx chain linearity.

For example, using much larger transistors may allow higher current into the load. However, increasing the transistor size in order to allow higher currents into the load may result in much higher current and power consumption. Such an implementation of larger transistors may also increase the Noise-Figure (NF) of an amplifier, thereby degrading the noise figure of the entire receiver. In addition, implementation of larger transistors may lead to reliability issues, e.g., due to higher stress on the transistor and metal traces.

In some demonstrative aspects, there may be one or more technical problems, disadvantages, and/or inefficiencies in an implementation, which is based on using adaptive gain to improve the Rx chain linearity by allowing to reduce the gain according to the interference power level.

For example, adjusting the gain according to the interference level may result in a major NF degradation for the desired signal, e.g., up to a level that the desired signal cannot be received or handled. A fine resolution gain control can assist with minimizing the gain variation of the LNA, but not the NF variation.

In some demonstrative aspects, there may be one or more technical problems, disadvantages, and/or inefficiencies in an implementation, which is based on linearization techniques of a single component, for example, directed to improve performance of only the LNA or the mixer. For example, such an implementation may provide little or no effect on the entire chain, since in most Rx chains the component that limits the linearity performance of the full chain is the last amplifier in the chain, e.g., not the first one.

Accordingly, such an implementation for improving the linearity of the LNA or mixer only has little effect on the full chain linearity.

In some demonstrative aspects, there may be one or more technical problems, disadvantages, and/or inefficiencies in an implementation, which is based on a topology that improves the linearity of an entire baseband chain. For example, full baseband linearity techniques may require high design effort of additional components, much higher current consumption, and/or chip area.

In some demonstrative aspects, for example, in some use cases, implementations, and/or scenarios, there may be a technical need to address a technical issue of improving one or more Intermodulation (IM) products of an Rx chain, e.g., Rx chain 913.

In one example, the IM of third order (IM3) may be one of the limiting factors of RF chain linearity. For example, the IM3 may define the dynamic range of a receiver. For example, the dynamic range of the receiver may be an important parameter, and in some cases, a crucial parameter, for example, for a wideband radar implementation, and/or for any other wireless system implementation.

In some demonstrative aspects, for example, in some use cases, implementations, and/or scenarios, there may be a technical need to address a technical issue of improving one or more Intercept Point (IP) performance parameters of an Rx chain, e.g., Rx chain 913.

For example, improving the Input IP (IIP) of third order (IIP3) and/or the Output IP (OIP) of third order (OIP3) performance of a wireless system, e.g., that exhibits many in band interferences, may directly improve the performance and/or sensitivity of the system.

In some demonstrative aspects, Rx chain 913 may be configured to provide one or more improved performance parameters, for example, in terms of IP performance, for example, an improved IIP of an n-th order (IIPn) and/or an improved OIP of an n-th order (OIPn), e.g., as described below.

Some demonstrative aspects are described herein with respect to configuring an IP of third order, e.g., an IIP3 and/or an OIP3, of an Rx chain, e.g., Rx chain 913.

Other aspects may be implemented with respect to configuring an IP of any other n-th order (IPn), e.g., IIPn and/or OIPn, for example, wherein n is equal to or greater than 1.

In some demonstrative aspects, an IP of an entire Rx chain, e.g., Rx chain 913, for example, the IIP3 and/or OIP3 of the entire Rx chain 913, may be improved, for example, by manipulating an amplifier topology, which may be generally used to improve IM3 performance of only the amplifier itself, e.g., as described below.

In some demonstrative aspects, an amplifier topology, which may generally be configured to allow reduction in the IM3 products of an LNA per se, may be implemented in order to increase and/or adjust the IM3 products of the LNA, e.g., as described below.

In some demonstrative aspects, for example, the IM3 products of the multi-core LNA 961 may be adjusted and/or increased, for example, such that these IM3 products may cancel-out the IM3 of the entire Rx chain 913, e.g., as described below.

In some demonstrative aspects, the IM products of the multi-core LNA 961 and/or the IM products of the entire Rx chain 913 may be calibrated, controlled and/or adjusted on the fly, for example, in real time, for example, during a receive mode of a radar front end including Rx chain 913, e.g., radar front end 804 (FIG. 8), for example, as part of a radar operation mode of the radar front end 804 (FIG. 8).

In some demonstrative aspects, the multi-core topology of multi-core LNA 961 may be utilized, for example, to provide a technical solution of minimizing process variations of the performance of multi-core LNA 961, e.g., as described below.

In some demonstrative aspects, Rx chain 913 may include one or more additional elements, for example, including a mixer 969 and Baseband (BB) circuitry 971, e.g., as described below.

In some demonstrative aspects, for example, mixer 969 may be configured to convert RF signals, e.g., RF signals including RF signal 965 and/or RF signals, which are based on RF signal 965, into BB signals 968.

In some demonstrative aspects, for example, BB circuitry 971 may be configured to process the BB signals 968, e.g., BB signals from the mixer 969 and/or from any other BB element.

In some demonstrative aspects, multi-core LNA 961 may be configured such that a total Output Intercept Point of an n-th order (OIPn) of Rx chain elements of Rx chain 913, for example, including the multi-core LNA 961, the mixer 969 and the BB circuitry 971, is greater than an OIPn of the Rx chain elements of Rx chain 913 excluding the multi-core LNA 961, e.g., as described below.

In other aspects, multi-core LNA 961 may be configured such that the total OIPn of the Rx chain elements including the multi-core LNA 961, the mixer 969 and the BB circuitry 971, is not greater than the OIPn of the Rx chain elements of Rx chain 913 excluding the multi-core LNA 961.

In some demonstrative aspects, multi-core LNA 961 may be configured such that a total OIPn of Rx chain elements of Rx chain 913, including the multi-core LNA 961, the mixer 969 and the BB circuitry 971, is greater than an OIPn of the multi-core LNA 961, e.g., as described below.

In other aspects, multi-core LNA 961 may be configured such that the total OIPn of the Rx chain elements including the multi-core LNA 961, the mixer 969 and the BB circuitry 971, is not greater than the OIPn of the multi-core LNA 961.

In other aspects, multi-core LNA 961 may be configured according to any other suitable criterion and/or parameter corresponding to the OIPn of one or more Rx chain elements of Rx chain 913.

In some demonstrative aspects, the first bias voltage of the first LNA core and/or the second bias voltage of the second LNA core of multi-core LNA 961 may be configured, for example, based on a BB signal, which is based on the amplified RF signal 965, e.g., as described below.

For example, the first bias voltage of the first LNA core and/or the second bias voltage of the second LNA core of multi-core LNA 961 may be configured based on BB signal 968 and/or any other BB signal, which may be based on BB signal 968, e.g., a BB signal at BB circuitry 971.

In some demonstrative aspects, the first bias voltage of the first LNA core and/or the second bias voltage of the second LNA core of multi-core LNA 961 may be configured, for example, based on one or more Inter-Modulation (IM) products of the BB circuitry 971 of the Rx chain 913, e.g., as described below.

In some demonstrative aspects, the first bias voltage of the first LNA core and/or the second bias voltage of the second LNA core of multi-core LNA 961 may be configured, for example, based on IM3 products of the BB circuitry 971 of the Rx chain 913, e.g., as described below.

In other aspects, any other additional or alternative IM products of BB circuitry 971, e.g., IM products of any other n-th order, may be utilized.

In some demonstrative aspects, the first bias voltage of the first LNA core and/or the second bias voltage of the second LNA core of multi-core LNA 961 may be adaptively, dynamically and/or controllably calibrated and/or adjusted, e.g., as described below. In other aspects, the first bias voltage of the first LNA core and/or the second bias voltage of the second LNA core of multi-core LNA 961 may be preconfigured and/or pre-calibrated, for example, during production, installation and/or maintenance.

In some demonstrative aspects, a controller 973 may be configured to adaptively calibrate at least one of the first bias voltage of the first LNA core and/or the second bias voltage of the second LNA core of multi-core LNA 961, e.g., as described below.

In some demonstrative aspects, controller 973 may be implemented as part BB circuitry 971. In other aspects, controller 973 may be implemented as a dedicated element of a radar frontend, e.g., radar frontend 804 (FIG. 8), by a radar processor, for example, by radar processor 834 (FIG. 8), or by any other element of a radar frontend, e.g., radar frontend 804 (FIG. 8).

In some demonstrative aspects, controller 973 may be configured to adaptively calibrate at least one of the first bias voltage of the first LNA core and/or the second bias voltage of the second LNA core of multi-core LNA 961, for example, based on a BB signal, which is based on the amplified RF signal 965, e.g., as described below.

In some demonstrative aspects, controller 973 may be configured to adaptively calibrate at least one of the first bias voltage of the first LNA core and/or the second bias voltage of the second LNA core of multi-core LNA 961, for example, based on a total OIPn, e.g., OIP3 or an OIP any other n-th order, of Rx chain elements of Rx chain 913, for example, including the multi-core LNA 961, mixer 969, and BB circuitry 971, e.g., as described below.

In some demonstrative aspects, controller 973 may be configured to adaptively calibrate at least one of the first bias voltage of the first LNA core and/or the second bias voltage of the second LNA core of multi-core LNA 961, for example, to maximize the OIPn, e.g., OIP3 or an OIP any other n-th order, of one or more Rx chain elements of Rx chain 913, e.g., as described below.

Figure 10:
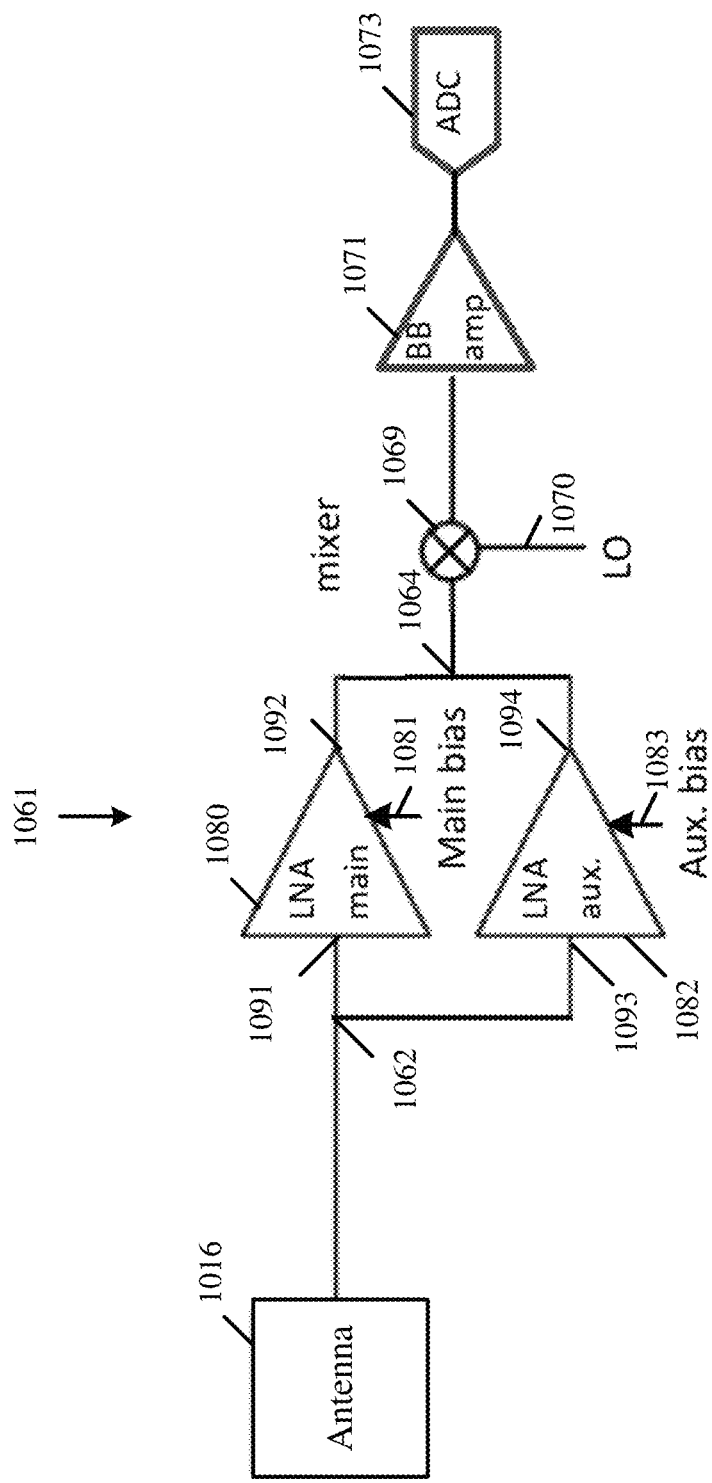
FIG. 10 is a schematic illustration of elements of an Rx chain including a dual-core Low Noise Amplifier (LNA), in accordance with some demonstrative aspects.

Reference is made to FIG. 10, which schematically illustrates elements of an Rx chain 1000 including a dual-core LNA 1061, in accordance with some demonstrative aspects.

In some demonstrative aspects, as shown in FIG. 10, the dual-core LNA 1061 may include a first LNA core 1080 (also referred to as "main LNA core") and a second LNA core 1082 (also referred to as "auxiliary LNA core") connected in parallel between an input node 1062 and an output node 1064, e.g., as described below. For example, input node 1062 may be directly connected to an antenna 1016. In another example, input node 1062 may be connected antenna 1016 indirectly, e.g., by a matching network and/or any other elements.

In some demonstrative aspects, as shown in FIG. 10, the first LNA core 1080 may include a first LNA core input 1091 connected to the input node 1062 and a first LNA core output 1092 connected to the output node 1064.

In some demonstrative aspects, as shown in FIG. 10, the first LNA core 1080 may be biased by a first bias voltage 1081.

In some demonstrative aspects, as shown in FIG. 10, the second LNA core 1082 may include a second LNA core input 1093 connected to the input node 1062 and a second LNA core output 1094 connected to the output node 1064.

In some demonstrative aspects, as shown in FIG. 10, the second LNA core 1082 may be biased by a second bias voltage 1083.

In some demonstrative aspects, the second bias voltage 1083 may be, for example, different from the first bias voltage 1081, e.g., as described below.

In some demonstrative aspects, the dual-core LNA 1061 may be implemented to provide an improved IP, e.g., an improved OIP3 and/or an improved IIP3, to an entire Rx chain 1000, e.g., as described below.

In other aspects, a multi-core LNA, e.g., multi-core LNA 961 (FIG. 9) may be implemented by any other m-core LNA including any other count m>2 of LNA cores, e.g., a 3-core LNA, a 4-core LNA, for example, to provide an improved IP of any other n-th order.

In some demonstrative aspects, the ability to provide each of the LNA cores of dual-core LNA 1061 with a separate, e.g., independent and/or different, bias voltage may be utilized controlling an IP and/or one or more IM product of the LNA cores 1080 and/or 1082, and/or the dual-core LNA 1061, e.g., as described below.

In some demonstrative aspects, an IM3 product of an amplifier may be determined and/or controlled, for example, based on the bias voltage of the amplifier, e.g., based on the following non-linearity model:

$$V_{out}(t) = a_1 V_{in} + a_2 V_{in}^2(t) + a_3 V_{in}^3(t) \qquad (1)$$

wherein $a_i$ denotes a coefficient depending on the bias voltage of each of the LNA's cores, wherein $v_{out}$ denotes an output voltage of the amplifier, and wherein $v_{in}(t)$ denotes the input voltage of the amplifier.

For example, an IM3 product of the first LNA core 1080, an IM3 product of the second LNA core 1082, and/or an IM3 product of the dual-core LNA 1061, may be determined and/or controlled, for example, based on the first bias voltage 1081 of the first LNA core 1080, and/or the second bias voltage 1083 of the second LNA core 1082, for example, based the non-linearity model of Equation 1.

In some demonstrative aspects, the IM3 product of an LNA core, e.g., LNA core 1080 and/or LNA core 1082, may depend on the coefficient $a_3$, which, in turn, may depend on the bias of the LNA core, e.g., as described below.

In some demonstrative aspects, for a common source amplifier, the output voltage $v_{out}$ may be approximated, e.g., as follows:

$$v_{out}(t) = g_m(V_{gs})v_{gs}(t)Z_{out} \approx$$

$$\approx g_m(V_{GS})Z_{out}v_{gs} + g_m'(V_{GS})Z_{out}v_{gs}^2 + \tfrac{1}{2}g_m''(V_{GS})$$
$$Z_{out}v_{gs}^3 \qquad (2)$$

wherein $g_m$ denotes the transconductance of a transistor of the amplifier, which may depend on the gate's bias of a gate of the transistor, denoted $V_{gs}$, and $Z_{out}$ denotes the output impedance that the transistor sees. The gate bias $V_{gs}$ may depend on $V_{GS}$, which denotes the Direct Current (DC) bias of the gate, and on $v_{gs}$, which denotes the Alternating Current (AC) input into the gate, for example, such that $V_{gs} = V_{GS} + v_{gs}$.

In some demonstrative aspects, it may be seen from the above equations 1 and 2 that the IM3 product may be proportional to $g_m''(V_{GS})$, for example, since the IM3 product is proportional to the coefficient $a_3$.

In some demonstrative aspects, the IP3, e.g., II'P3 and/or OIP3, may be optimized, for example, by minimizing $g_m''(V_{GS})$, e.g., as described below.

Figure 11:
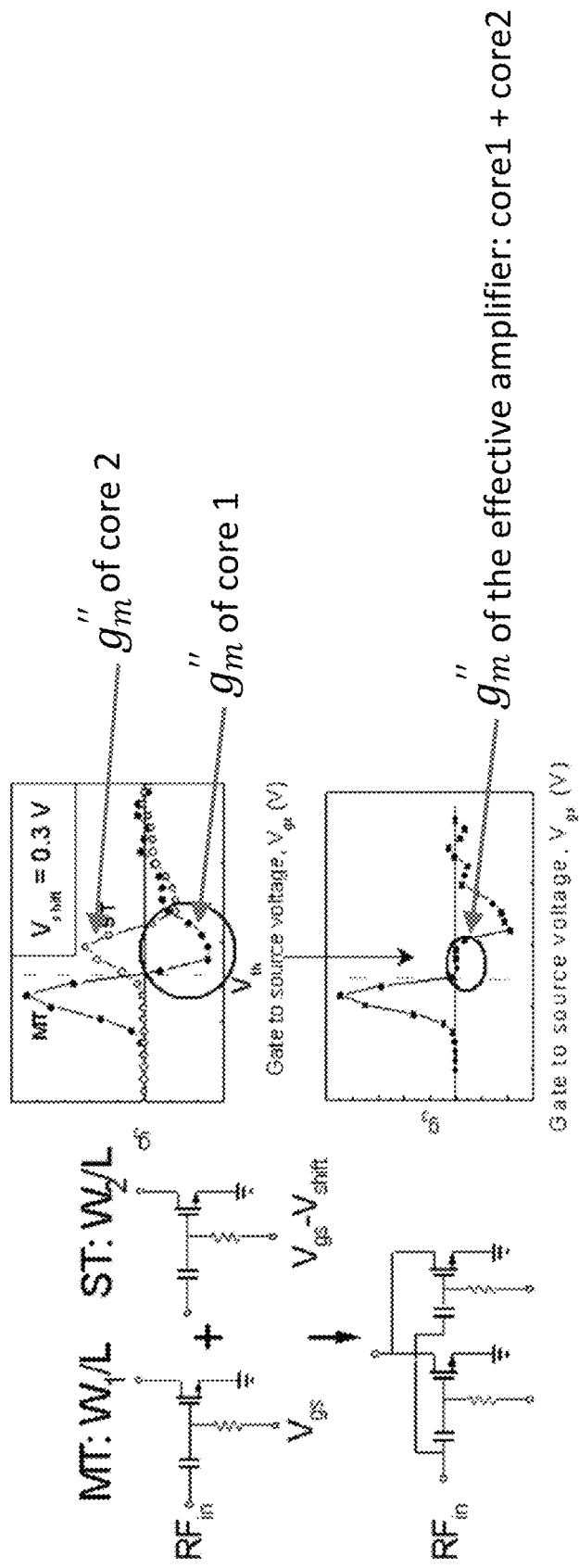
FIG. 11 is a schematic illustration of an effect of a dual-core LNA implementation on a transconductance parameter, in accordance with some demonstrative aspects.

FIG. 11 is a schematic illustration of an effect of a dual-core LNA implementation on a transconductance parameter, in accordance with some demonstrative aspects. For example, the dual-core LNA implementation of FIG. 11 may include, or may be based on, the dual-core LNA 1061 of FIG. 10.

In some demonstrative aspects, as shown in FIG. 11, a dual-core LNA implementation, e.g., dual-core LNA 1061 (FIG. 10), may be implemented to utilize two different cores connected in parallel. For example, two different cores, e.g., LNA core 1080 (FIG. 10) and LNA core 1082 (FIG. 10), may be connected in parallel, for example, to minimize the transconductance product $g'''_m$ of the dual-core LNA 1061 (FIG. 10). For example, the transconductance product $g'''_m$ of the dual-core LNA 1061 (FIG. 10) may be minimized, for example, by differently biasing each of the two cores of the LNA, e.g., using bias voltages 1081 (FIG. 10) and/or 1083 (FIG. 10), for example, in a manner which may lead to a different behavior of the transconductance product $g''_m$ per each core.

In some demonstrative aspects, as shown in FIG. 11, a dual-core LNA implementation, e.g., dual-core LNA 1061 (FIG. 10), may be configured to differently bias each of the two cores of the LNA, e.g., using bias voltages 1081 (FIG. 10) and/or 1083 (FIG. 10), for example, in order to improve one or more IM products and/or IP parameters of the LNA, e.g., the IIP3 and/or OIP3 of the LNA itself.

In some demonstrative aspects, as shown in FIG. 11, a dual-core LNA implementation, e.g., dual-core LNA 1061 (FIG. 10), may be configured to differently bias each of the two cores of the LNA, e.g., using bias voltages 1081 (FIG. 10) and/or 1083 (FIG. 10), for example, in order to improve one or more IM products and/or IP parameters of the Rx chain including the LNA, e.g., the IM3, IIP3 and/or OIP3 of the Rx chain 913 (FIG. 9), e.g., as described below.

Referring back to FIG. 10, in some demonstrative aspects, the bias 1081 of the main LNA core 1080 and/or the bias 1083 of the auxiliary LNA core 1082 of the dual-core LNA 1061 may be controlled, adapted and/or calibrated, for example, to improve one or more performance parameters, e.g., an OIP and/or IIP, of the dual-core LNA itself and/or of an Rx chain, e.g., Rx chain 1000, including the dual-core LNA 1061, e.g., as described below.

In some demonstrative aspects, for example, by properly adjusting the bias 1081 of the main LNA core 1080 and/or the bias 1083 of the auxiliary LNA core 1082 of the dual-core LNA 1061, a set of coefficients may be generated, for example, such that one or more IM3 products may be reduced and/or eliminated, e.g., as described below.

In some demonstrative aspects, for example, one or more products of the dual-core LNA 1061, e.g., the IM3 product of the auxiliary core 1082, may be configured, calibrated, controlled, and/or adjusted, for example, in order to reduce or even eliminate the effective overall IM3 product of the entire chain, e.g., Rx chain 1000, for example, assuming the auxiliary core 1082 was not present.

In some demonstrative aspects, an Analog Pre-distortion may be implemented, for example, by manipulating the dual core LNA topology, e.g., to reduce or even minimize the distortions that occur down the Rx chain 1000. This concept has been proven by several simulations, presenting a major improvement in the IIP3 of the Rx chain 1000.

In some demonstrative aspects, a multi-core LNA, e.g., the multi-core LNA 961 (FIG. 9) and/or the dual-core LNA 1061 (FIG. 10), may be implemented based on common-source amplifiers, e.g., as described above. In other aspects, the multi-core LNA may be implemented by any other additional or alternative amplifier topology and/or technology, for example, a CMOS process or any other process or technology. For example, these implementations may be based on utilizing amplifiers, where the amplifiers may generate their IM products, e.g., IM3 products, according to their bias.

In some demonstrative aspects, a multi-core LNA, e.g., the multi-core LNA 961 (FIG. 9) and/or the dual-core LNA 1061 (FIG. 10), may be implemented with respect to RF components, e.g., as described above. In other aspects, the multi-core LNA may be implemented in any other additional or alternative elements and/or chains, for example, analog, or BB only circuits, for example, in order to eliminate one or more IM products, e.g., IM3 products, of the entire circuit, e.g., in addition to or instead of the IM products at the implemented amplifier.

In some demonstrative aspects, the bias 1081 of the main LNA core 1080 and/or the bias 1083 of the auxiliary LNA core 1082 of the dual-core LNA 1061 may be adjusted, for example, such that one or more IM3 products of the dual-core LNA 1061 may be utilized to reduce or eliminate one or more IM3 products that are generated by one or more other components along the Rx chain 1000, e.g., by the mixer 1069, BB circuitry 1071, e.g., BB amplifier and/or any other BB circuitry, an Analog to Digital Converter (ADC) 1073, and the like.

In some demonstrative aspects, for example, the mixer 1069 may be configured to generate a BB signal for BB circuitry 1071, for example, by mixing an amplified RF signal at output 1064 with an LO signal 1070 from an LO, e.g., LO 822 (FIG. 8).

In some demonstrative aspects, this ability to reduce or eliminate one or more IM3 products of the Rx chain 1000 may be utilized to achieve a technical advantage in the form of an improvement, e.g., even a significant improvement, of an overall (total) IP, e.g., an overall IIP3 and/or an overall OIP3, of the Rx chain 1000, for example, even without a penalty in gain and/or NF.

In some demonstrative aspects, the presence of the auxiliary amplifier core 1082, while the auxiliary LNA core 1082 is biased at a relatively low current mode, e.g., in order to improve the overall IIP3 of the chain, may be utilized to provide a technical advantage of increasing the gain of the dual-core LNA 1061. For example, the gain of the LNA 1061 may be increased by slightly increasing the bias 1083 of the auxiliary amplifier core 1094. This may allow maintaining a constant NF, e.g., despite process variations, for example, while maintaining linearity performance.

In some demonstrative aspects, the multi-core LNA topology described herein, e.g., the dual-core LNA topology of dual-core 1061, may be utilized to provide a technical advantage by allowing improvement of the IP3 or any other IPn, in a manner, which may dramatically improve a dynamic range and/or other performance parameters, for example, even without sacrificing power, size, and/or other parameters.

In one example, a Linear FM based radar system, e.g., radar frontend 804 (FIG. 8), may be highly susceptible for IM3 products, for example, compared to some other wireless communication systems, for example, as the IM3 products may generate phantom targets when processing the radar signals at a radar processor, for example, radar processor 834 (FIG. 8), e.g., as described below.

In another example, the multi-core LNA topology described herein, e.g., the dual-core LNA topology of dual-core 1061, may be implemented to provide a technical advantage in terms of power saving, which may be significant, for example, for example, in an implementation, e.g., high-resolution radars having an array of transceivers (MIMO radar) or any other MIMO wireless communication implementation, which may include a large number of Rx chains, e.g., 50 or more Rx chains or any other number of chains. For example, the power saving advantage may result in a benefit in terms of a thermal solution.

In another example, the multi-core LNA topology may be implemented to provide a technical advantage in terms of increasing linearity of a receiver, e.g., of radar frontend 804 (FIG. 8), with as low power consumption as possible.

In some demonstrative aspects, one or more of the bias voltages of the multi-core LNA, e.g., at least one of the first bias voltage 1081 of the first LNA core 1080 and/or the second bias voltage 1083 of the second LNA core 1082, may be controlled, calibrated and/or adjusted, for example, by a controller, e.g., controller 973 (FIG. 9), e.g., as described below.

Figure 12:
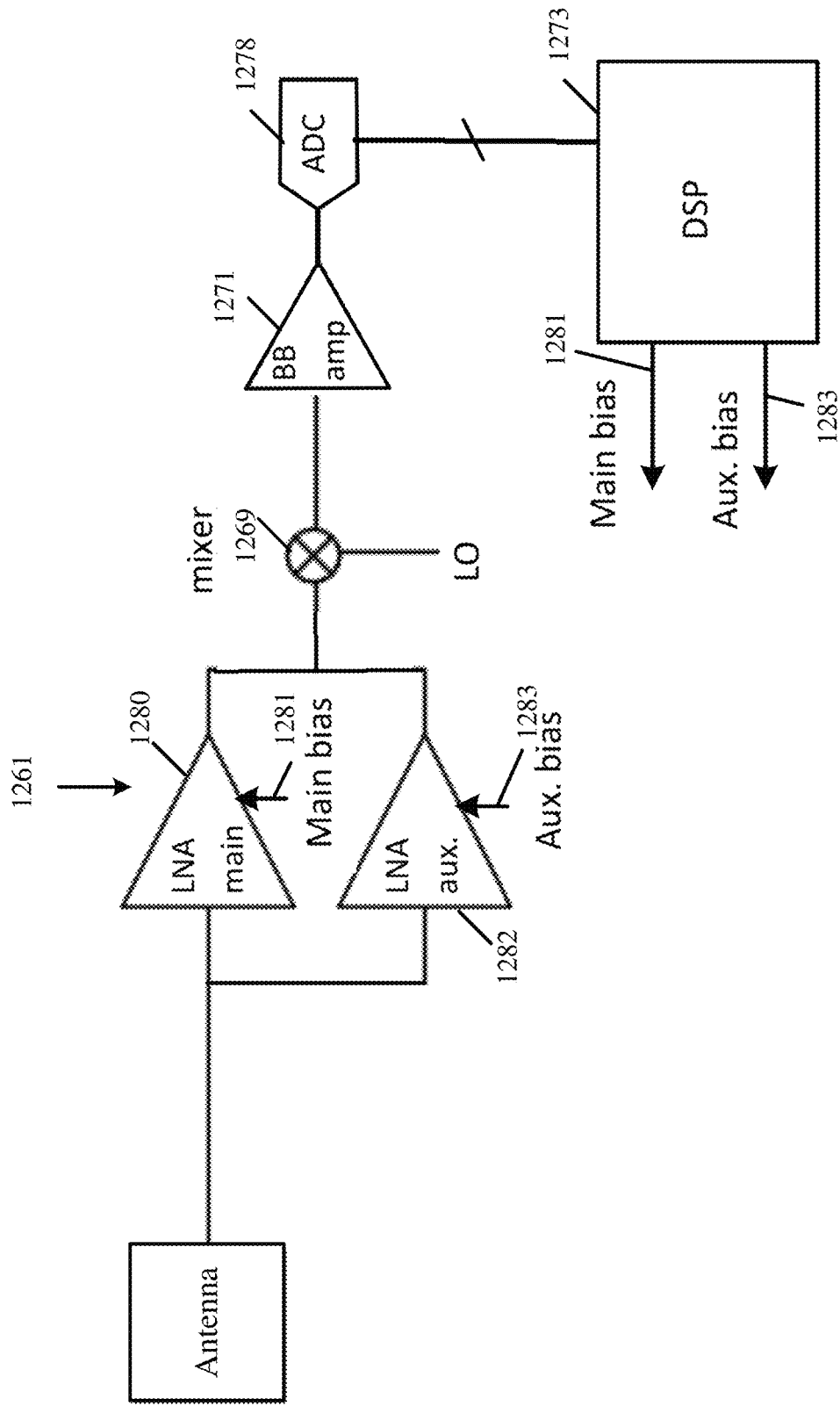
FIG. 12 is a schematic illustration of elements of an Rx chain including a dual-core LNA with adaptive calibration, in accordance with some demonstrative aspects.

FIG. 12 is a schematic illustration of elements of an Rx chain 1200 including a dual-core LNA 1261 with adaptive calibration, in accordance with some demonstrative aspects.

In some demonstrative aspects, as shown in FIG. 12, dual-core LNA 1261 may include a first LNA core 1280 connected in parallel with a second LNA core 1282.

In some demonstrative aspects, as shown in FIG. 12, first LNA core 1280 may be biased by a first bias voltage 1281, and second LNA core 1282 may be biased by a second bias voltage 1283.

In some demonstrative aspects, a controller 1273, e.g., a DSP, or any other controller or processor, may be configured to control one or more biases of the dual-core LNA 1261, e.g., as described below.

For example, controller 973 (FIG. 9) may be configured to perform one or more functionalities and/or operations of controller 1272.

In some demonstrative aspects, as shown in FIG. 12, Rx chain 1200 may include a mixer 1269 to generate a BB signal by mixing an amplified RF signal at an output of dual-core LNA 1261 with an LO signal.

In some demonstrative aspects, as shown in FIG. 12, Rx chain 1200 may include BB circuitry, e.g., including a BB amplifier 1271, to process the BB signal, and an ADC 1278 to convert an output of the BB circuitry to a digital domain.

In some demonstrative aspects, controller 1273 may be configured to analyze samples of ADC 1278, e.g., at the end of the chain 1200, for example, in order to control and/or adjust the biases of e the LNA cores 1280 and/or 1282.

In some demonstrative aspects, controller 1273 may be configured to adjust, e.g., optimize, the biases of the LNA cores 1280 and/or 1282, for example, in order to control adjust, and/or calibrate one or more IM products of the chain 1200.

In one example, controller 1273 may be configured to adjust, e.g., optimize, the biases of the LNA cores 1280 and/or 1282, for example, in order to reduce or minimize the IM3 product of the entire chain 1200.

In some demonstrative aspects, the bias voltages 1281 and/or 1283 of the multi-core LNA 1261 may be adjusted, for example, using one or more calibration signals, e.g., preconfigured and/or special calibration signals, e.g., two-tone signals.

In some demonstrative aspects, controller 1273 may be configured to adjust the biases 1281 and/or 1283 of the multi-core LNA 1261 according to an adaptive calibration scheme, for example, using the received signal, for example, at the output of ADC 1278, e.g., in real-time and/or on the fly, for example, during normal operation of the system.

In one example, controller 1273 may be configured to implement the adaptive calibration scheme, for example, at radar front end 804 (FIG. 8), for example, even when no targets are present in front of the radar frontend 804 (FIG. 8). For example, controller 1273 may use the leakage from transmitter/s to receiver/s of radar frontend 804 (FIG. 8), e.g., in a way, which may provide a unique solution for monostatic radar systems and/or multi-static radar configurations.

In some demonstrative aspects, controller 1273 may be configured to adjust the biases 1281 and/or 1283 of the multi-core LNA 1261, for example, using IM product observations, for example, IM3 product observations, of one or more elements of the chain 1200, for example, at a BB portion, e.g., at the end of the Rx chain 1200. For example, real and imaginary parts, denoted (f1, f2), of the IM3 products may be observed.

In some demonstrative aspects, for example, for a general system implementation, calibration signals, such as two-tone signals, may be injected into the Rx chain, e.g., Rx chain 1200. For example, FFT operation may be performed on ADC samples resulting from the calibration signals. For example, the FFT-bin of the IM3 product may be distinguished from the FFT-bins of the two tones. In this case, the (f1, f2) observations may include the real and imaginary parts of this phasor. In one example, the bias values for the multi-core LNA 1261 may be determined, for example, according to the bias values that minimize the energy of this FFT-bin.

In some demonstrative aspects, for example, for a radar system implementation, adaptive calibration may be performed based on phantom targets created by the IM3 of the receive chain 1200, which may be identified and isolated. For example, the (f1, f2) observations may include the real and imaginary parts of the phasor of the phantom target in the resulting 3D/4D point cloud. In one example, the bias values for the multi-core LNA 1261 may be determined, for example, according to the bias values that minimize the energy of this phantom target.

In other aspects, the bias values for the multi-core LNA 1261 may be determined, controlled, adjusted and/or calibrated based on any other additional process, signals, calculation and/or criterion.

In some demonstrative aspects, a minimization process to determine the bias values, e.g., the biases 1281 and/or 1283, to minimize the IM product may be based on a numerical optimization method. In one example, the numerical optimization method may include or may be based on Newton's numerical optimization method, which may be utilized to find the roots of a function.

In some demonstrative aspects, for example, for a multi-variant case, a solution may be searched for a set of nonlinear equations, for example, using the following iterations, e.g., once the derivative is replaced with inverse of Jacobian matrix:

$$\underline{x}_{n+1} = \underline{x}_n - J_F^{-1}(\underline{x}_n) \cdot F(\underline{x}_n) \tag{3}$$

In some demonstrative aspects, the first and second bias values, denoted x1, x2, e.g., the biases 1281 and/or 1283, may be determined, for example, to zero/minimize the IM3 product observation, for example, both its real and imaginary part, denoted f1, f2.

In one example, for the n-th iteration it may be required that:

$$\underline{x}_n = \begin{bmatrix} X_{1,n} \\ X_{2,n} \end{bmatrix}, F(\underline{x}_n) = \begin{bmatrix} f_{1,n} \\ f_{2,n} \end{bmatrix} \tag{4}$$

In some demonstrative aspects, the Jacobian matrix may be of size 2×2 and may be defined, for example, by:

$$J_F = \begin{bmatrix} \frac{\partial f_1}{\partial x_1} & \frac{\partial f_1}{\partial x_2} \\ \frac{\partial f_2}{\partial x_1} & \frac{\partial f_2}{\partial x_2} \end{bmatrix} \quad (5)$$

For example, in an iteration, e.g., at each iteration, one or more of the following operations may be performed.

For example, a 'finite differences' method may be utilized in order to estimate the Jacobian matrix, e.g., as follows:

$$\begin{aligned}\frac{\partial f_1}{\partial x_1} &\approx \frac{f_1(x_1+h, x_2) - f_1(x_1, x_2)}{h}, \\ \frac{\partial f_1}{\partial x_2} &\approx \frac{f_1(x_1, x_2+h) - f_1(x_1, x_2)}{h} \\ \frac{\partial f_2}{\partial x_1} &\approx \frac{f_2(x_1+h, x_2) - f_2(x_1, x_2)}{h}, \\ \frac{\partial f_2}{\partial x_2} &= \frac{f_2(x_1, x_2+h) - f_2(x_1, x_2)}{h}\end{aligned} \quad (6)$$

In one example, 3 different measurements, e.g., in which the bias values are changed, may be utilized as follows:

measurement #1—$x_1$, $x_2$ are reference values (e.g., can be chosen arbitrarily);

measurement #2—$x_1$ stays the same, $x_2$ value is increased by small value h;

and/or measurement #3—$x_2$ stays the same, $x_1$ value is increased by small value h.

In one example, a value of 'h' (step of $x_1$, $x_2$) may be defined for the Jacobian matrix estimation, e.g., based on the following considerations:

High values break the linear approximation used in the finite differences method;

Low values make it more susceptible to noise.

In other aspects, any other number and/or setting of measurements may be utilized.

For example, an iteration, e.g., the Newton iteration, may be performed, for example, after estimating the Jacobian matrix, e.g., as follows:

$$\underline{x}_{n+1} = \underline{x}_n - J_F^{-1}(\underline{x}_n) \cdot F(\underline{x}_n) \quad (7)$$

wherein $X_n$ denotes a vector that includes the $x_1$, $x_2$ reference values, e.g., from measurement #1.

In some demonstrative aspects, the energy of the IM3 product may become low enough, e.g., after a sufficient number of iterations, and the calibration process may be ended.

In other aspects, any other additional, or alternative operations, method, estimation, criterion, and/or process may be implemented to determine, adjust and/or calibrate the bias values.

Referring to FIG. 8, in some demonstrative aspects, an Rx chain 831 of Rx chains 812 may include, may be implemented by, and/or may be configured as, a direct-conversion Rx chain 831 utilizing an active mixer, e.g., as described below.

Figure 13:
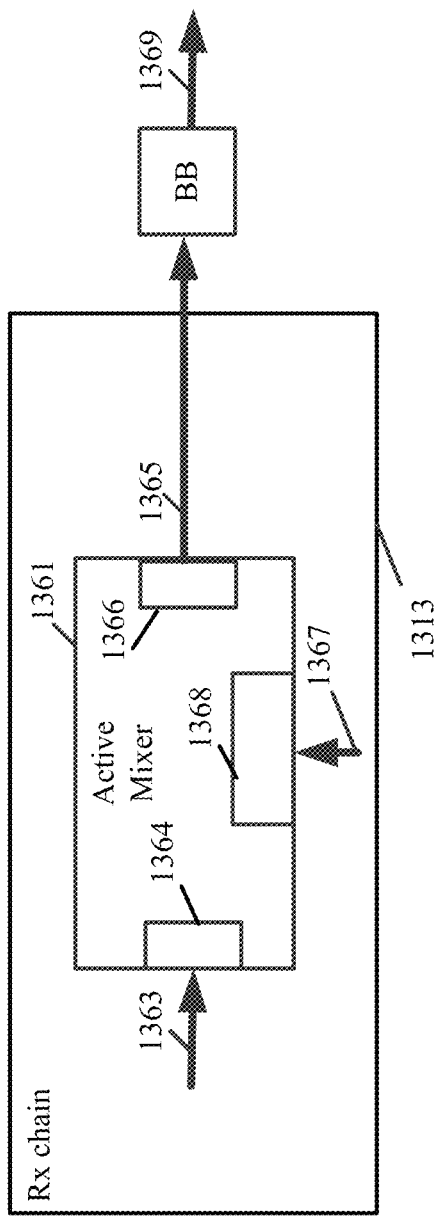
FIG. 13 is a schematic block diagram illustration of an Rx chain, in accordance with some demonstrative aspects.

Reference is made to FIG. 13, which schematically illustrates an Rx chain 1313, in accordance with some demonstrative aspects. For example, Rx chain 831 (FIG. 8) may include one or more elements of Rx chain 1313, and/or may perform one or more operations and/or functionalities of Rx chain 1313.

In some demonstrative aspects, Rx chain 1313 may include, may be implemented by, and/or may be configured as, a direct-conversion Rx chain 1313 utilizing an active mixer 1361, e.g., as described below.

In some demonstrative aspects, for example, each of Rx chains 812 (FIG. 8) may include or may be implemented as a direct-conversion Rx chain 1313. In other aspects, only some of Rx chains 812 (FIG. 8) may include or may be implemented as a direct-conversion Rx chain 1313, while one or more other Rx chains of Rx chains 812 (FIG. 8) may include or may be implemented as a dual-conversion Rx chain and/or any other type of Rx chain.

In some demonstrative aspects, direct-conversion Rx chain 1313 may be configured to down-convert an Rx RF signal 1363 into an Rx Baseband (BB) signal 1365, e.g., as described below.

In some demonstrative aspects, active mixer 1361 may be configured to down-convert the Rx RF signal 1363 into the Rx BB signal 1365 based on a Local Oscillator (LO) signal 1367, e.g., as described below. In one example, the LO signal 1367 may be provided by LO 822 (FIG. 8).

In some demonstrative aspects, the LO signal 1367 may have a frequency of at least 30 Gigahertz (GHz). For example, the LO signal 1367 may be configured for handling of RF signals for radar communication in a frequency band above 30 GHz.

In other aspects, the LO signal may have any other frequency. For example, the LO signal 1367 may be configured for handling of RF signals in any other frequency band.

In some demonstrative aspects, active mixer 1361 may include a first mixer input 1364 to receive the Rx RF signal 1363, a second mixer input 1368 to receive the LO signal 1367, and a mixer output 1366 to provide the Rx BB signal 1365, e.g., as described below.

In some demonstrative aspects, Rx chain 1313 may include one or more RF elements to provide the Rx RF signal 1363, for example, based on a signal received by an Rx antenna, for example, a signal received via an Rx antenna 816 (FIG. 8), which may be connected to the Rx chain 1313. For example, the RF elements of Rx chain 1313 may include one or more amplifiers, e.g., a Low noise Amplifier (LNA) and/or any other type of amplifier, one or more filters, and/or one or more other additional or alternative RF elements, e.g., as described below.

In some demonstrative aspects, Rx chain 1313 may include BB circuitry 1369 to process the Rx BB signal 1365. For example, the BB circuitry 1369 may include one or more BB amplifiers, BB filters, and/or one or more other BB elements, e.g., as described below.

In some demonstrative aspects, active mixer 1361 may include, or may be implemented by, a Gilbert-cell mixer, e.g., as described below.

In other aspects, active mixer 1361 may include, or may be implemented by, any other additional or alternative type of active mixer configuration, architecture, topology and/or circuitry.

In some demonstrative aspects, active mixer 1361 may be configured to implement a functionality of an active mixer (also referred to as a "semi-active" mixer) in the sense that, for example, in opposed to a passive mixer, elements in a core of the active mixer, e.g., Gilbert-cell transistors and/or other elements of the active mixer, may be biased to be normally-opened and to consume Direct Current (DC) current, e.g., from a DC supply, e.g., as described below.

In some demonstrative aspects, there may be one or more technical advantages to implement an active mixer, e.g., instead of a passive mixer configuration, for example, in one or more use cases, implementations and/or scenarios, e.g., as described below.

In some demonstrative aspects, an active (semi-active) mixer configuration may be implemented in an RF chain, e.g., instead of a passive mixer, to provide a technical advantage of noticeably improved gain, noise and/or linearity performances of the signal chain, for example, for radar applications and/or any other applications.

For example, the active mixer may be implemented to provide improved conversion loss, and/or better resilience for LO swing variations, and/or one or more additional or alternative benefits and/or advantages, e.g., compared to a passive mixer configuration.

For example, in some use cases, scenarios and/or implementations, there may be one or more technical disadvantages, inefficiencies and/or problems to implement a passive mixer in an Rx chain.

For example, the passive mixer may have a high conversion loss, e.g., at higher frequencies, for example, at frequencies above 30 GHz.

In contrast, an active mixer may be implemented in an Rx chain to provide a positive conversion gain and/or a high output impedance. Accordingly, an overall improved Noise Factor (NF) of the chain may be achieved with the active mixer.

In another example, the passive mixer may be more sensitive to LO level degradation, and/or the passive mixer may be less linear, e.g., at lower LO levels.

In some demonstrative aspects, direct-conversion Rx chain 1313 may be configured to implement active mixer 1361 in a configuration, which may provide a technical solution of providing a current supply, e.g., a DC current supply, for the active mixer 1361, e.g., as described below.

In some demonstrative aspects, active mixer 1361 may be biased to consume current from a DC supply, e.g., as described below.

In some demonstrative aspects, active mixer 1361 may be configured to provide the Rx BB signal 1365 biased with the current from the DC supply, e.g., as described below.

In some demonstrative aspects, active mixer 1361 may include a single-sideband mixer, e.g., as described below.

In some demonstrative aspects, active mixer 1361 may include a dual-sideband mixer, e.g., as described below.

In other aspects, active mixer 1361 may be implemented according to any other mixer type, configuration and/or architecture.

In some demonstrative aspects, active mixer 1361 may include a dual complementary mixer core including first and second complementary mixer cores, e.g., as described below.

In some demonstrative aspects, active mixer 1361 may include an N-type Metal-Oxide-Semiconductor (NMOS) mixer core, and a P-type Metal-Oxide-Semiconductor (PMOS) mixer core, e.g., as described below.

In some demonstrative aspects, the NMOS mixer core may include a first NMOS mixer input coupled to the first mixer input 1364 of active mixer 1361, a second NMOS mixer input coupled to the second mixer input 1368 of active mixer 1361, and/or an NMOS mixer output coupled to the mixer output 1366 of active mixer 1361, e.g., as described below.

In some demonstrative aspects, the PMOS mixer core may include a first PMOS mixer input coupled to the first mixer input 1364 of active mixer 1361, a second PMOS mixer input coupled to the second mixer input 1368 of active mixer 1361, and/or a PMOS mixer output coupled to the mixer output 1366 of active mixer 1361, e.g., as described below.

In some demonstrative aspects, direct-conversion Rx chain 1313 may include, e.g., as part of active mixer 1361, a first input transformer to transfer the Rx RF signal 1363 to the first NMOS input and the first PMOS input, e.g., as described below.

In some demonstrative aspects, direct-conversion Rx chain 1313 may include, e.g., as part of active mixer 1361, a second input transformer to transfer the LO signal 1367 to the second NMOS input and the second PMOS input, e.g., as described below.

In some demonstrative aspects, the NMOS mixer core may be biased with an NMOS bias, e.g., as described below.

In some demonstrative aspects, the PMOS mixer core may be biased with a PMOS bias, e.g., as described below.

In some demonstrative aspects, the NMOS bias may be different from the PMOS bias.

In some demonstrative aspects, the NMOS bias and/or the PMOS bias may be configured, for example, based on a predefined bias of the Rx BB signal 1365, e.g., as described below.

In some demonstrative aspects, the NMOS bias and/or the PMOS bias may be configured, for example, based on a predefined current flow from the DC supply via the active mixer 1361, e.g., as described below.

In some demonstrative aspects, the direct-conversion Rx chain 1313 including the active mixer 1361 may be implemented to provide one or more technical advantages and/or benefits, for example, to provide improved receiver gain, noise, and/or linearity performances, which, in turn, may provide better overall system sensitivity, range and/or interferers immunity e.g., for a radar system, for example, for radar frontend 804 (FIG. 8).

Figure 14:
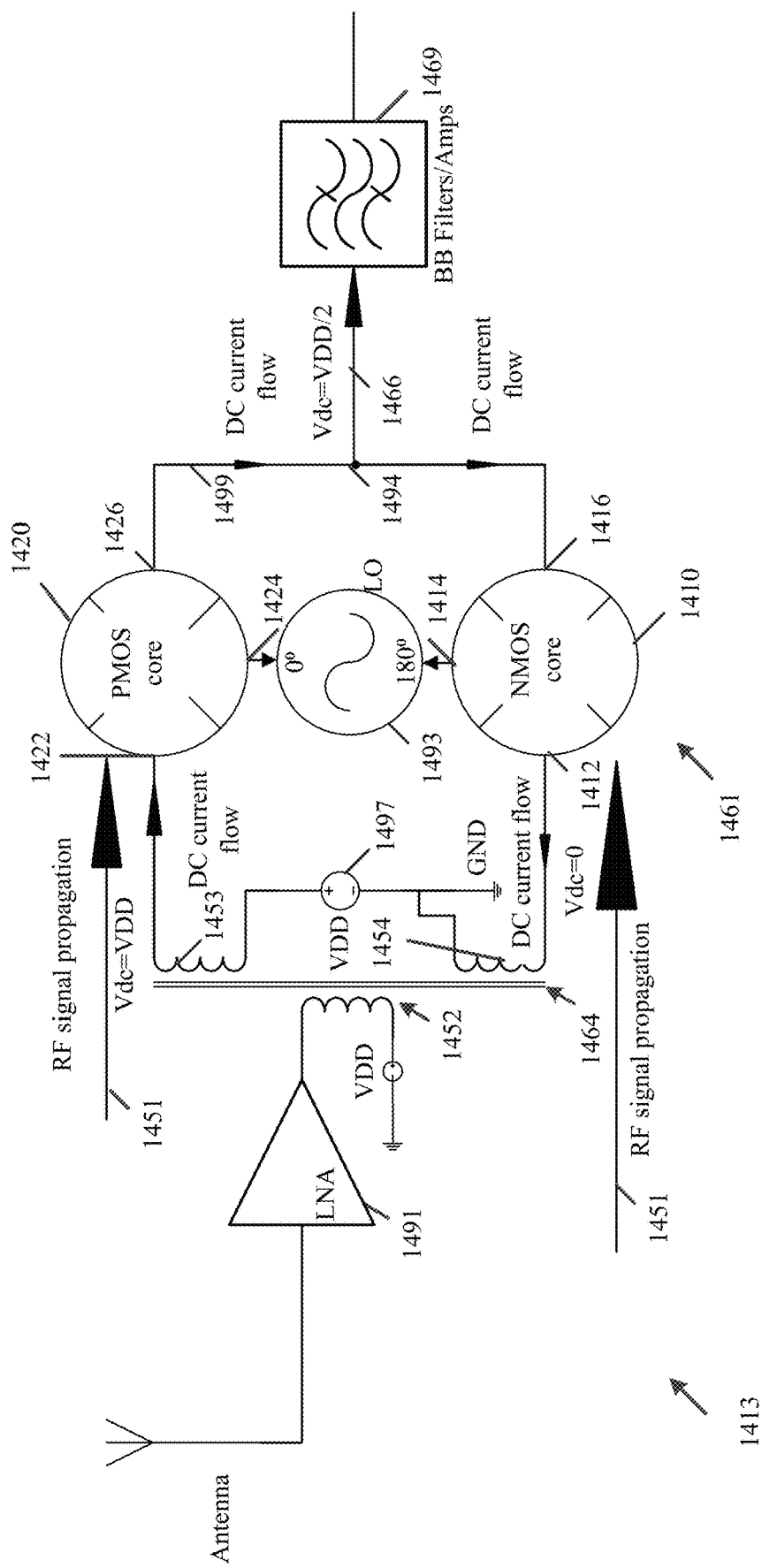
FIG. 14 is a schematic illustration of elements of a direct conversion Rx chain, in accordance with some demonstrative aspects.

Reference is made to FIG. 14, which schematically illustrates elements of a direct-conversion Rx chain 1413 including an active mixer 1461, in accordance with some demonstrative aspects. For example, Rx chain 1313 (FIG. 13) may include, operate, and/or perform one or more functionalities of the Rx chain 1413.

In some demonstrative aspects, the active (semi-active) mixer 1461 may include an active (semi-active) down-conversion mixer, which may include, or may be implemented by, a Complementary Metal-Oxide-Semiconductor (CMOS) mixer, e.g., as described below.

In some demonstrative aspects, the active mixer 1461 may include a mixer core, for example, a Gilbert-cell and/or any other mixer core configuration, which may be implemented by a dual complementary mixer core, for example, including a combination of an NMOS mixer core 1410 and a PMOS mixer core 1420, e.g., as described below.

In some demonstrative aspects, the dual complementary mixer core of active mixer 1461 may be configured to provide a technical advantage of exploiting different biasing, e.g., opposite biasing, of the NMOS mixer core 1410 and the PMOS mixer core 1420, e.g., as described below.

In some demonstrative aspects, the different biasing of the NMOS mixer core 1410 and PMOS mixer core 1420 may be employed, for example, using the same DC current, e.g., as described below.

In some demonstrative aspects, the different biasing of the NMOS mixer core 1410 and PMOS mixer core 1420 may be employed to keep an output DC level of an output 1466 of the active mixer 1461 similar to or equal to a DC level of BB circuitry 1469. For example, the output DC level of the output 1466 of the active mixer 1461 may be maintained around about a level of VDD/2, which may be required by BB circuits 1469.

In some demonstrative aspects, as shown in FIG. 14, the NMOS mixer core 1410 may include a first NMOS mixer input 1412 coupled to a first mixer input of the active mixer 1461, e.g., at a connection 1461 to an output of an LNA 1491 or any other RF element of the Rx chain 1413.

In some demonstrative aspects, as shown in FIG. 14, the NMOS mixer core 1410 may include a second NMOS mixer input 1414 coupled to a second mixer input of the active mixer 1461, for example, to receive the LO signal from an LO generator 1493.

In some demonstrative aspects, as shown in FIG. 14, the NMOS mixer core 1410 may include an NMOS mixer output 1416 coupled to the mixer output 1466 of the active mixer 1461, e.g., at a connection to BB circuitry 1469, which may include a BB filer, amplifier, or any other BB element 1469.

In some demonstrative aspects, as shown in FIG. 14, the PMOS mixer core 1420 may include a first PMOS mixer input 1422 coupled to the first mixer input 1464 of the active mixer, 1461 e.g., at the connection to the output of the LNA 1491 or any other RF element of the Rx chain 1413.

In some demonstrative aspects, as shown in FIG. 14, the PMOS mixer core 1420 may include a second PMOS mixer input 1424 coupled to the second mixer input of the active mixer 1461, for example, to receive the LO signal from the LO generator 1493.

In some demonstrative aspects, as shown in FIG. 14, the PMOS mixer core 1420 may include a PMOS mixer output 1426 coupled to the mixer output of the active mixer 1461, e.g., at the connection to the BB circuitry 1469.

In some demonstrative aspects, the NMOS mixer core 1410 may be biased with an NMOS bias.

In some demonstrative aspects, the PMOS mixer core 1420 may be biased with a PMOS bias.

In some demonstrative aspects, the NMOS bias may be different from the PMOS bias.

In some demonstrative aspects, as shown in FIG. 14, the dual-core architecture of the active mixer 1461 may be configured to support a DC current flow 1499 via the active mixer 1461.

In some demonstrative aspects, as shown in FIG. 14, the DC current flow 1499 may flow in a flow path from a supply VDD 1497 via the PMOS mixer core 1420 and of the NMOS mixer core 1410.

For example, as shown in FIG. 14, the DC current flow 1499 may flow from the supply VDD 1497 into the input 1422 of the PMOS mixer core 1420, via the PMOS mixer core 1420 to the output 1426 of the PMOS mixer core 1420, via to a node 1494, e.g., connected to the output 1466 of the active mixer 1461, to the output 1416 of the NMOS mixer core 1410, via the NMOS mixer core 1410 to the input 1412 of the NMOS mixer core 1410, and back to supply VDD 1497.

In some demonstrative aspects, as shown in FIG. 14, a first input transformer 1452 may be implemented to transfer an Rx RF signal 1451 at the mixer input 1464 of the active mixer 1461 to the first NMOS input 1412 and the first PMOS input 1422.

For example, as shown in FIG. 14, the first input transformer 1452 may include a secondary winding forming dual outputs, for example, configured to provide separate supplies to the NMOS mixer core 1410 and the PMOS mixer core 1420. For example, input transformer 1452 may include a first output 1454 connected to the input 1412 of NMOS mixer core 1410, and a second output 1453 connected to the input 1422 of PMOS mixer core 1420.

In some demonstrative aspects, a second input transformer may be implemented to transfer the LO signal from the LO 1493 to the second NMOS input 1414 and the second PMOS input 1424.

For example, the second input transformer may include a secondary winding forming dual outputs, for example, configured to provide the two different biases, which may be utilized to control the mixer DC current.

Figure 15:
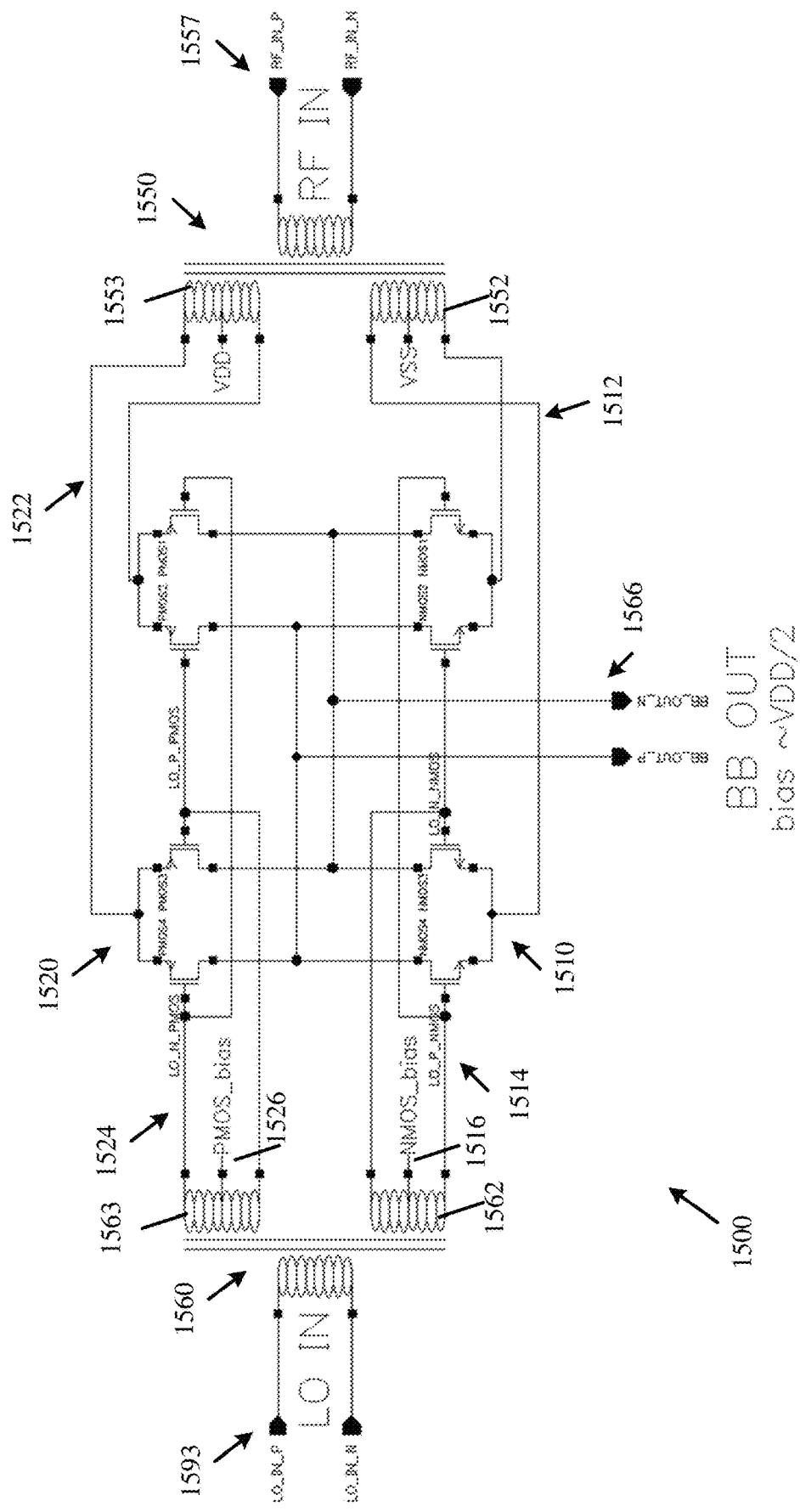
FIG. 15 is a schematic illustration of an active mixer core, in accordance with some demonstrative aspects.

FIG. 15 is a schematic illustration of an active mixer core 1500, in accordance with some demonstrative aspects. For example, active mixer core 1461 (FIG. 14) may include, operate, and/or perform one or more functionalities of the active mixer core 1500.

In some demonstrative aspects, the active mixer core 1500 may be implemented as a differential CMOS mixer core.

In some demonstrative aspects, as shown in FIG. 15, active mixer core 1500 may include a dual complementary mixer core, for example, including a combination of an NMOS mixer core 1510 and a PMOS mixer core 1520.

In some demonstrative aspects, as shown in FIG. 15, active mixer core 1500 may be coupled by a first input transformer 1550 to transfer an Rx RF signal, e.g., RF signal 1451 (FIG. 14), at a mixer input 1557 to the NMOS mixer core 1510 and to the PMOS mixer core 1520.

For example, as shown in FIG. 15, the first input transformer 1550 may include a secondary winding forming dual outputs, for example, configured to provide separate supplies to the NMOS mixer core 1510 and the PMOS mixer core 1520.

For example, as shown in FIG. 15, input transformer 1550 may include a first secondary winding 1552 forming a transformer output connected to an input 1512 of NMOS mixer core 1510, and a second secondary winding 1553 forming a transformer output connected to an input 1522 of PMOS mixer core 1520.

For example, as shown in FIG. 15, the first secondary winding 1552 may be connected to a ground voltage VSS, e.g., of the supply 1497 (FIG. 14); and/or the second secondary winding 1553 may be connected to a positive supply voltage VDD, e.g., of the supply 1497 (FIG. 14).

In some demonstrative aspects, as shown in FIG. 15, active mixer core 1500 may be coupled by a second input transformer 1560 to transfer an LO signal from an LO input 1593, e.g., the LO signal from LO 1493 (FIG. 14), to the NMOS mixer core 1510 and to the PMOS mixer core 1520.

In some demonstrative aspects, the second input transformer may 1560 include a secondary winding forming dual outputs. For example, as shown in FIG. 15, input transformer 1560 may include a first secondary winding 1562 forming a transformer output connected to an input 1514 of NMOS mixer core 1510, and a second secondary winding 1563 forming a transformer output connected to an input 1524 of PMOS mixer core 1520.

In some demonstrative aspects, first secondary winding 1562 may be configured to provide a first bias (NMOS bias) 1516 to NMOS mixer core 1510, and/or the second secondary winding 1563 may be configured to provide a second bias (PMOS bias) 1526 to NMOS mixer core 1520.

In some demonstrative aspects, the NMOS bias 1516 may be different from the PMOS bias 1526. For example, the NMOS bias 1516 and/or the PMOS bias 1526 may be configured to control a mixer DC current of active mixer core 1500, e.g., as described above.

In some demonstrative aspects, as shown in FIG. 15, the NMOS mixer core 1510 and the PMOS mixer core 1520 may be coupled a mixer output 1566 of the active mixer 1500, for example, at a connection to BB circuitry, e.g., BB circuitry 1469 (FIG. 14) as described above.

In some demonstrative aspects, the active mixer may be implemented according to a single-sideband mixer architecture, e.g., as described above.

In other aspects, the active mixer may be implemented according to a dual-sideband mixer architecture, for example, to handle I/Q signals, and/or according to any other mixer architecture.

Referring to FIG. 8, in some demonstrative aspects, an Rx chain 831 of Rx chains 812 may be configured according to an amplifier input detection scheme, which may be configured to allow detecting, monitoring, controlling, and/or restricting a level, e.g., a power and/or voltage level, of a RF signal input to an amplifier of the Rx chain 831, e.g., as described below.

Figure 16:
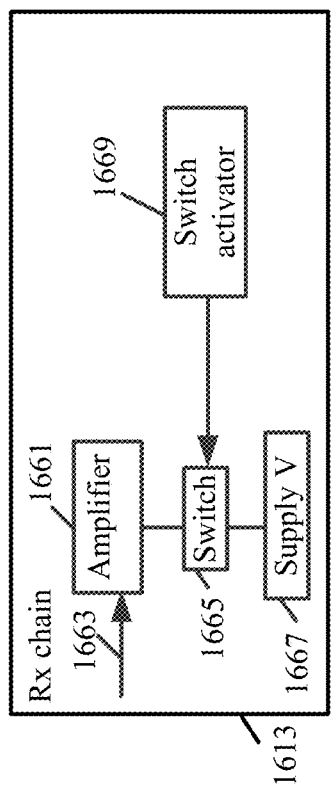
FIG. 16 is a schematic block diagram illustration of an Rx chain, in accordance with some demonstrative aspects.

Reference is made to FIG. 16, which schematically illustrates an Rx chain 1613, in accordance with some demonstrative aspects. For example, Rx chain 831 (FIG. 8) may include one or more elements of Rx chain 1613, and/or may perform one or more operations and/or functionalities of Rx chain 1613.

In some demonstrative aspects, Rx chain 1613 may include an amplifier 1661 configured to amplify an RF signal 1663. For example, the amplifier 1661 may include an amplifier core biased according to a DC bias voltage from a bias circuit, e.g., as described below.

In some demonstrative aspects, amplifier 1661 may include a Low Noise Amplifier (LNA), e.g., as described below. In other aspects, amplifier 1661 may include any other type of amplifier.

In some demonstrative aspects, the input RF signal 1663 may include a radar signal. For example, input RF signal 1663 may include, or may be based on, a radio signal, e.g., an RX RF signal, received via an Rx antenna 816 (FIG. 8), which may be connected to the Rx chain 1613.

In some demonstrative aspects, Rx chain 1613 may be configured according to an amplifier input detection scheme, which may be configured to allow detecting, monitoring, controlling, and/or restricting a level, e.g., a power and/or voltage level, of the RF signal 1663 input to the amplifier 1661, e.g., as described below.

In some demonstrative aspects, for example, each of Rx chains 812 (FIG. 8) may be configured according to the configuration of RX chain 1613, e.g., including the amplifier 1661 and the amplifier input detection scheme. In other aspects, only some of Rx chains 812 (FIG. 8) may include the amplifier input detection scheme, while one or more other Rx chains of Rx chains 812 (FIG. 8) may include any other amplifier and/or Rx chain scheme.

In some demonstrative aspects, Rx chain 1613 may be configured according to an amplifier input detection scheme, which may be configured to protect amplifier 1661 and/or one or more other elements of Rx chain 1613 from a high level of power of RF input signal 1663, e.g., as described below.

In some demonstrative aspects, the amplifier input detection scheme may be configured for one or more additional purposes and/or technical solutions with respect to Rx chain 1613, for example, to allow detecting and/or monitoring the level, e.g., a voltage and/or a power level, of the RF signal 1663 input to the amplifier 1661, e.g., in Rx chain 1613.

In some demonstrative aspects, the amplifier input detection scheme of Rx chain 1613 may similarly be implemented for one or more additional purposes and/or to provide technical solutions with respect to an amplifier in a Tx chain, e.g., a Tx chain of Tx chains 810 (FIG. 8), for example, to allow detecting and/or monitoring the level, e.g., a voltage and/or a power, of an RF signal input to the amplifier in a Tx chain 801 (FIG. 8).

In some demonstrative aspects, for example, in some use cases, implementations, and/or scenarios, there may be a need for a technical solution to protect circuitry of Rx chain 1613, for example, against high power and/or voltage levels of an input RF signal, e.g., as described below.

In some demonstrative aspects, for example, in some use cases, implementations, and/or scenarios, there may be a need for a technical solution to allow received front-end circuitry, e.g., of radar frontend 804 (FIG. 8), to withstand a high level of RF input power, for example, in order to protect sensitive electronic elements from unwanted and/or potentially damaging high power signals.

For example, radar receiver front-end circuitry, e.g., Rx circuitry of radar frontend 804 (FIG. 8), may need to withstand a high level of RF input power, for example, in order to protect sensitive electronics from unwanted and potentially damaging high-power signals.

In one example, for an autonomous radar application, a high Effective Isotropic Radiated Power (EIRP), which may be required to detect long-range targets, may cause the receiver to be highly saturated, for example, from a nearby radar system, and/or from its own radar transmitter, which may be directly leaked to the receiver, may be reflected from a radome, e.g., a bumper, and/or may be reflected from a very close target, e.g., an obstruction in a radar parking sensor, to a level which may damage, e.g., permanently damaged, one or more of the receiver electronic elements.

In some cases, additional components or circuits may be used for protecting a radar receiver. However, such a solution may result in a compromise of key receiver performance such as, for example, noise figure (NF) and/or receiver gain.

In some cases, for example, a radar receiver may be protected by an isolator, or equivalently, a circulator with one port terminated by a matched load, and/or a ferrite limiter from its own Tx leakage power. The isolator may control power flows to be unidirectional between Tx, antenna, and Rx ports, thereby preventing Tx output power only flows into the antenna but not to the Rx. However, the isolator can only protect the receiver from leaked power, but not from reflected power. In addition, the isolator solution may be utilized to protect the Rx from the Tx in a shared antenna implementation, e.g., for a single-antenna radar, or a monostatic radar. However, a more advanced MIMO radar or SAR (Synthetic Aperture Antenna) radar may not be able to effectively use the isolator solution, as there may be multiple paths from multiple Tx to multiple Rx. In addition, an isolator or a duplexer and a ferrite limiter may have a finite insertion loss, typically 2-3 dB, which directly degrades the receiver noise figure, receiver gain, and/or the transmitter EIRP, thereby effectively degrading the radar maximum range.

In some cases, a fast-switching single-pole n-throw (SPNT) switch may be implemented between the Tx/Rx. The fast-switching SPNT switch may be suitable for a pulse-based radar implementation. However, the fast-switching SPNT switch may not provide a valid solution for continuous-wave radar, for example, Frequency-Modulated Continuous Wave (FMCW) radar, e.g., as described above with reference to FIG. 4, or any other radar type, which allows for much smaller peak power for the same range compared to the pulse-based radar, and, accordingly may be preferred for some implementations, for example, autonomous radar applications. The SPNT switch has finite insertion loss, which directly degrades the receiver noise figure, receiver gain, and/or Tx EIRP, thereby affecting the overall radar detection range.

In some cases, receiver power at the digital baseband may be measured, and the receiver may be turned-off based on the detected power level. However, using power level detection with digital baseband (DSP) may have substantial latency, e.g., in the order of ~10 microseconds (uS). This long delay of the response may be detrimental to the receiver circuitry, for example, as non-recoverable damage is accumulated over time, which may reduce reliability and/or may shorten the lifetime of the receiver.

In some demonstrative aspects, Rx chain 1613 may be configured to implement an RF power-sensitive protection mechanism, which may be applied to protect the radar receiver amplifier 1661 and/or one or more other elements of Rx chain 1613, e.g., as described below.

In some demonstrative aspects, the RF power-sensitive protection mechanism may be configured to protect amplifier 1661, for example, with reduced or even minimal disruption to signal amplification, and/or even without adding any lossy components to the signal path, e.g., as described below.

In some demonstrative aspects, the RF power-sensitive protection mechanism may be configured to protect amplifier 1661, for example, by utilizing a protective circuit, e.g., as described below, which may not limit voltage swings on the amplifier, and, accordingly, the receiver performance may maintain the optimum performance, e.g., even without compromise.

In some demonstrative aspects, the RF power-sensitive protection mechanism may be configured to allow adjustment, calibration, and/or control of a sensitivity of the protection, for example, even with a few circuit parameters, e.g., as described below.

In some demonstrative aspects, the RF power-sensitive protection mechanism may be configured to provide a fast-response protection mechanism, e.g., with a response time of less than 10 ns or any other response time, e.g., as described below.

In some demonstrative aspects, the RF power-sensitive protection mechanism may be utilized for radar implementations, e.g., as described below.

In some demonstrative aspects, the RF power-sensitive protection mechanism may be utilized for a radar receiver, e.g., Rx chains 812 (FIG. 8) of radar frontend 804 (FIG. 8), which may be, for example, suitable for advanced autonomous radar systems, e.g., MIMO SAR radar using continuous waveform, and/or any other automotive radar sensor products.

In some demonstrative aspects, the RF power-sensitive protection mechanism may be utilized to provide a protection mechanism, e.g., even without substantial key RF performance degradation, thereby providing a comparative technical advantage to radar sensor products.

In some demonstrative aspects, the RF power-sensitive protection mechanism may be configured to provide a technical advantage of high-reliability, long-lifetime, high-performance, and/or high-sensitivity, e.g., for a radar solution, for example, even without requiring any substantial overhead in power consumption, thereby resulting in better user experience with radar sensors and/or wireless communication applications.

In some demonstrative aspects, the RF power-sensitive protection mechanism may be configured to provide a technical solution supporting a tolerable RF input power level with high reliability, for example, even without requiring complex calibration or configuration.

In some demonstrative aspects, Rx chain 1613 may include a switch 1665, which may be switchable between a closed mode and an open mode, e.g., as described below.

In some demonstrative aspects, the switch 1665 may connect the amplifier core of amplifier 1661 to a supply voltage 1667, e.g., at the closed mode; and/or the switch 1665 may disconnect the amplifier core of amplifier 1661 from the supply voltage 1667, for example, at the open mode, e.g., as described below.

In some demonstrative aspects, Rx chain 1613 may include a switch activator 1669 configured to cause the switch 1665 to switch from the closed mode to the open mode, for example, based on a DC current flow between the bias circuit and the amplifier core of amplifier 1661. For example, the DC current flow may be based on a power and/or voltage of the RF signal 1663, e.g., as described below.

In some demonstrative aspects, amplifier 1661 may include a first amplifier in the Rx chain 1613, e.g., an amplifier, which is first in order of a plurality of amplifiers in the Rx chain. For example, amplifier 1661 may include a first amplifier in the Rx chain 1613, which is to receive the RF signal from an Rx antenna, e.g., from an Rx antenna 816 (FIG. 8), connected to Rx chain 1613. For example, the RF power-sensitive protection mechanism may be utilized to protect the Rx chain 1613, for example, by selectively switching off the supply voltage to amplifier 1661, in order to protect elements in Rx chain 1613.

In other aspects, amplifier 1661 may include any other additional or alternative amplifier along Rx chain 1613. For example, the RF power-sensitive protection mechanism may be utilized to protect the Rx chain 1613, for example, by selectively switching off the supply voltage to one or more amplifiers 1661 along the Rx chain 1613.

In some demonstrative aspects, switch activator 1669 may be configured to cause the switch 1665 to switch from the closed mode to the open mode, for example, when the power and/or voltage of the RF signal 1663 is above an RF power/voltage threshold, e.g., as described below.

In some demonstrative aspects, switch activator 1669 may be configured to cause the switch 1665 to switch from the closed mode to the open mode, for example, when the voltage of the RF signal 1663 is above an RF voltage threshold, e.g., as described below. In other aspects, switch activator 1669 may be configured to cause the switch 1665 to switch from the closed mode to the open mode based on any other additional or alternative parameter relating to the RF signal 1663, for example, when the power of the RF signal 1663 is above an RF power threshold.

In some demonstrative aspects, switch activator 1669 may include a voltage detector to detect a voltage difference between the DC bias voltage and a DC amplifier core voltage of amplifier 1661, e.g., as described below.

In some demonstrative aspects, the DC amplifier core voltage of amplifier 1661 may be based on the power and/or voltage of the RF signal, e.g., as described below.

In some demonstrative aspects, the voltage detector, e.g., switch activator 1669, may be configured to cause the switch 1665 to switch from the closed mode to the open mode, e.g., based on the voltage difference, e.g., as described below.

In some demonstrative aspects, Rx chain 1613 may include a resistor in a path between the bias circuit and the amplifier core of amplifier 1661, and the voltage detector may be configured to detect the voltage difference based on a voltage drop across the resistor, e.g., as described below. In other aspects, any other additional or alternative element may be utilized to detect the voltage difference.

In some demonstrative aspects, the resistor may have a resistance of at least 0.5 kilo-Ohm, e.g., as described below. In other aspects, any other resistance may be used.

In some demonstrative aspects, Rx chain 1613 may include a first resistor and a second resistor in the path between the bias circuit to and the amplifier core of amplifier 1661, e.g., as described below.

In some demonstrative aspects, the first resistor may be connected between the bias circuit and the second resistor, and/or the second resistor may be connected between the first resistor and the amplifier core of amplifier 1661, e.g., as described below.

In some demonstrative aspects, the voltage detector, e.g., switch activator 1669, may be configured to detect the voltage difference based on a voltage drop across the first resistor, e.g., as described below.

In some demonstrative aspects, the first resistor may have a resistance of at least 0.5 kilo-Ohm, and the second resistor may have a resistance of at least 0.5 kilo-Ohm, e.g., at least 1 kilo-Ohm. In other aspects, the first resistor and/or the second resistor may be implemented with any other resistance.

In some demonstrative aspects, the voltage detector, e.g., as implemented by switch activator 1669, may be configured to cause the switch 1665 to switch from the closed mode to the open mode, for example, based on a comparison between the voltage difference and a DC voltage threshold, e.g., as described below.

In some demonstrative aspects, the voltage detector, e.g., as implemented by switch activator 1669, may be configured to cause the switch 1665 to switch from the closed mode to the open mode, for example, when the voltage difference is greater than the DC voltage threshold, e.g., as described below.

In some demonstrative aspects, the voltage difference between the DC bias voltage and the DC core voltage may be based, for example, on a positive half clipping of current at the amplifier core of amplifier 1661, e.g., as described below.

In some demonstrative aspects, the voltage detector, e.g., as implemented by switch activator 1669, may be configured to cause the switch 1665 to switch from the closed mode to the open mode, for example, when the voltage difference is less than the DC voltage threshold.

In some demonstrative aspects, the voltage difference between the DC bias voltage and the DC core voltage may be based, for example, on a negative half clipping of current at the amplifier core, e.g., as described below.

For example, the amplifier 1661 may include a class B amplifier, a class C amplifier, or a class AB amplifier. In other aspects the amplifier 1661 may include a class A amplifier or any other amplifier.

In some demonstrative aspects, the amplifier core may include one or more Electrostatic Discharge (ESD) diodes to protect transistors of the amplifier core of amplifier 1661, e.g., as described below.

In some demonstrative aspects, the DC current flow between the bias circuit and the amplifier core of amplifier 1661 may be based, for example, on a voltage clamping by the ESD diodes, e.g., as described below.

Figure 17:
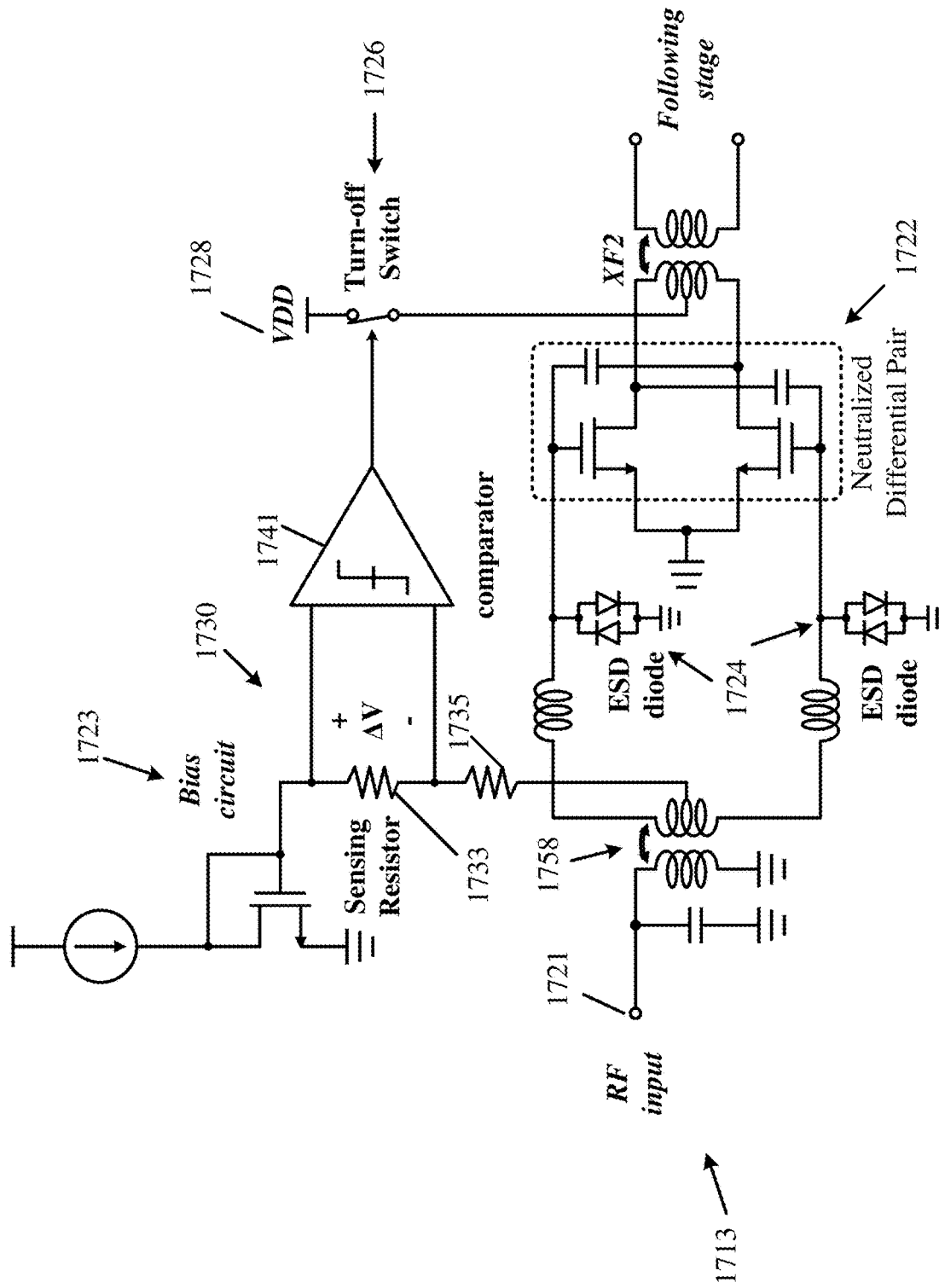
FIG. 17 is a schematic illustration of elements of an Rx chain, in accordance with some demonstrative aspects.

FIG. 17 is a schematic illustration of elements of an Rx chain 1713, in accordance with some demonstrative aspects. For example, Rx chain 1613 (FIG. 16) may include, operate, and/or perform one or more functionalities of the Rx chain 1713.

In some demonstrative aspects, as shown in FIG. 17, the Rx chain 1713 may include an LNA having an amplifier core 1722 with a non-zero bias voltage, which may be configured to amplify an RF signal from an RF input 1721.

In some demonstrative aspects, amplifier core 1722 may include a neutralized differential pair architecture, e.g., as shown in FIG. 17. In other aspects, amplifier core 1722 may be configured to include any other elements and/or architecture.

For example, as shown in FIG. 17, the LNA may include an amplifier core 1722 biased according to a DC bias voltage from a bias circuit 1723.

In some demonstrative aspects, as shown in FIG. 17, the amplifier core 1722 of the LNA may include one or more ESD diodes 1724 to protect transistors of the amplifier core.

In some demonstrative aspects, as shown in FIG. 17, the Rx chain 1713 may include a switch 1726, which may be switchable between a closed mode and an open mode. For example, at the closed mode, the switch 1726 is to connect the amplifier core 1722 to a supply voltage VDD 1728; and at the open mode, the switch 1726 is to disconnect the amplifier core 1722 from the supply voltage 1728.

In some demonstrative aspects, as shown in FIG. 17, the Rx chain 1713 may include a switch activator 1730 to selectively activate the switch.

In some demonstrative aspects, the switch activator 1730 may be configured to cause the switch 1726 to switch from the closed mode to the open mode based, for example, on a DC current flow between the bias circuit 1723 and the amplifier core 1722. For example, the DC current flow may be based on a power and/or voltage of the RF signal at RF input 1721, e.g., as described below.

In some demonstrative aspects, as shown in FIG. 17, the switch activator 1730 may be implemented to include a voltage detector 1741, e.g., including a voltage comparator, to detect a voltage difference between the DC bias voltage and a DC amplifier core voltage, which is based on the power/voltage of the RF signal. For example, the voltage detector 1741 may be configured to cause the switch 1726 to switch from the closed mode to the open mode based on the voltage difference.

In some demonstrative aspects, as shown in FIG. 17, the Rx chain 1713 may include a resistor 1733 in a path between the bias circuit 1723 and the amplifier core 1722. For example, resistor 1733 may be configured such that the voltage detector 1741 may detect the voltage difference based on a voltage drop across the resistor 1733. In one example, the resistor 1733 may have a resistance of at least 0.5 kilo-Ohm, or any other resistance.

In some demonstrative aspects, as shown in FIG. 17, the Rx chain 1713 may include at least a first resistor 1733 and a second resistor 1735 in the path between the bias circuit 1723 and the amplifier core 1722.

For example, as shown in FIG. 17, the first resistor 1733 may be connected between the bias circuit 1730 and the second resistor 1735, and the second resistor 1735 may be connected between the first resistor 1733 and the amplifier core 1722.

In other aspects, any other number and/or configuration of resistors may be implemented.

For example, the voltage detector 1741 may detect the voltage difference based on a voltage drop across the first resistor 1733.

In one example, the first resistor 1733 may have a resistance of at least 0.5 kilo-Ohm, and/or the second resistor may have a resistance of at least 0.5 kilo-Ohm, e.g., at least 1 kilo-Ohm. In other aspects, any other resistance values may be implemented.

Figure 18:
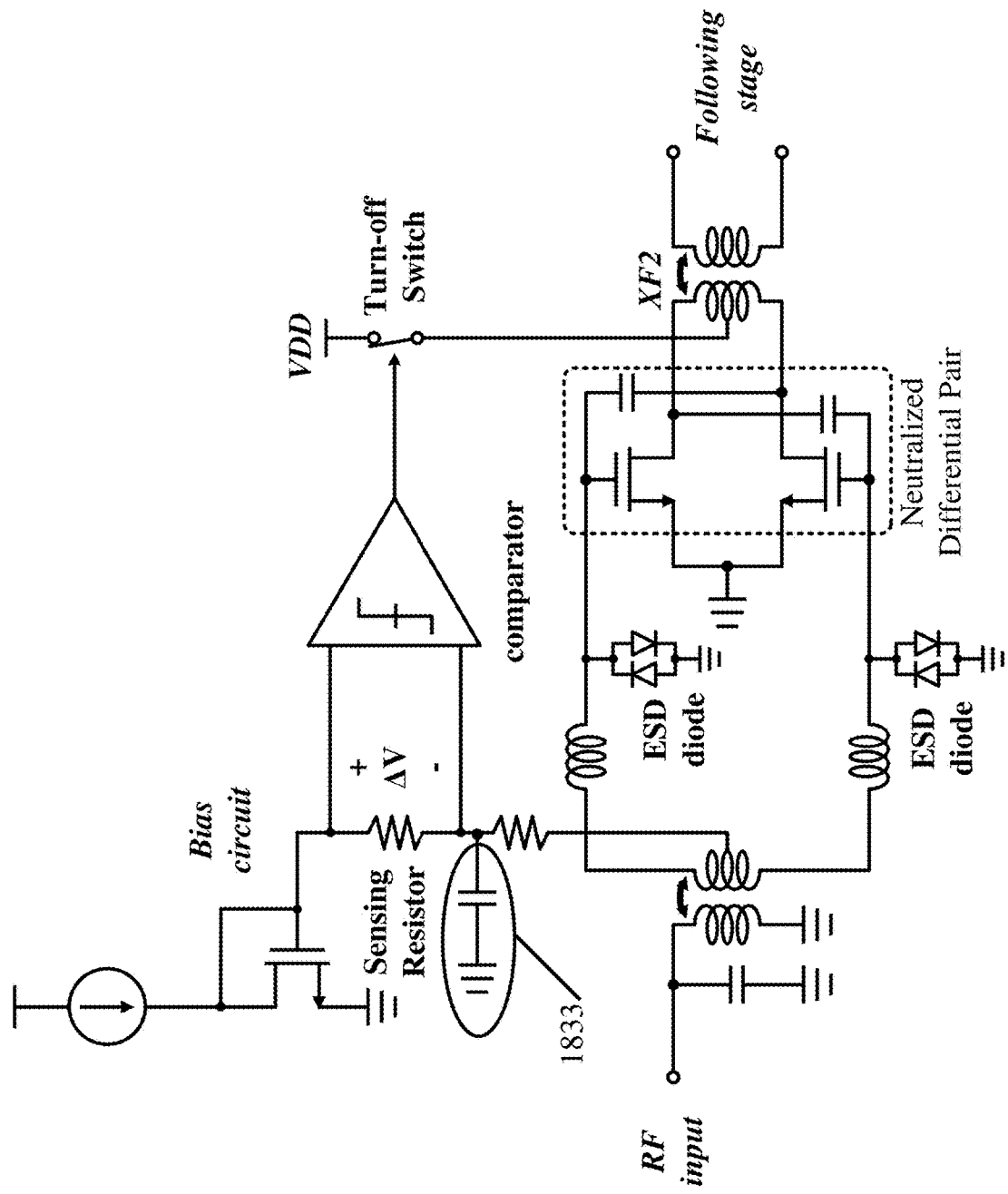
FIG. 18 is a schematic illustration of elements of an Rx chain, in accordance with some demonstrative aspects.

In some demonstrative aspects, the first resistor 1733 and the second resistor 1735 may be connected in a row, e.g., as shown in FIG. 17. In other aspects, the first resistor 1733 and/or the second resistor 1735 may be connected to one or more other elements, for example, a capacitor 1833, as shown in FIG. 18.

In some demonstrative aspects, as shown in FIG. 17, the voltage detector 1741 may be configured to sample a common-mode voltage of the gate nodes of LNA core 1722 at a center tap of a transformer coil, which may couple the LNA core 1722 to the input 1721. In other aspects, the common-mode voltage of the gate nodes of LNA core 1722 may be sampled with respect to one or more other elements, for example, large resistors, large inductors, e.g., RF chokes, transmission-line stubs, and the like.

In some demonstrative aspects, as shown in FIG. 17, EDS diodes 1724 may be connected to ground nodes of LNA core 1722. In other aspects, for example, in case the LNA has inductive degeneration at its source nodes, the ESD diodes 1724 may or may not connect to source nodes, e.g., instead of ground nodes.

In some demonstrative aspects, as shown in FIG. 17, the ESD diodes 1724 and the bias circuitry 1723 may be utilized to perform a functionality of a voltage/power detector, e.g., as described below.

In some demonstrative aspects, as shown in FIG. 17, the resistor 1733, comparator 1741, and the switch 1726, which may be driven by the comparator 1741, may be implemented as receiver protection circuitry, e.g., as described below.

In some demonstrative aspects, the voltage detector 1741 may be configured to cause the switch 1726 to switch from the closed mode to the open mode, for example, based on a comparison between the voltage difference detected by voltage detector 1741 and a DC voltage threshold.

In some demonstrative aspects, the voltage detector 1741 may be configured to cause the switch 1726 to switch from the closed mode to the open mode, for example, when the voltage difference is greater than the DC voltage threshold.

In one example, the voltage difference between the DC bias voltage and the DC core voltage may be based on a positive half clipping of current at the amplifier core 1722. In one example, this type of positive half clipping may happen when the amplifier includes a class A amplifier, or any other type of amplifier having positive half clipping.

In some demonstrative aspects, the voltage detector 1741 may be configured to cause the switch 1726 to switch from the closed mode to the open mode, for example, when the voltage difference is less than the DC voltage threshold.

In one example, the voltage difference between the DC bias voltage and the DC core voltage may be based on a negative half clipping of current at the amplifier core 1722. In one example, this type of negative half clipping may happen when the amplifier includes a class B amplifier, a class C amplifier, a class AB amplifier, or any other type of amplifier having negative half clipping.

In some demonstrative aspects, for example, in some design implementations, the most of non-linearity can be generated by the amplifier's transistors. In such a case, the average voltage of gate nodes over time may increase as the RF input power increases. This increase in the average voltage may result in a negative voltage difference ΔV. In these aspects, the voltage detector 1741 may be configured to detect this negative voltage difference.

In some demonstrative aspects, for example, during normal operation, when input swing is within an expected range, an instantaneous voltage at the gates of the input transistors of the amplifier core 1722 may be lower, e.g., may always be lower, than the diodes threshold voltage of the ESD diodes 1724. In this situation, an average DC value of the amplifier core 1722 may be set by the bias circuit 1723, and, accordingly, no current will flow through the "sensing" resistor 1733.

In some demonstrative aspects, for example, when a high-power RF signal is present at the LNA input 1721, a large voltage swing may be applied to the gates of the input devices of the amplifier core 1722, for example, at a level, which may be enough to turn on the ESD diodes 1724.

For example, the ESD diodes 1724, when turned-on, may clip the signal, e.g., symmetrically around the ground node, in a manner, which may lower the average DC voltage, e.g., below the value set by the bias circuit 1723, e.g., towards 0V. This voltage change may develop an PR drop across the sensing resistor 1733. For example, the comparator 1741 may be configured to trigger and turn off the LNA through the switch 1726, for example, when the voltage drop is larger than a predefined threshold.

In some demonstrative aspects, the transistors in the amplifier core 1722 may be a source of non-linearity. In these aspects, the average voltage of transistor gate nodes in the amplifier core 1722 may increase due to self-rectification of even-order non-linearity of the transistors. According to these aspects, the comparator 1741 may be designed to detect this voltage difference. For example, in this case, the polarity of the voltage difference may be opposite with respect to the clipping scenario. As a result, the comparator 1741 may trigger the protection circuit.

In some demonstrative aspects, the circuits of FIG. 17 may be implemented to provide a technical solution for protecting the amplifier against a high power/voltage level of the RF signal, for example, even without adding additional circuit components to the RF signal path.

In some demonstrative aspects, the circuits of FIG. 17 may be implemented to provide a technical solution for protecting the amplifier against a high power/voltage level of the RF signal, for example, by re-using the ESD diodes 1724 as non-linear detection elements, in a manner, which may provide a technical benefit of substantially no performance degradation due to the protection circuit.

In some demonstrative aspects, the power level at which the comparator 1741 triggers the switch 1726 may be calibrated, controlled, and/or adjusted, for example, by controlling the offset voltage of the comparator 1741, the value of the sensing resistor 1733, and/or the threshold voltage of the ESD diodes 1724.

In some demonstrative aspects, comparator 1714 may configured to have an offset-skew, for example, in order to have a reliable detection of a threshold level of the RF input power. In one example, an offset calibration scheme may be utilized to fine-tune the threshold level.

In some demonstrative aspects, switch 1726 may be implemented at a node between the supply voltage VDD 1728, e.g., as shown in FIG. 17. In other aspects, switch 1726 may be implemented at any other node, for example, at a node between the common-mode source of the gate nodes of LNA core 1722 and the ground.

Figure 19:
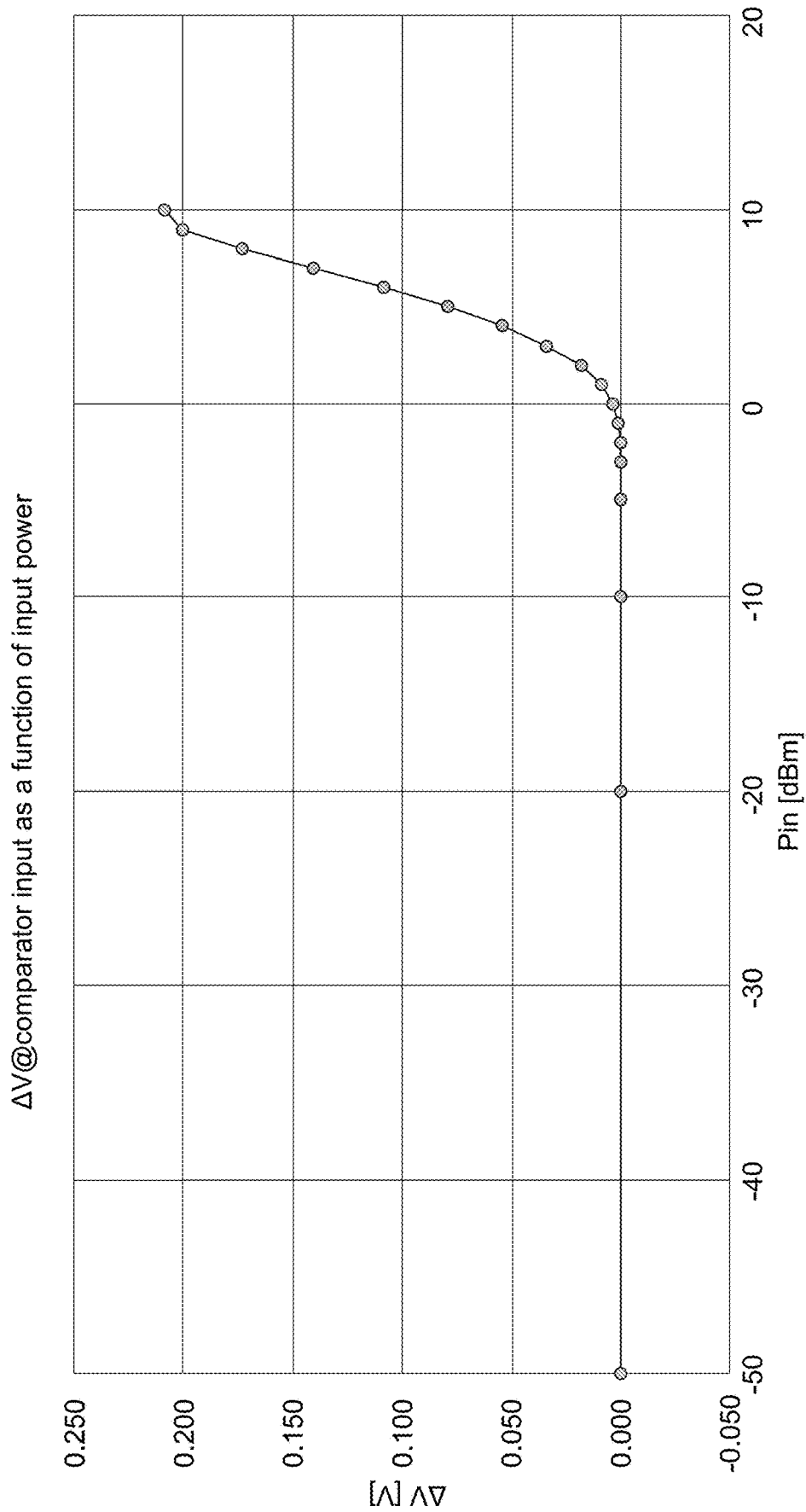
FIG. 19 is an illustration of a graph depicting simulation results of node voltage versus a Radio Frequency (RF) power level of an RF signal input to an amplifier of an Rx chain, in accordance with some demonstrative aspects.

FIG. 19 is an illustration of simulation results of node voltage versus a Radio Frequency (RF) power level of an RF signal input to an amplifier of an Rx chain, in accordance with some demonstrative aspects.

For example, the graph in FIG. 19 depicts results of a simulation demonstrating a power-detection mechanism based on the ESD diodes 1724 (FIG. 17), e.g., as described above. For example, as shown in FIG. 19, the voltage difference over the sensing resistor ($\Delta V$) may increase as RF input power (Pin) increases.

In some demonstrative aspects, under normal operation conditions, for example, where the RF input power is low, the DC voltages of each node may remain constant at quiescent values, e.g., $\Delta V=0$. For example, when the RF input power becomes high, the non-linearity effects of circuit components may manifest themselves. Most notably is the clipping action of ESD diodes 1724 (FIG. 17), which may reduce the average voltages of gate nodes down to zero volts, thereby creating a DC voltage between the nominal bias voltage and the input-dependent average DC value, e.g., $\Delta V>0$.

In some demonstrative aspects, the sensing resistor 1733 (FIG. 17) may be provided between the nodes (Vbias and Vgcm), for example, in order to capture the voltage difference explicitly, e.g., as described above with reference to FIG. 17. This voltage difference may be fed into comparator 1741 (FIG. 17), which may be configured to have an offset voltage equal to a desired threshold voltage for triggering, e.g., as described above.

For example, once the developed DC voltage difference exceeds the predefined threshold level, the comparator 1741 (FIG. 17) may trigger the power-control switch 1726 (FIG. 17) to turn off the input stage of the receiver amplifier, e.g., as described above. As a result, the input stage may be protected from excess output voltage swing, and following stages of the Rx chain may also be protected, e.g., since an output signal level of the input stage may be suppressed.

Figure 20:
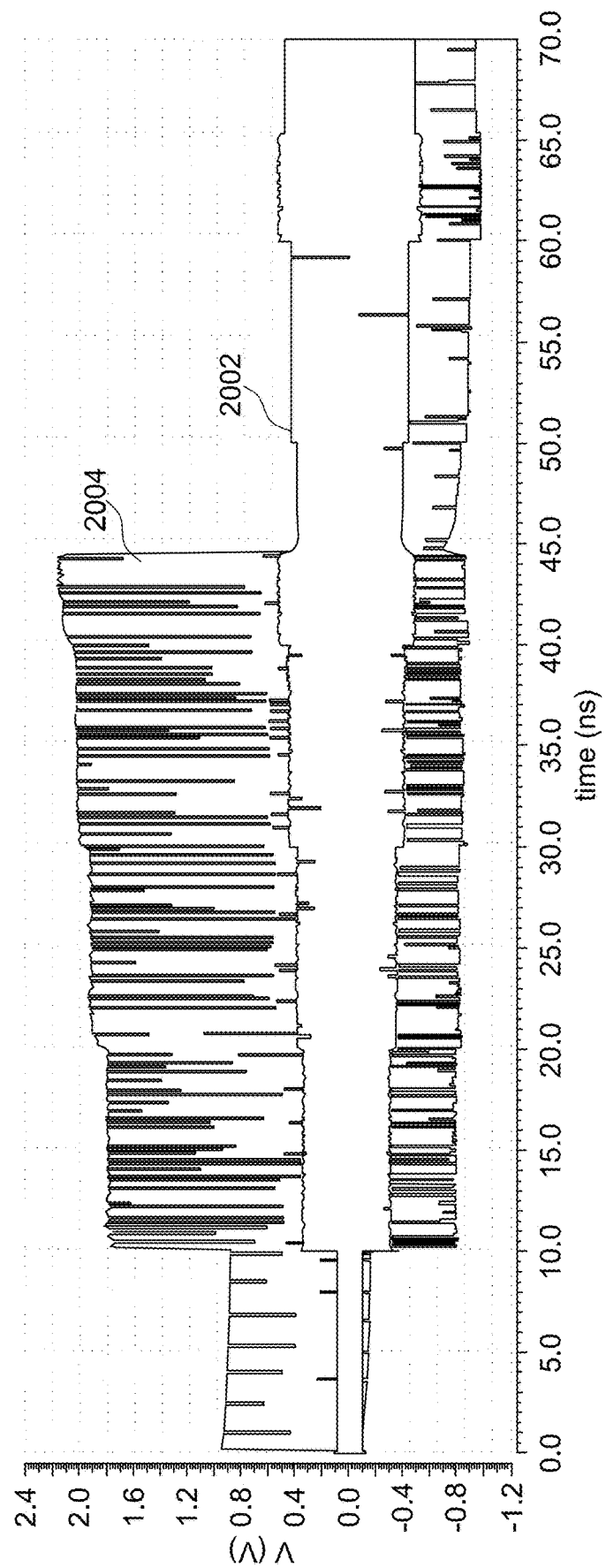
FIG. 20 is an illustration of simulated input and output voltage waveforms of an Rx chain based on changes in a power of an input RF signal over time, in accordance with some demonstrative aspects.

FIG. 20 is an illustration of simulated input and output voltage waveforms of an Rx chain based on changes in a power of an input RF signal over time, in accordance with some demonstrative aspects.

For example, FIG. 20 shows the Input/output waveforms, e.g., the input voltage 2002 and a gate-drain differential voltage as output voltage 2004, for different RF input power levels with the protection circuitry described above.

In one example, the voltage waveforms of FIG. 20 may represent the input and output of a receiver, e.g., a radar receiver, over time, for different RF input power levels.

For example, as shown in FIG. 20, while output swing 2004 increases as the input power 2002 increases, the output swing 2004 reaches the threshold level, which triggers the protection circuit, e.g., at ~44 nanoseconds (ns). As shown in FIG. 20, after the protection circuitry is enabled, the output swing (Vgd) is suppressed to a "safe" level, demonstrating a successful operation of the protection circuitry. It can also be seen from FIG. 20, that the response time is on the order of 10 ns, which demonstrates the superiority of the protection circuitry described above, e.g., compared to DSP-based power detection.

In some demonstrative aspects, the protection circuitry described above may provide a technical advantage in terms of better performance parameters, for example, compared to an alternative protection method, which includes additional clipping diodes to the input/output nodes, which need protection. For example, simulation results for an amplifier with additional clipping diodes show a gain and noise figure, which are worse by at least 1.5 dB, e.g., compared to the performance of the protection circuitry described above.

Referring to FIG. 8, in some demonstrative aspects, radar frontend 804 may include a Phased Lock Loop (PLL) 820, e.g., as described below.

In some demonstrative aspects, PLL 820 may be configured to provide a frequency signal to one or more RF chains, for example, Tx chains 810 and/or Rx chains 812, e.g., as described below.

In some demonstrative aspects, PLL 820 may include a Digital PLL (DPLL), e.g., as described below.

In some demonstrative aspects, radar frontend 804 may include a Local Oscillator (LO) 822. In some demonstrative aspects, LO 822 may be implemented as part of PLL 820, e.g., as described below. In other aspects, LO 822 may be implemented as part of any other additional or alterative element of radar frontend 804.

In some demonstrative aspects, LO 822 may include a Digitally Controlled Oscillator (DCO), e.g., as described below.

In some demonstrative aspects, LO 822 may include a circular multi-core oscillator 823, e.g., as described below.

In other aspects, LO 822 may be implemented according to any other LO technology and/or may include any other oscillator core.

In some demonstrative aspects, when implementing an LO, e.g., LO 822, there may be a need to provide a technical solution for obtaining very low phase noise in silicon, for example, while maintaining strict reliability constraints, e.g., in advanced Complementary Metal-Oxide-Semiconductor (CMOS) nodes, for example, for advanced communication and/or sensing systems. For example, a phase noise of a PLL may be an important, e.g., in some cases crucial, Figure of Merit (FOM), for example, to achieve a high Signal to Noise Ratio (SNR), e.g., in imaging radar systems.

In one example, phase noise of a PLL may be proportional to an inductor value and/or a frequency of the PLL. For example, the inductor value may be utilized to change the phase noise, for example, when implementing an oscillator at high frequencies, e.g., at mmWave frequencies. However, lowering the inductor value below a certain value, e.g., in order to lower the phase noise, may result in degradation of a Quality factor (Q) of the inductor and, therefore, may limit a minimum obtainable phase noise.

In some demonstrative aspects, implementing a small inductor, for example, to bypass the minimum obtainable phase noise, may result in one or more disadvantages, inefficiencies, and/or technical problems. For example, implementing a small inductor may provide a very limited solution, as an inductor having an inductance below 35 petaHenry (pH) may incur Q degradation.

In some demonstrative aspects, there may be a need to address one or more technical issues in an implementation of an LO based on a coupling of several oscillators, for example, to bypass the minimum obtainable phase noise.

In some demonstrative aspects, there may be one or more disadvantages, inefficiencies, and/or technical problems when implementing an LO utilizing parallel combing of cores, e.g., when coupling several oscillators in parallel, for example, by inductive coupling, capacitive coupling, and/or resistive coupling, for example, to lower the phase noise.

In one example, the parallel coupling of oscillator cores may be limited due to Q degradation of the coupled structure, e.g., as a coupled element is added.

In another example, the parallel coupling of oscillator cores may be sensitive to a tuning range, and/or may have a tendency to degrade rapidly, e.g., with tuning range. For example, the parallel combing of cores may have many oscillation modes, and, therefore, it may be hard to ensure oscillation at a required frequency.

In some demonstrative aspects, in one or more scenarios, implementations and/or use cases, there may be a need to address one or more technical issues for implementing an LO utilizing a common circular oscillator using a CMOS topology, e.g., according to a PMOS over NMOS topology. For example, the common circular oscillator may include four cores, which may be serially coupled, for example, to lower the phase noise.

In one example, when implementing a common circular oscillator structure, for example, to eliminate unwanted oscillation modes, it may be mandatory to implement a high impedance to connect certain points of the oscillator structure. For example, this implementation may mandate a main inductor to be placed at a node, which may not be sensitive to a voltage drop, e.g., Current*Resistance (IR) drop, which may force use of the CMOS topology. According to this example, the common circular oscillator structure may incur a 6 dB increase in a minimal phase noise, which may be obtained for a certain value of an inductor, and therefore, may limit a performance to a non-sufficient value of the inductor.

In some demonstrative aspects, circular multi-core oscillator 823 may be configured to support a reduced phase noise, for example, while maintaining high performance, high quality, and/or a wide tuning range, in a way which may support improved performance of radar frontend 804, e.g., as described below.

In some demonstrative aspects, circular multi-core oscillator 823 may be configured according to a scalable topology, which may support, for example, an improved oscillator efficiency of circular multi-core oscillator 823, e.g., as described below.

In some demonstrative aspects, circular multi-core oscillator 823 may be configured according to a circular architecture, which may provide, for example, an improvement of phase noise, e.g., even greater than 12 dB in one or more use cases, for example, compared to other circular oscillator implementations.

In some demonstrative aspects, circular multi-core oscillator 823 may be configured according to a scalable topology, which may support meeting very stringent phase noise performance, e.g., as described below.

In some demonstrative aspects, circular multi-core oscillator 823 may be configured to provide improved efficiency, for example, even with ultra-low phase noise performance, e.g., at mmWave frequencies in silicon, for example, while maintaining reliability concerns low for a large range of use cases, e.g., including automotive and/or industrial use cases.

In some demonstrative aspects, circular multi-core oscillator 823 may include a plurality of linearized transconductance oscillator cores, e.g., as described below.

In some demonstrative aspects, circular multi-core oscillator 823 may include a quad-core circular oscillator including four linearized transconductance oscillator cores, e.g., as described below.

In other aspects, circular multi-core oscillator 823 may include any other number of linearized transconductance oscillator cores.

In some demonstrative aspects, a linearized transconductance oscillator core of the plurality of linearized transconductance oscillator cores in circular multi-core oscillator 823 may include a plurality of transistors, e.g., as described below.

In some demonstrative aspects, the linearized transconductance oscillator core in circular multi-core oscillator 823 may include a ground resonator, which may be connected between sources of the plurality of transistors and a common ground node, e.g., as described below.

In some demonstrative aspects, the common ground node may include a common node to which a plurality of ground resonators of the plurality of linearized transconductance oscillator cores may be connected. In one example, the ground resonators of each of the plurality of linearized transconductance oscillator cores may all be connected to the same common ground node, e.g., as described below.

In some demonstrative aspects, the linearized transconductance oscillator core in circular multi-core oscillator 823 may include an Inductor (L) choke (Lchoke) to provide DC bias to drains of the plurality of transistors, e.g., as described below.

In some demonstrative aspects, the linearized transconductance oscillator core in circular multi-core oscillator 823 may include an Inductor Capacitor (C) (LC) tank connected to gates of the plurality of transistors, e.g., as described below.

In some demonstrative aspects, the LC tank may include a Ctank and an Ltank, e.g., as described below.

In some demonstrative aspects, the plurality of transistors of the linearized transconductance oscillator core may include a first transistor and a second transistor. For example, a gate of the first transistor may be connected to a first node of the LC tank, and a gate of the second transistor may be connected to a second node of the LC tank, e.g., as described below.

In some demonstrative aspects, the plurality of linearized transconductance oscillator cores in circular multi-core oscillator 823 may be configured such that plurality of Ltanks of the plurality of linearized transconductance oscillator cores may be serially coupled to form a circular resonator to inductively couple the plurality of linearized transconductance oscillator cores, e.g., as described below.

In some demonstrative aspects, the circular resonator may surround the plurality of ground resonators, e.g., as described below.

In some demonstrative aspects, the ground resonator of the linearized transconductance oscillator core in circular multi-core oscillator 823 may be configured to trap a second harmonic of the LC tank, e.g., as described below.

In some demonstrative aspects, the ground resonator may include a folded common mode resonator, e.g., as described below.

In some demonstrative aspects, the Ctank of the linearized transconductance oscillator core in circular multi-core oscillator 823 may include a Coarse Tune (CT) capacitor and a Fine Tune (FT) capacitor, e.g., as described below.

In some demonstrative aspects, a linearized transconductance oscillator core of the plurality of linearized transconductance oscillator cores in circular multi-core oscillator 823 may include a voltage divider configured to divide a voltage of the Lchoke between the plurality of transistors of the linearized transconductance oscillator core, e.g., as described below.

In some demonstrative aspects, the linearized transconductance oscillator core may include a first node to connect the Lchoke of the linearized transconductance oscillator core to a drain of a first transistor of the plurality of transistors of the linearized transconductance oscillator core, e.g., as described below.

In some demonstrative aspects, the linearized transconductance oscillator core may include a second node to connect the Lchoke of the linearized transconductance oscillator core to a drain of a second transistor of the plurality of transistors of the linearized transconductance oscillator core, e.g., as described below.

In some demonstrative aspects, the voltage divider of the linearized transconductance oscillator core may include a first capacitor connected between the first node and a gate of the second transistor, and/or a second capacitor connected between the second node and a gate of the first transistor, e.g., as described below.

In some demonstrative aspects, the voltage divider of the linearized transconductance oscillator core may include a plurality of capacitors connected in series between the first node and the second node, e.g., as described below.

In some demonstrative aspects, the plurality of linearized transconductance oscillator cores in circular multi-core oscillator 823 may be coupled to a respective plurality of power supplies, e.g., as described below.

In some demonstrative aspects, an Lchoke of a first linearized transconductance oscillator core may be connected to a first power supply of the plurality of power supplies, and an Lchoke of a second linearized transconductance oscillator core may be connected to a second power supply of the plurality of power supplies, e.g., as described below.

In some demonstrative aspects, the plurality of power supplies may include a respective plurality of Low-Dropout (LDO) Regulators, e.g., as described below. In other aspects, any other additional or alternative power supplies may be implemented.

In some demonstrative aspects, the plurality of power supplies may be implemented to provide a technical solution in which a DC power of a linearized transconductance oscillator core, e.g., a DC power of each linearized transconductance oscillator core, may be driven from a different LDO. This technical solution may provide an improved phase noise of circular multi-core oscillator 823.

For example, implementation of the plurality of power supplies may support lowering a noise contribution of an LDO to the circular multi-core oscillator 823, for example, compared to a noise contribution of an implementation utilizing a single LDO for all of the linearized transconductance oscillator cores.

In some demonstrative aspects, the plurality of linearized transconductance oscillator cores in circular multi-core oscillator 823 may include a respective plurality of outputs, e.g., as described below.

In some demonstrative aspects, the plurality of outputs may output a respective plurality of electronic signals, for example, having a same phase, e.g., as described below.

In some demonstrative aspects, an output of a linearized transconductance oscillator core in circular multi-core oscillator 823 may be connected to the gates of the plurality of transistors of the linearized transconductance oscillator core, e.g., as described below.

Figure 21:
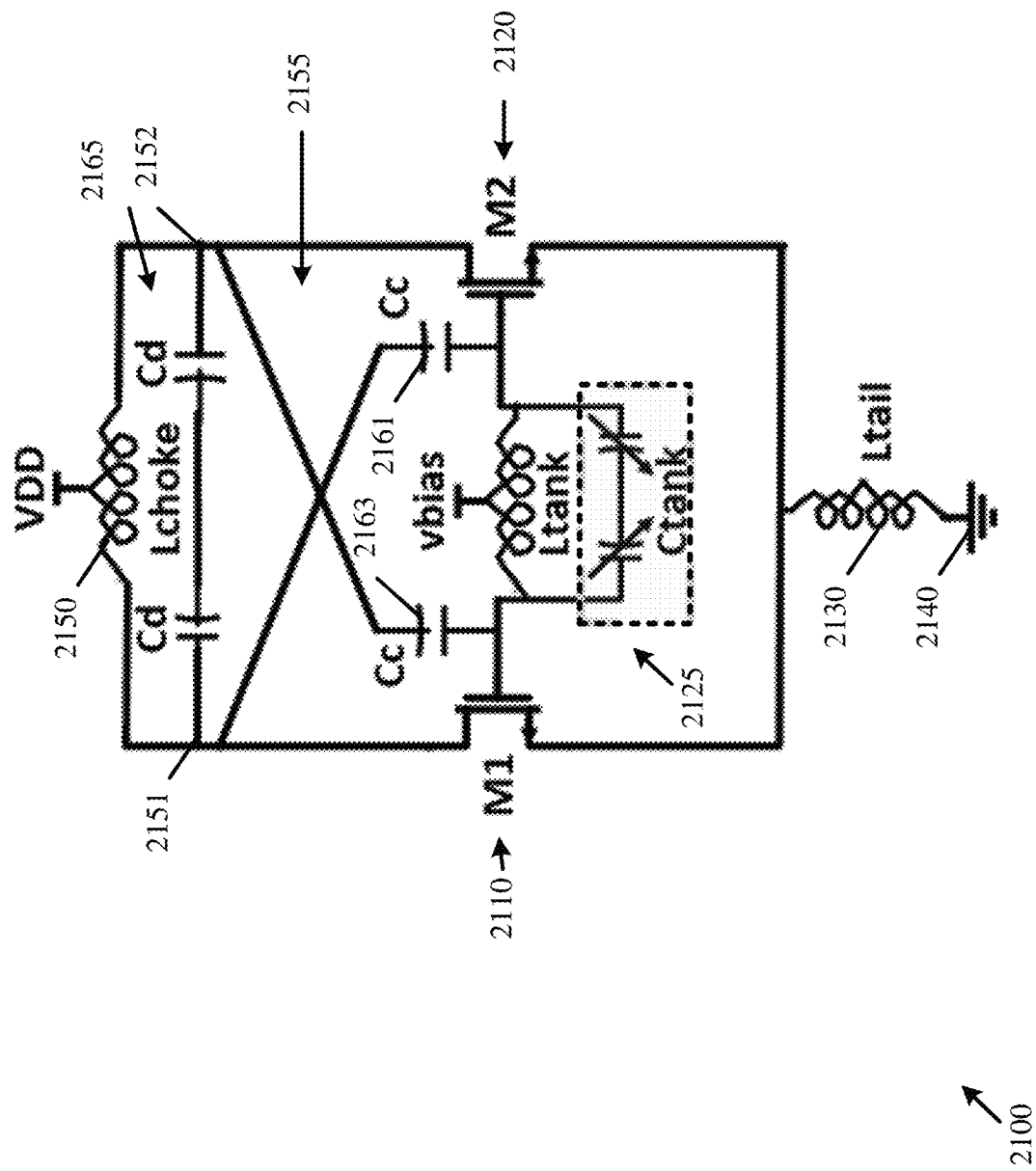
FIG. 21 is a schematic illustration of a linearized transconductance oscillator core, in accordance with some demonstrative aspects.

Reference is made to FIG. 21, which schematically illustrates a linearized transconductance oscillator core 2100, in accordance with some demonstrative aspects. For example, circular multi-core oscillator 823 (FIG. 8) may include one or more elements of linearized transconductance oscillator core 2100, and/or may perform one or more operations of, and/or one or more functionalities of, linearized transconductance oscillator core 2100.

In some demonstrative aspects, as shown in FIG. 21, linearized transconductance oscillator core 2100 may include a plurality of transistors. For example, linearized transconductance oscillator core 2100 may include a first transistor 2110 and a second transistor 2120.

In some demonstrative aspects, as shown in FIG. 21, linearized transconductance oscillator core 2100 may include an LC tank 2125 connected to gates of the plurality of transistors.

In some demonstrative aspects, as shown in FIG. 21, the LC tank 2125 may include a Ctank and an Ltank.

In some demonstrative aspects, the Ctank may include a CT capacitor and an FT capacitor.

In some demonstrative aspects, circular multi-core oscillator 823 (FIG. 8) may include a plurality of linearized transconductance oscillator cores 2100, for example, such that a plurality of Ltanks 2125 of the plurality of linearized transconductance oscillator cores 2100 may be serially coupled to form a circular resonator to inductively couple the plurality of linearized transconductance oscillator cores 2100, e.g., as described below.

In some demonstrative aspects, as shown in FIG. 21, linearized transconductance oscillator core 2100 may include a ground resonator 2130 connected between sources of the plurality of transistors and a common ground node 2140.

In some demonstrative aspects, circular multi-core oscillator 823 (FIG. 8) may include a plurality of linearized transconductance oscillator cores 2100, which may be configured, for example, such that a plurality of ground resonators 2130 of the plurality of linearized transconductance oscillator cores 2100 may be connected to the same common ground node 2140, e.g., as described below.

In some demonstrative aspects, the ground resonator 2130 may include a folded common mode resonator, e.g., as described below. In other aspects, any other resonator may be utilized.

In some demonstrative aspects, the ground resonator 2130 may be configured to trap a second harmonic of the LC tank 2125, e.g., as described below.

In one example, the ground resonator 2130 may be utilized to provide a technical advantage, for example, to resent a high impedance at the second harmonic of the LC tank 2125. For example, the ground resonator 2130 may be configured to delay entrance into triode, and/or to reduce even harmonics, which may be responsible for flicker noise up conversion.

In some demonstrative aspects, the resonator 2130 may be folded within the main resonator, e.g., in the LC tank 2125, to allow a short interconnect to devices, to save an area of linearized transconductance oscillator core 2100, and/or to reduce an overall layout complexity.

In some demonstrative aspects, as shown in FIG. 21, linearized transconductance oscillator core 2100 may include an Lchoke 2150 to provide DC bias to drains of the plurality of transistors.

In some demonstrative aspects, as shown in FIG. 21, linearized transconductance oscillator core 2100 may include a voltage divider 2155 configured to divide a voltage of the Lchoke 2150 between the plurality of transistors.

In some demonstrative aspects, as shown in FIG. 21, linearized transconductance oscillator core 2100 may include a first node 2151 to connect the Lchoke 2150 to a drain of the transistor 2110, and a second node 2152 to connect the Lchoke 2150 to a drain of the second transistor 2120.

In some demonstrative aspects, as shown in FIG. 21, voltage divider 2155 may include a first capacitor (Cc) 2161 connected between the first node 2151 and a gate of the second transistor 2120, and a second capacitor (Cc) 2163 connected between the second node 2152 and a gate of the first transistor 2110.

In some demonstrative aspects, as shown in FIG. 21, voltage divider 2155 may include a plurality of capacitors 2165, denoted Cd, connected in series between the first node 2151 and the second node 2152.

In some demonstrative aspects, as shown in FIG. 21, a gate of the first transistor 2110 may be connected to a first node of the LC tank 2125, and a gate of the second transistor 2120 may be connected to a second node of the LC tank 2125.

In some demonstrative aspects, as shown in FIG. 21, the LC tank 2125 may be placed in the gates of the transistors 2110 and 2120, and the voltage divider 2155 may be configured as a capacitive voltage divider to close a feedback from drains of the transistors 2110 and 2120. This implementation may provide a technical advantage to allow biasing the gates of the transistors 2110 and 2120 at a lower voltage, e.g., to separate swings and reduce reliability concerns, for example, while providing a lower swing on the drains of the transistors 2110 and 2120. For example, these effects may delay entrance into triode, thus supporting a higher effective swing on the gates of the transistors 2110 and 2120. For example, these effects may provide improved phase noise with reduced Q degradation.

Figure 22:
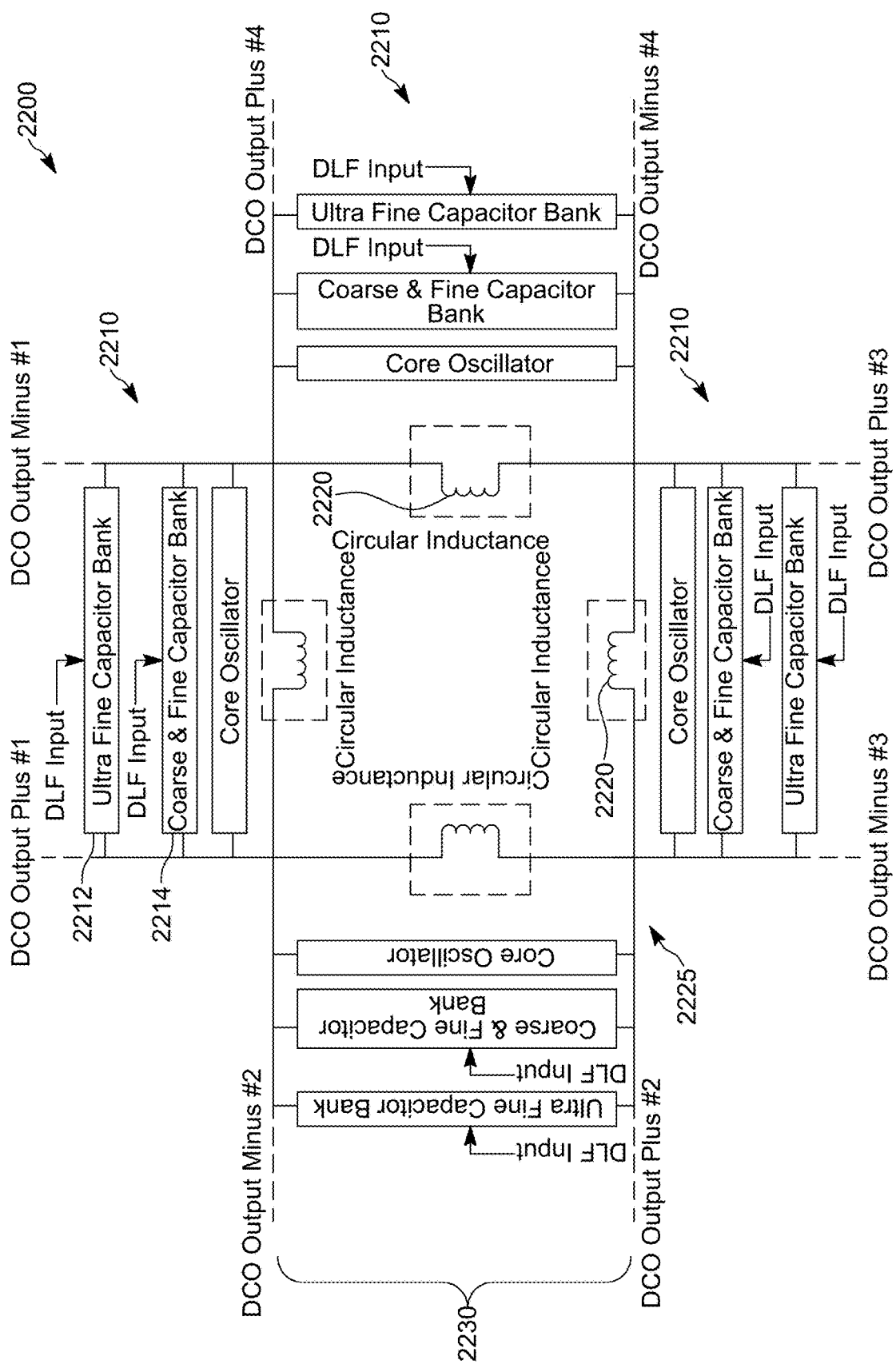
FIG. 22 is a schematic illustration of a circular multi-core oscillator, in accordance with some demonstrative aspects.

Reference is made to FIG. 22, which schematically illustrates a circular multi-core oscillator 2200, in accordance with some demonstrative aspects. For example, circular multi-core oscillator 823 (FIG. 8) may include one or more elements of circular multi-core oscillator 2200, and/or may perform one or more operations of, and/or one or more functionalities of, circular multi-core oscillator 2200.

In some demonstrative aspects, as shown in FIG. 22, circular multi-core oscillator 2200 may include a quad-core circular oscillator including four linearized transconductance oscillator cores 2210. For example, a linearized transconductance oscillator core 2210 of circular multi-core oscillator 2200 may include one or more elements of linearized transconductance oscillator core 2100 (FIG. 21), and/or may perform one or more operations of, and/or one or more functionalities of, linearized transconductance oscillator core 2100 (FIG. 21).

In some demonstrative aspects, as shown in FIG. 22, four Ltanks 2220 of the four linearized transconductance oscillator cores 2210 may be serially coupled to form a circular resonator 2225.

In some demonstrative aspects, circular resonator 2225 may inductively couple the plurality of linearized transconductance oscillator cores 2210.

In some demonstrative aspects, as shown in FIG. 22, circular multi-core oscillator 2200 may include four outputs 2230, e.g., corresponding to the four of linearized transconductance oscillator cores 2210, for example, to output four respective electronic signals, e.g., having substantially a same phase.

In some demonstrative aspects, as shown in FIG. 22, a linearized transconductance oscillator core 2210, e.g., each linearized transconductance oscillator core 2210, may include a CT capacitor 2214 and an FT capacitor 2212.

In some demonstrative aspects, circular multi-core oscillator 2200 may provide a technical solution to achieve a phase noise improvement, for example, which may even be greater than 12 dB, e.g., compared to other circular multi-core oscillator topologies utilizing a same inductor size.

Figure 23:
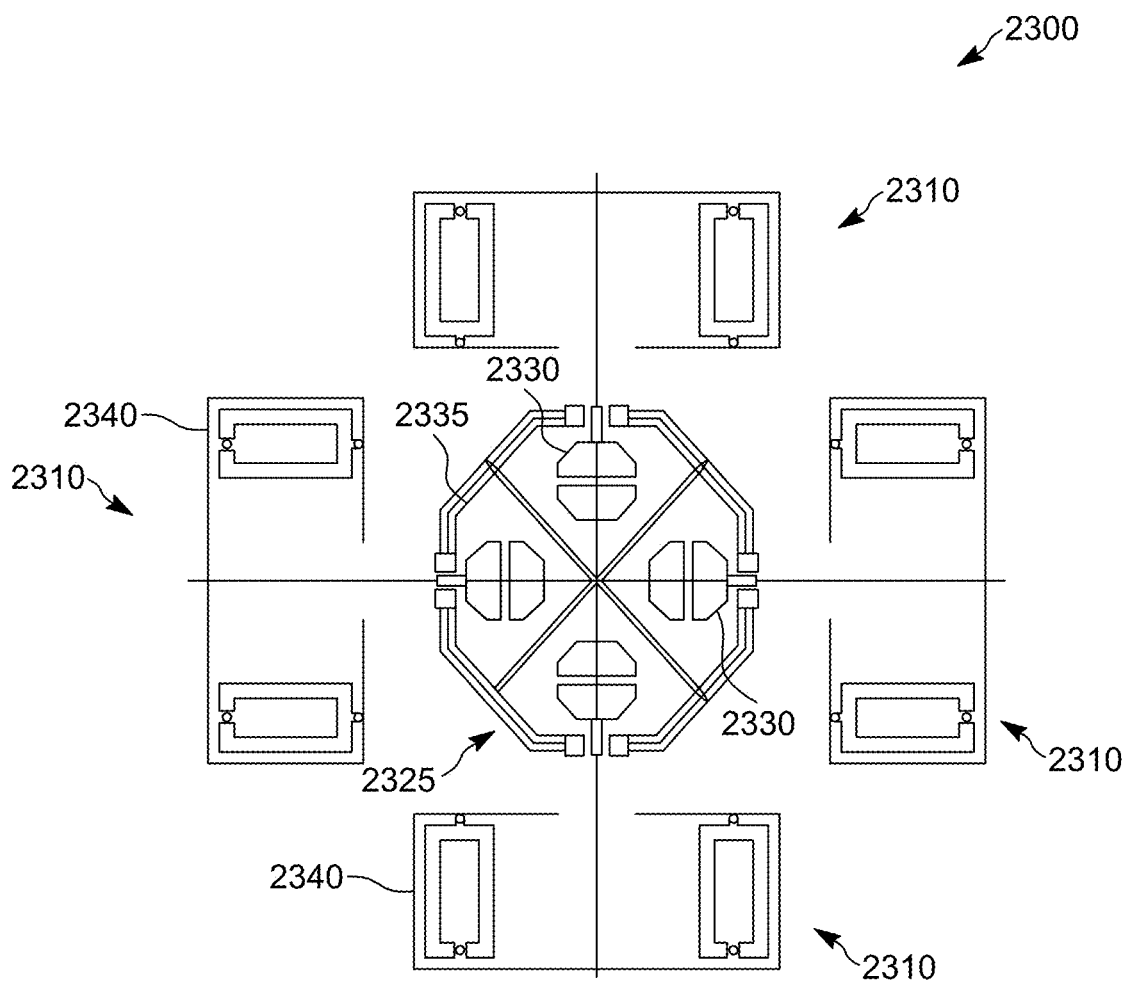
FIG. 23 is a schematic illustration of a top-view of a circular multi-core oscillator, in accordance with some demonstrative aspects.

Reference is made to FIG. 23, which schematically illustrates a top-view of a circular multi-core oscillator 2300, in accordance with some demonstrative aspects. For example, circular multi-core oscillator 823 (FIG. 8) may include one or more elements of circular multi-core oscillator 2300, and/or may perform one or more operations of, and/or one or more functionalities of, circular multi-core oscillator 2300.

In some demonstrative aspects, as shown in FIG. 23, circular multi-core oscillator 2300 may include a quad-core circular oscillator including four linearized transconductance oscillator cores 2310. For example, a linearized transconductance oscillator core 2310 of circular multi-core oscillator 2300 may include one or more elements of linearized transconductance oscillator core 2100 (FIG. 21), and/or may perform one or more operations of, and/or one or more functionalities of, linearized transconductance oscillator core 2100 (FIG. 21).

In some demonstrative aspects, as shown in FIG. 23, circular multi-core oscillator 2300 may include a circular resonator 2325, for example, formed by a plurality of serially coupled Ltanks of the linearized transconductance oscillator cores 2310.

In some demonstrative aspects, circular resonator 2325 may inductively couple the plurality of linearized transconductance oscillator cores 2310.

In some demonstrative aspects, as shown in FIG. 23, circular multi-core oscillator 2300 may include a plurality of ground resonators 2330, which may be connected to a common ground node.

In one example, as shown in FIG. 23, ground resonators 2330 may be within circular multi-core oscillator 2300 and may be surrounded by the circular resonator 2325.

In some demonstrative aspects, as shown in FIG. 23, circular multi-core oscillator 2300 may include a plurality of Lchokes 2340.

In one example, as shown in FIG. 23, the plurality of Lchokes 2340 may include RF chokes, which may be configured, for example, to provide a DC bias and/or to present an RF high impedance to drains of transistors of the linearized transconductance oscillator cores 2310.

In one example, as shown in FIG. 23, circular multi-core oscillator 2300 may have four differential ports 2335, to which linear transconductance (LiT) oscillator cores 2310 may be connected.

Figure 24:
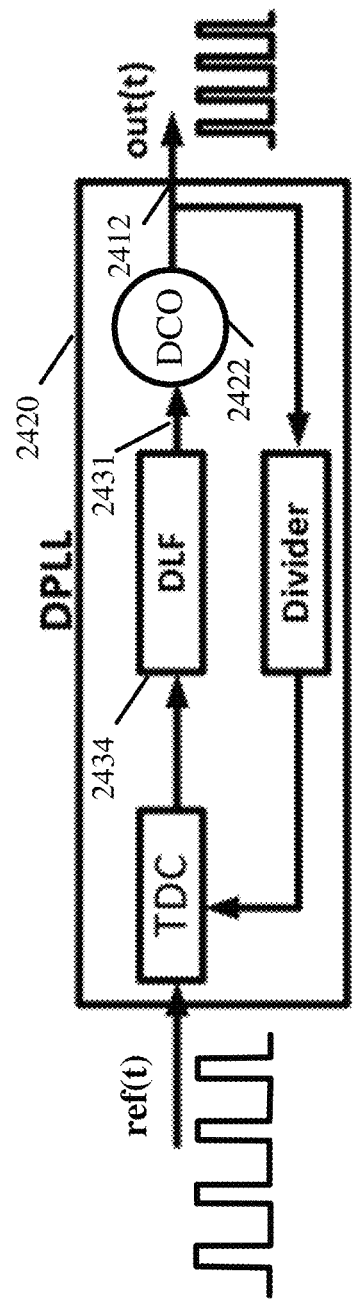
FIG. 24 is a schematic illustration of a Phase-Locked-Loop (PLL), in accordance with some demonstrative aspects.

Reference is made to FIG. 24, which schematically illustrates a PLL 2420, in accordance with some demonstrative aspects. For example, PLL 820 (FIG. 8) may include one or more elements of PLL 2420, and/or may perform one or more operations of, and/or one or more functionalities of, PLL 2420.

In some demonstrative aspects, as shown in FIG. 24, PLL 2420 may include a DCO 2422, which may be configured as a circular multi-core oscillator. For example, DCO 2422 may include one or more elements of circular multi-core oscillator 2200 (FIG. 3), and/or may perform one or more operations of, and/or one or more functionalities of, circular multi-core oscillator 2200 (FIG. 3).

In some demonstrative aspects, as shown in FIG. 24, DCO 2422 may be configured to generate an output frequency signal 2412, for example, based on an input signal 2431 from a Digital Loop Filter (DLF) 2434. For example, circular multi-core oscillator 2200 (FIG. 22) may be configured to generate frequency signal 2412 including the electronic signals, for example, based on input signal 2431 from DLF 2434.

Figure 25:
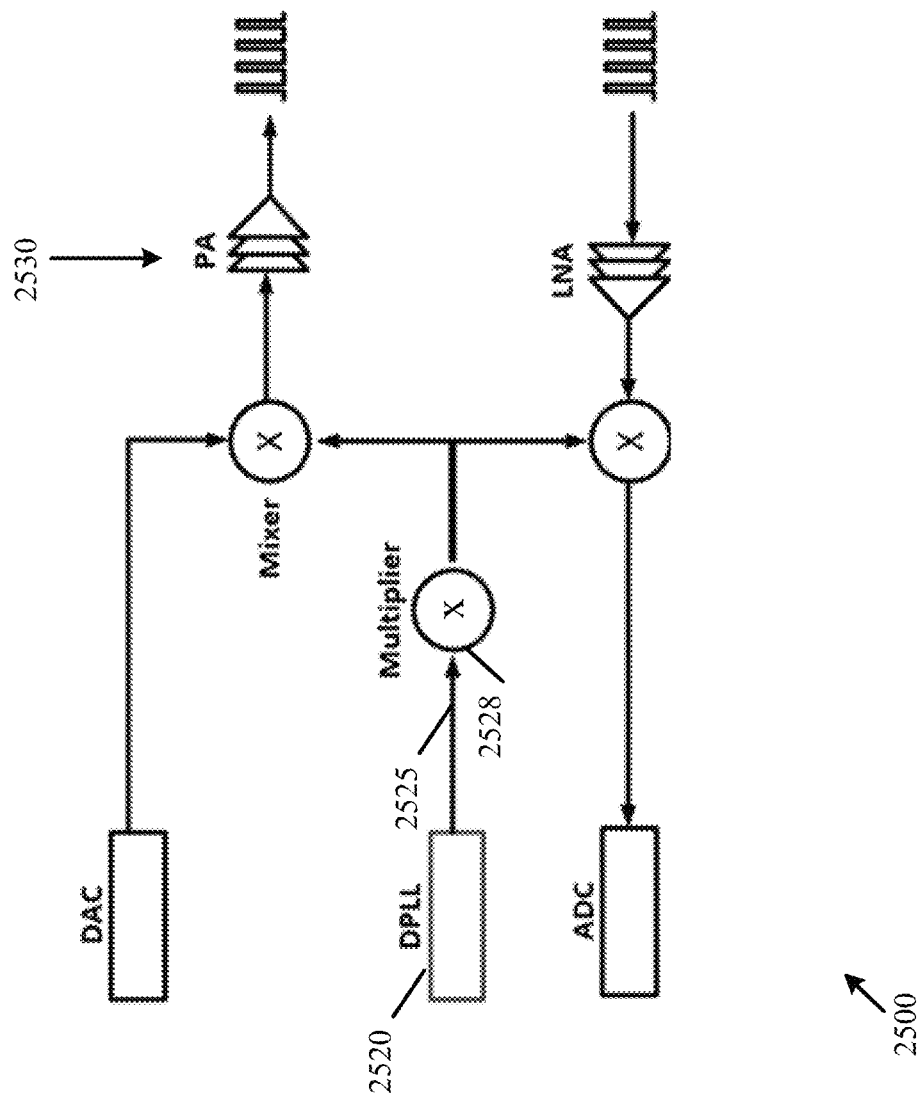
FIG. 25 is a schematic illustration of components of an RF front end, in accordance with some demonstrative aspects.

Reference is made to FIG. 25, which schematically illustrates components of an RF front end 2500, in accordance with some demonstrative aspects. For example, radar frontend 804 (FIG. 8) may include one or more elements of RF front end 2500, and/or may perform one or more operations of, and/or one or more functionalities of, radar 2500.

In some demonstrative aspects, as shown in FIG. 25, RF front-end 2500 may include a PLL 2520, which may be configured to provide a frequency signal 2525. For example, PLL 2520 may include one or more elements of PLL 2420 (FIG. 24), and/or may perform one or more operations of, and/or one or more functionalities of, PLL 2420 (FIG. 24).

In some demonstrative aspects, RF front-end 2500 may include a multiplexer 2528, which may be configured to provide the frequency signal 2525 to a plurality of RF chains 2530.

In some demonstrative aspects, for example, RF chains 2530 may include a plurality of Tx chains, which may be configured to transmit signals based on the frequency signal 2525, and/or a plurality of Rx chains, which may be configured to process received signals based on the frequency signal 2525. For example, RF chains 2530 may be connected to antenna elements of a MIMO radar antenna, e.g., MIMO radar antenna 881 (FIG. 8).

Figure 26:
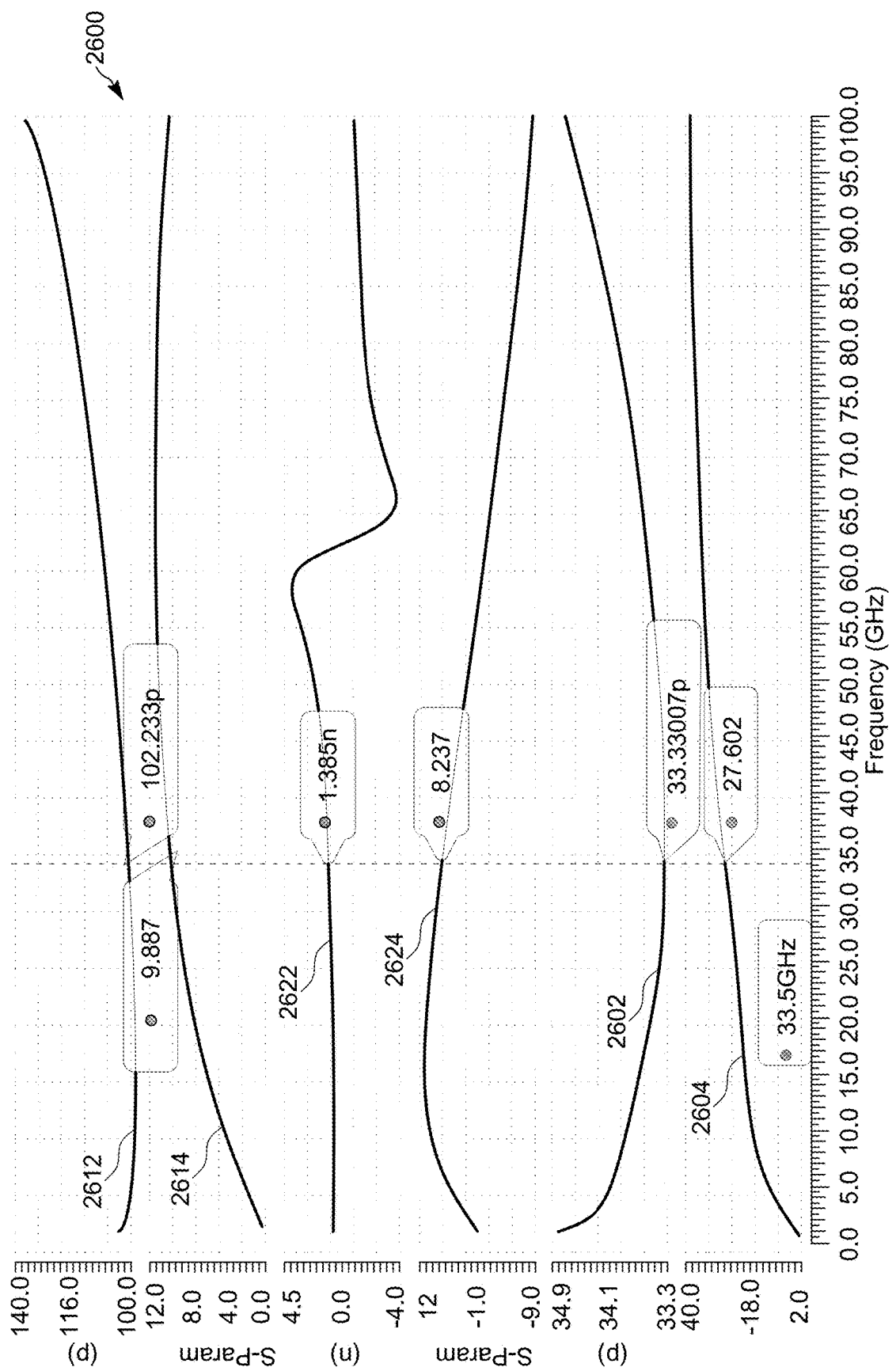
FIG. 26 is an illustration of a graph depicting performance parameters of a circular multi-core oscillator, in accordance with some demonstrative aspects.

Reference is made to FIG. 26, which illustrates a graph 2600 depicting performance parameters of a circular multi-core oscillator, in accordance with some demonstrative aspects. For example, one or more parts of the graph 2600 may be based on simulation results corresponding to the circular multi-core oscillator 2200 (FIG. 22).

In some demonstrative aspects, a curve 2612 represents a simulated impedance of a ground resonator of the circular multi-core oscillator versus frequency. For example, curve 2612 may represent the impedance of the ground resonator 2140 (FIG. 21).

In some demonstrative aspects, a curve 2614 represents a simulated Q factor of the ground resonator of the circular multi-core oscillator versus frequency. For example, curve 2614 may represent the Q factor of the ground resonator 2140 (FIG. 21).

In some demonstrative aspects, a curve 2622 represents a simulated impedance of an Lchoke of the circular multi-core oscillator versus frequency. For example, curve 2612 may represent the impedance of the Lchoke 2150 (FIG. 21).

In some demonstrative aspects, a curve 2624 represents a simulated Q factor of the Lchoke of the circular multi-core oscillator versus frequency. For example, curve 2624 may represent the Q factor of the Lchoke 2150 (FIG. 21).

In some demonstrative aspects, a curve 2602 represents a simulated impedance of a circular resonator of the circular multi-core oscillator versus frequency. For example, curve 2624 may represent the impedance of the circular resonator 2225 (FIG. 22).

In some demonstrative aspects, a curve 2604 represents a simulated Q factor of the circular resonator of the circular multi-core oscillator versus frequency. For example, curve 2604 may represent the Q factor of the circular resonator 2225 (FIG. 22).

In some demonstrative aspects, as shown in FIG. 26, a circular resonator inductance of 33 pH with a Q factor of about 30, e.g., 26.602, may be achieved by the circular multi-core oscillator, for example, at a frequency of 33.5 GHz.

Referring to FIG. 8, in some demonstrative aspects, radar frontend 804 may include an LO controller 824 configured to control a setting of LO 822, e.g., as described below.

In some demonstrative aspects, LO controller 824 may be implemented as part of PLL 820, for example, as part of a PLL controller.

In some demonstrative aspects, one or more functionalities and/or operations of LO controller 824 may be implemented as part of an Automatic Band Selector (ABS), for example, as part of PLL 820, e.g., as described below.

In other aspects, one or more functionalities and/or operations of LO controller 824 may be implemented as part of any other element of PLL 820 and/or radar frontend 804, and/or as a separate element of PLL 820 and/or radar front end 804.

In some demonstrative aspects, there may be a need to address one or more technical issues in controlling a setting of LO 822, e.g., as described below.

In some demonstrative aspects, frequency synthesizers based on DPLL may provide an alternative to analog PLLs. For example, one difference between analog PLLs and DPLLs may be in the retrieval and processing of phase information into frequency commands, which may be applied to an LO, e.g., LO 822.

In one example, a DPLL, e.g., PLL 820, may include a Time To Digital Converter (TDC) configured to measure a relative phase between the LO 822 and reference clock (REF) signals; and digital logic to compute a required frequency setting (shift), e.g., to compensate for the relative phase, e.g., as described below.

In some demonstrative aspects, LO 822 may be required to cover a relatively wide bandwidth. In other to support such a wide bandwidth, the controlling of the LO 822 to adjust to the required frequency shift may be broken-down into several segments, for example, along segments of predefined frequency shifts.

In some demonstrative aspects, the frequency shift may be performed according to a Coarse Tune (CT) setting and a Fine Tune (FT) setting, e.g., as described below.

In some demonstrative aspects, the CT setting may be applied to control large frequency shifts of LO 822, e.g., shifting between frequency bands.

In one example, the CT setting may remain constant, for example, during a phase-lock of PLL 820.

In some demonstrative aspects, the FT setting may be applied to control smaller frequency shifts of the LO 822, e.g., compared to the frequency shifts of the CT setting. In one example, the FT setting may be applied to control frequency shifts of the LO 822, which may be required to maintain a phase-lock over time.

In some demonstrative aspects, PLL 820 may be configured to operate in a plurality of operational stages, for example, including an acquisition stage and a tracking stage, e.g., as described below.

In some demonstrative aspects, PLL 820 may apply the CT setting and the FT setting, for example, during the acquisition stage and/or during the tracking stage, e.g., as described below.

In some demonstrative aspects, PLL 820 may apply the CT setting during the acquisition stage, for example, by selecting a best fitting band and a region in which a required frequency may be found, for example, using auxiliary Frequency Locked Loop (FLL) circuitry, which may be controlled by an ABS.

In some demonstrative aspects, PLL 820 may be released to lock to a phase of a reference signal, for example, by applying the FT setting, for example, after selecting the best fitting band and the region.

In some demonstrative aspects, PLL 820 may continuously measure a phase during the tracking stage. For example, the phase may be continuously measured and juxtaposed to the required value. For example, a discrepancy, e.g., every discrepancy, may result in a command to change the FT setting.

In some demonstrative aspects, one or more scenarios, implementations and/or use cases, may require re-locking to the required frequency during the tracking stage. For example, these scenarios may result in a change in the CT setting, which may result in reactivating the FLL circuitry, e.g., as described below.

In one example, a power supply drift and/or a temperature drift may cause the FT setting to approach the edge of a sub-band to which PLL 820 is locked. For example, this proximity may cause PLL 820 to lose the lock to the required frequency, for example, if the drift is not treated, e.g., by applying a suitable CT setting.

In another example, a radio, e.g., the Tx 883 (FIG. 1) of frontend 804 (FIG. 8), may be required to shift its transmission to another frequency, for example, due to one or more operational requirements, e.g., standard requirements, performance requirements, environment requirements, and/or any other operational requirement.

In some demonstrative aspects, a process of relocking the PLL 820 to a required frequency may consume time and/or resources, for example, when the relocking includes multiple stages and measurements.

In some demonstrative aspects, there may be one or more disadvantages, inefficiencies, and/or technical problems, for example, when performing a full FLL-based measurement, for example, every time it is required to relock the PLL, e.g., as described below.

In one example, the full FLL-based measurement may include a full measurement-based frequency locking cycle, for example, each time a re-lock is required, for example, due to an environment drift and/or in order to change a frequency.

For example, the full FLL-based measurement may include applying a CT setting, for example, by the ABS, by performing a CT search, e.g., a binary search or a linear search, for example, based on Cycle Counter (CC) measurements, followed by a full or partial FT search, e.g., based on the same CC measurements. For example, the FT setting may be required in order to shorten a phase-locking transient and/or to remove ambiguity that may be present in the PLL, e.g., due to limitations of the employed phase quantizer.

For example, the full FLL-based measurement may be too costly in terms of transient time, e.g., from a system point of view.

In some demonstrative aspects, there may be one or more disadvantages, inefficiencies, and/or technical problems when implementing a sub-band scheme including a large number of sub-bands with a large overlap in frequencies covered by each adjacent band. For example, sub-band scheme may be implemented in order to address environmental drifts, e.g., as described below.

For example, during an environmental drift, a PLL may drift to a next sub-band, e.g., in a direction, which may be chosen such that the required frequency may be closer to a center of the new sub-band. According to this example, an FT setting may be kept constant during the transition, which may dictate a large sub-band overlap, e.g., the start FT setting in the next band should be as close as possible to the final FT setting corresponding to the desired frequency. For example, failure to adhere to this overlap requirement, may cause locking to a wrong frequency, e.g., due to phase sampling ambiguity, and/or may create a long convergence transient.

For example, the large sub-band overlap may result with a large number of overlapping sub-bands. This large number of overlapping sub-bands may be required for simple environmental drift mitigation. The need to maintain the large number of overlapping sub-bands may result in a sub-optimal LO design, which may degrade phase noise performance, may reduce a quality factor Q, may increase a power consumption, and/or may increase an occupied chip area. For example, a baseline requirement for low-phase noise, low power, and/or small-area oscillators, may require a number of sub-bands, which is as small as possible.

In some demonstrative aspects, there may be one or more disadvantages, inefficiencies, and/or technical problems, in a technical solution for PLL relocking, which may be based on shortening a transient, resulting from an ordered change of frequency, which generally requires pre-calibration.

For example, a CT function describing a central frequency of each CT setting may be approximated, for example, based on a number of measurements, pending its monotonicity, e.g., a requirement usually not satisfied due to realization aspects of the CT setting. For example, the function may be employed to compute a required CT for a given frequency, and a PLL may be used to converge on the FT setting, for example, until locking may be finally achieved.

For example, a lack of monotonicity in the CT function may require composing a table of forbidden areas, which may further complicate the technique. Implementation of the CT function may significantly complicate the ordered frequency change, and/or environmental drift mitigation, e.g., as a next sub-band in line may not necessarily yield a higher frequency.

In one example, an environmental change, e.g., a temperature change and/or a voltage change, may render the CT function useless. For example, a temperature sensor with a digitized output as well as knowledge of temperature drift dynamics may be imperative, for example, to make use of a single time extracted pre-calibration table, for example, after a considerable shift in the temperature has occurred.

In some demonstrative aspects, controller 824 may be configured to provide a technical solution, which may support significantly reducing a locking time of PLL 820 to a required frequency, for example, during the acquisition stage and/or the tracking stage, e.g., as descried below.

In some demonstrative aspects, controller 824 may be configured to provide a technical solution, which may support reducing the locking time of PLL 820, for example, even when experiencing environmental changes, e.g., as descried below.

In some demonstrative aspects, controller 824 may be configured to provide a technical solution, which may support reducing the locking time of PLL 820, for example, based on calculations employing a pre-measured LO characterization table, and an algorithm of compensating for an environmental drift experienced since the creation of the table, e.g., as descried below.

In some demonstrative aspects, controller 824 may be configured to characterize LO 822, for example, on start-up, for example, by creating a full pre-calibrated table, e.g., as described below.

In some demonstrative aspects, controller 824 may be configured to, access the full pre-calibrated table, for example, with a factored required frequency, based, for example, on a new required frequency, denoted $f_{new}$, e.g., as described below.

In some demonstrative aspects, the factored required frequency may be suitable for an environmental shift experienced since the time of characterization of the pre-calibrated table.

In some demonstrative aspects, the factored required frequency may be determined, for example, based on a current CT setting, a current FT setting and/or a current frequency, denoted $f_{old}$, e.g., when PLL 820 is at a lock state, e.g., as described below.

In some demonstrative aspects, the factored required frequency may be determined, for example, based on a frequency measurement, e.g., even a single frequency measurement, for example, when PLL 820 is not at the lock state, e.g., as described below.

In some demonstrative aspects, the factored required frequency may be used to find a suitable CT setting, for example, by employing a binary search, and an FT setting. For example, a table entry may include sub-band frequency dependence of FT setting, for example, either linear or non-linear, e.g., as described below.

In some demonstrative aspects, controller 824 may use the factored required frequency to control the setting of LO 822, in a way which may significantly reduce a frequency lock time and/or a phase lock time, for example, while maintaining an increased level of accuracy, for example, since an initial frequency error may be made arbitrarily small, for example, a single digit parts per million (ppm).

In some demonstrative aspects, controller 824 may use the factored required frequency to control the setting of LO 822, in a way which may allow PLL 820 to achieve faster locking times, which may result in considerable savings in the acquisition stage, e.g., in cases of both fresh-locking and re-locks.

In some demonstrative aspects, controller 824 may use the factored required frequency to control the setting of LO 822, in a way which may allow PLL 820 to provide extended functionality flows and/or power savings, for example, by switching the LO 822 between on and off states, for example, when not needed.

In some demonstrative aspects, controller 824 may use the factored required frequency to control the setting of LO 822, in a way which may allow PLL 820 to provide improved tracking and/or responding to environment changes, e.g., such as temperature drift, for example, even without sacrificing a phase noise quality of the LO 822.

In some demonstrative aspects, controller 824 may use the factored required frequency to control the setting of LO 822, in a way which may allow reducing a frequency transient induced by temperature drifts, for example, to a suitable required low value.

In some demonstrative aspects, radar frontend 804 may include a memory 805 to store mapping information, for example, in the form of a Lookup Table (LUT) 807 to map a plurality of LO frequencies to a respective plurality of LO settings of LO 822, e.g., at a first environment condition, e.g., as described below.

In some demonstrative aspects, memory 805 may be implemented as part of controller 824 and/or as part of PLL 820. In other aspects, memory 805 may be implemented as part of any other element of radar frontend 804.

In some demonstrative aspects, the mapping information may be stored in memory 805 in the form of LUT 807, e.g., as described below. In other aspects, the mapping information may be stored in memory 805 in any other form and/or data structure.

In some demonstrative aspects, controller 824 may be configured to calibrate a mapping of the plurality of LO frequencies to the plurality of LO settings, e.g., in the LUT 807, for example, upon initialization of the LO 822, e.g., as described below. In other aspects, the mapping of at least some of the plurality of LO frequencies to the plurality of LO settings, e.g., in the LUT 807 may be calibrated, initialized, updated, and/or adjusted at any other timing, e.g., periodically or non-periodically, and/or according to any other additional or alternative scheme.

In some demonstrative aspects, controller 824 may be configured to control setting of the LO 822 to a required LO frequency, for example, at a second environment condition, e.g., as described below.

In some demonstrative aspects, controller 824 may be configured to set the LO 822, for example, by setting a capacitance of the LO 822, e.g., as described below. In other aspects, controller 824 may be configured to set the LO 822, for example, by setting any other additional or alternative parameter of the LO 822.

In some demonstrative aspects, controller 824 may be configured to control setting of the LO 822 to the required LO frequency, for example, based on the mapping information, e.g., in LUT 807, e.g., as described below. In other aspects, PLL controller 824 may be configured to control setting of the LO 822 to the required LO frequency, for example, based on any other additional or alternative mechanism.

In some demonstrative aspects, the first environment condition may include a first temperature, and the second environment condition may include a second temperature different from the first temperature, e.g., as described below.

In other aspects, the first and second environment conditions may include any other environment conditions.

In some demonstrative aspects, controller 824 may be configured to determine an update factor based, for example, on a frequency of the LO 822 at the second environment condition, e.g., as described below.

In some demonstrative aspects, controller 824 may be configured to determine an update factor based, for example, on the frequency of the LO 822 at the second environment condition, and a frequency in mapping information, e.g., in the LUT 807, corresponding to an LO setting of the LO 822 at the second environment condition, e.g., as described below.

In some demonstrative aspects, controller 824 may be configured to determine the update factor based, for example, on a division of the frequency of the LO 822 at the second environment condition by the frequency in mapping information, e.g., in the LUT 807, corresponding to the LO setting of the LO 822 at the second environment condition, e.g., as described below. In other aspects, controller 824 may be configured to determine the update factor based on any additional or alternative calculation and/or parameter.

In some demonstrative aspects, controller 824 may be configured to determine a factored required frequency, for example, based on the required frequency and the update factor, e.g., as described below.

In some demonstrative aspects, controller 824 may be configured to determine the factored required frequency, for example, based on a division of the required LO frequency by the update factor, e.g., as described below. In other aspects, controller 824 may be configured to determine the factored required frequency based on any additional or alternative calculation and/or parameter.

In some demonstrative aspects, controller 824 may be configured to access the mapping information, e.g., in LUT 807, with the factored required frequency, for example, to retrieve an LO setting corresponding to the required frequency, e.g., as described below.

In some demonstrative aspects, controller 824 may be configured to set the LO 822 according to the LO setting corresponding to the required frequency, e.g., as described below.

In some demonstrative aspects, controller 824 may be configured to set the LO 822 by setting a capacitance of the LO 822, for example, based on the LO setting corresponding to the required frequency, e.g., as described below.

In some demonstrative aspects, controller 824 may be configured to determine a CT frequency setting and/or a FT frequency setting, for example, based on the factored required frequency, e.g., as described below.

In some demonstrative aspects, controller 824 may be configured to set the LO 822, for example, based on the CT frequency setting and/or the FT frequency setting, e.g., as described below.

In some demonstrative aspects, controller 824 may be configured to determine the CT frequency setting, for example, by accessing the mapping information, e.g., in LUT 807, with the factored required frequency, e.g., as described below.

In some demonstrative aspects, controller 824 may be configured to determine the FT frequency setting, for example, based on a difference between the factored required frequency and a frequency in mapping information, e.g., in the LUT 807, corresponding to the CT frequency setting, e.g., as described below.

In some demonstrative aspects, controller 824 may be configured to determine the frequency of the LO 822 at the second environment condition, e.g., as described below.

In some demonstrative aspects, controller 824 may be configured to determine the frequency of the LO 822 at the second environment condition, for example, based on a frequency of the LO, for example, at a locked state of the PLL 820, e.g., as described below.

In some demonstrative aspects, PLL controller 824 may be configured to determine the frequency of the LO 822 at the second environment condition, for example, based on a frequency measurement of the LO 822, for example, at a non-locked state of the PLL 820, e.g., as described below.

In some demonstrative aspects, a frequency of LO 822, denoted f may be defined, e.g., as follows:

$$f = \frac{1}{2\pi\sqrt{LC}} \quad (8)$$

wherein L denotes an induction of LO 822, and C denotes a capacitance of LO 822.

In one example, the frequency of oscillations may be tuned, for example, by changing the effective capacitance C. According to this example, a variable frequency of oscillations, denoted f(x) for a first order capacitance dependence may be defined, e.g., as follows:

$$f(x) = \frac{1}{2\pi\sqrt{L(C_0 + x\Delta C)}} \quad (9)$$

In some demonstrative aspects, Equation 9 may be rewritten, e.g., as follows:

$$f(x) = \underbrace{\frac{1}{2\pi\sqrt{LC_0}}}_{f_0} \cdot \frac{1}{\sqrt{1+x\frac{\Delta C}{C_0}}} = \frac{f_0}{\sqrt{1+x\frac{\Delta C}{C_0}}} \quad (10)$$

In some demonstrative aspects, as shown by Equation 10, when environmental mechanisms may affect changes in $\Delta C$ and $C_0$ in a similar manner, their influence will cancel out, e.g., due to the ratiometric nature of Equation 10. Accordingly, dependence of the oscillation frequency on environment changes may be captured, e.g., even fully captured, by the parameter $f_0$. This behavior has also been demonstrated experimentally.

In some demonstrative aspects, Equation 10 may be rewritten, e.g., as follows, for example, by using an environmental variable, denoted T, for the temperature, and denoting the capacitance ratio $$\frac{\Delta C}{C_0}$$

by 2c, which may be void by temperature dependence:

$$f(x, T) = \frac{f_0(T)}{\sqrt{1+2cx}} \quad (11)$$

In some demonstrating aspects, frequency measurements at first and second temperatures may be used to deduce a frequency of LO 822 at the second temperature. For example, a frequency, denoted $f_0(T_2)$ of LO 822 at the second temperature may be deduced by juxtaposing two frequency measurements, e.g., a first measurement at a first temperature, denoted $T_1$, and a second measurement at a second temperature, denoted $T_2$, e.g., as descried below.

In some demonstrative aspects, an update factor, denoted u, may be determined, for example, based on the frequency $f_0(T_2)$ of LO 822 at the second temperature, and the LO settings of LO 822 at the first temperature, e.g., as follows:

$$\frac{f(x, T_2)}{f(x, T_1)} = \frac{f_0(T_2)}{\sqrt{1+2cx}} \cdot \frac{\sqrt{1+2cx}}{f_0(T_1)} = \frac{f_0(T_2)}{f_0(T_1)} \equiv u \quad (12)$$

In some demonstrative aspects, the LO settings of LO 822 at the first temperature $T_1$ may be updated for the second temperature $T_2$, for example, based on the update factor u. In some demonstrative aspects, the updated LO setting of LO 822 may be applied to LO 822, which may have several layers of frequency control mechanisms, e.g., the CT and FT settings, for example, assuming the mechanisms possess similar environmental influence.

In some demonstrative aspects, calibration of the mapping information, e.g., in LUT 807, may take place at initialization, e.g., upon power-up of radar front end 804, and/or at any other time. In some demonstrative aspects, the one or more values of the mapping information, e.g., in LUT 807, may be initialized and/or updated, for example, periodically, non-periodically, on the fly, e.g., in real time, and/or according to any other initialization and/or updating scheme.

Some demonstrative aspects are described herein with respect to calibrating and/or setting a Digitally Controlled Oscillator (DCO), e.g., LO 822, using mapping information, e.g., in LUT 807, as described herein. In other aspects, the LO may include any other types of LO.

For example, due to abundant LO control methods, e.g., ranging from purely digital to purely analog, and their realizations, a unified characterization procedure may be hard to be defined. Accordingly, the DCO, which is widely employed, may be addressed, while some generalizations may be applied for different treatment of other LO types. These generalizations may be possible but may come at a price of increased mathematical calculations and therefore computational complexity.

In some demonstrative aspects, a small relative bandwidth approximation (c<<1) within each sub-band may be employed, for example, for ease of formulation, to provide the following frequency dependence:

$$f(T, b, x) = \frac{f_0(T, b)}{\sqrt{1 + 2cx}} \cong f_0(T, b) - f_0(T, b) \cdot c \cdot x \quad (13)$$

wherein, $f_0(T, B)$ denotes a frequency attained at CT=b and FT=x=0, which may be normalized and centered, e.g., ~[−0.5, 0.5].

In one example, $K_{lin}(T, b)$ may be defined as $-f_0(T, B) \cdot c$. According to this example, precalibrated mapping information, for example, in the form of a precalibrated LUT, may be defined, e.g., as follows:

TABLE 1

| CT = B | $K_{lin}$ | $f_0$ |
|---|---|---|
| 0 | $K_{lin}$ (T, 0) | $f_0$(T, 0) |
| 1 | $K_{lin}$ (T, 1) | $f_0$(T, 1) |
| 2 | $K_{lin}$ (T, 2) | $f_0$(T, 2) |
| . | . | . |
| . | . | . |
| NCT − 2 | $K_{lin}$ (T, NCT − 2) | $f_0$(T NCT − 2) |
| NCT − 1 | $K_{lin}$ (T, NCT − 1) | $f_0$(T NCT − 1) |

In another example, any other mapping information and/or LUT may be defined.

In some demonstrative aspects, at least two measurements may be utilized, for example, to estimate $K_{lin}$ (T, b) and $f_0$(T, B), for example, in order to capture a linear behavior of LO 822.

In some demonstrative aspects, the two measurements may be made at CT=b=0 and x=∓¼, for example, to overemphasize the effect of matrix fringes.

In some demonstrative aspects, the results of the two measurements (f(b,−¼) and f(b,¼)) may be used, for example, to estimate $K_{lin}$(T, b) and/or $f_0$(T, B).

In some demonstrative aspects, for a nonlinear behavior, which may be displayed by one or more other frequency control schemes, e.g., such as varactors, a degree of the polynomial may rise, and more characterization measurements, e.g., more than two measurements, may be required.

In some demonstrative aspects, two respective values representing the CT settings at the two measurements may be stored, for example, for future access to the mapping information, e.g., in the LUT 807.

Figure 27:
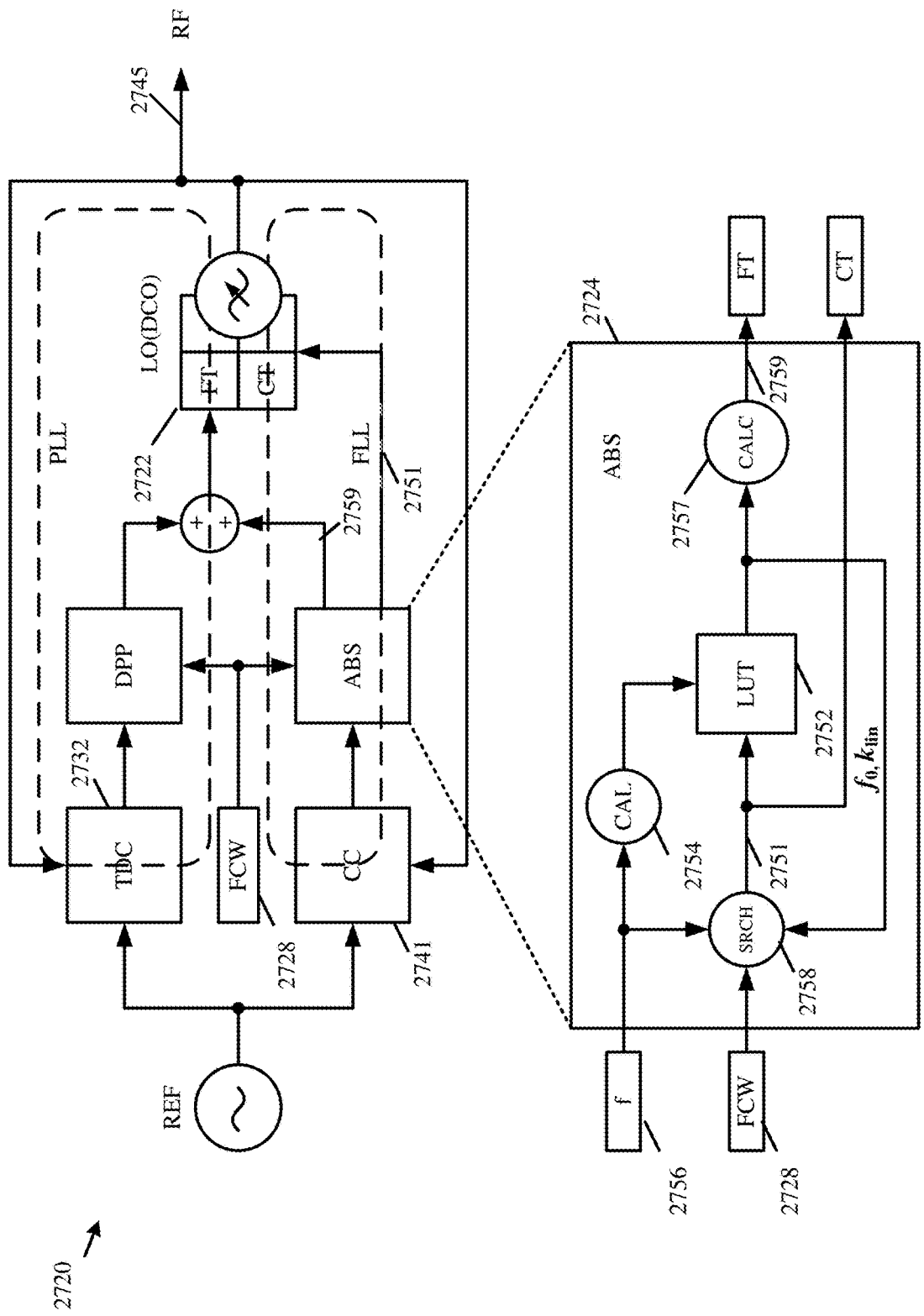
FIG. 27 is a schematic illustration of a PLL, in accordance with some demonstrative aspects.

Reference is made to FIG. 27, which schematically illustrates a PLL 2720, in accordance with some demonstrative aspects. For example, PLL 820 (FIG. 8) may include one or more elements of PLL 2720, and/or may perform one or more operations of, and/or one or more functionalities of, PLL 2720.

In some demonstrative aspects, as shown in FIG. 27, PLL 2720 may be configured to provide a frequency signal 2745, for example, to one or more RF chains, for example, Tx chains 810 (FIG. 8) and/or Rx chains 812 (FIG. 8).

In some demonstrative aspects, as shown in FIG. 27, PLL 2720 may include an LO 2722, e.g., a DCO, operated according to a CT setting and FT setting. For example, LO 822 (FIG. 8) may include one or more elements of LO 2722, and/or may perform one or more operations of, and/or one or more functionalities of, LO 2722.

In some demonstrative aspects, as shown in FIG. 27, PLL 2720 may include an ABS 2724 configured to control an LO setting of LO 2722. For example, controller 824 (FIG. 8) may include one or more elements of ABS 2724, and/or may perform one or more operations of, and/or one or more functionalities of, ABS 2724.

In some demonstrative aspects, as shown in FIG. 27, ABS 2724 may store mapping information, e.g., in the form of a LUT 2752, to map a plurality of LO frequencies to a respective plurality of LO settings of LO 2722, e.g., at a first environment condition. For example, the first environmental condition may include an environmental condition at a time of calibrating, initializing and/or updating the mapping information, e.g., in LUT 2752.

In some demonstrative aspects, as shown in FIG. 27, ABS 2724 may include a calibrator 2754 configured to calibrate a mapping of the plurality of LO frequencies to the plurality of LO settings in the LUT 2752, for example, upon initialization of the LO 2722, and/or at any other timing.

In some demonstrative aspects, calibrator 2754 may calibrate the mapping information, e.g., in the LUT 2752, for example, based on frequency measurements of an LO frequency 2756, for example, by a CC 2741, and/or by a TDC 2732.

In some demonstrative aspects, as shown in FIG. 27, PLL 2720 may include a Frequency Control Word (FCW) provider 2728 configured to designate a required frequency to the ABS 2724.

In some demonstrative aspects, ABS 2724 may be configured to perform a search 2758, e.g., a binary search, in LUT 2752, for example, to search for a suitable pair of values ($f_0$, $k_{lin}$) corresponding to the required frequency, for example, as provided by FCW 2728 to ABS 2724.

In some demonstrative aspects, ABS 2724 may be configured to determine the frequency of the LO 2722 at a second environment condition, e.g., an environmental condition at a time the required frequency is provided.

In some demonstrative aspects, ABS 2724 may be configured to determine the frequency of the LO 2722 at the second environment condition, for example, based on a frequency of the LO 2722 at a locked state of PLL 2720, e.g., when the PLL 2720 is at the locked state at the time the required frequency is provided.

In some demonstrative aspects, ABS 2724 may be configured to determine the frequency of the LO 2722 at the second environment condition, for example, based on a frequency measurement of the LO 2722, at a non-locked state of PLL 2720, e.g., when the PLL 2720 is not at the locked state at the time the required frequency is provided.

In some demonstrative aspects, ABS 2724 may be configured to determine an update factor, e.g., the update factor u, for example, based on the determined frequency of the LO 2722.

In some demonstrative aspects, ABS 2724 may be configured to determine a factored required frequency, for example, based on the update factor and the required frequency from FCW provider 2728.

In some demonstrative aspects, ABS 2724 may be configured to access the mapping information, e.g., in the LUT 2725, with the factored required frequency, for example, to cast the required frequency from FCW provider 2728 into an LUT temperature domain.

In some demonstrative aspects, the search 2758 may find a suitable CT setting 2751, e.g., a band number and values ($f_0$, $k_{\_lin}$) corresponding to the band.

In some demonstrative aspects, ABS 2724 may include an FT calculator 2757 configured to calculate an FT setting 2759, for example, based on the values ($f_0$, $k_{\_lin}$).

In some demonstrative aspects, ABS 2724 may be configured to set the LO 2722 to the required frequency, for example, by applying the CT setting 2751 and the FT setting 2759 to LO 2722.

Figure 28:
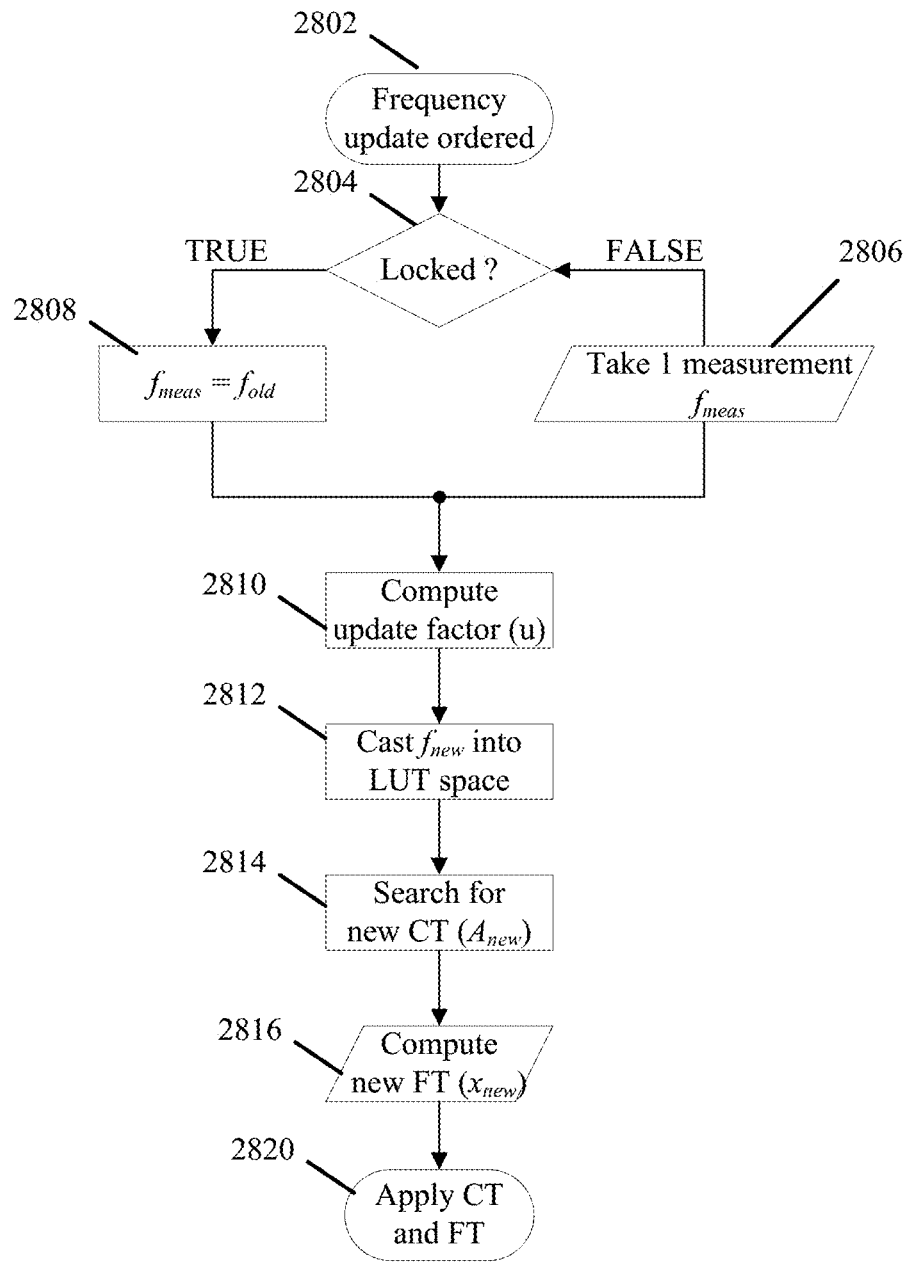
FIG. 28 is a schematic illustration of a method of setting a Local Oscillator (LO) to a required LO frequency, in accordance with some demonstrative aspects.

Reference is made to FIG. 28, which schematically illustrates a method of controlling setting of an LO to a required LO frequency. For example, one or more of the operations of the method of FIG. 28 may be performed by one or more elements of a radar frontend, e.g., radar frontend 804, a controller, e.g., controller 824 (FIG. 8), or ABS 2724 (FIG. 27), a PLL, e.g., PLL 820 (FIG. 8), and/or an LO, e.g., LO 822 (FIG. 8).

In some demonstrative aspects, as indicated at block 2802, the method may include processing a re-lock request to request locking to a new required frequency. For example, controller 824 (FIG. 8) may process a re-lock request, e.g., from FCW 2728 (FIG. 27), to request to lock LO 822 (FIG. 8) to a new required frequency, e.g., as described above.

In some demonstrative aspects, as indicated at block 2804, the method may include determining a lock state of a PLL. For example, controller 824 (FIG. 8) may be configured to determine whether or not PLL 820 (FIG. 8) is at a locked state, e.g., as described above.

In some demonstrative aspects, as indicated at block 2806, the method may include performing a measurement, e.g., even a single measurement, to detect a frequency of the LO, for example, when the PLL is not at the locked state. For example, controller 824 (FIG. 8) may be configured to perform a frequency measurement at a known CT setting b and FT setting x, which may result with a (b, x, $f_{meas}$) triad, for example, when PLL 820 (FIG. 8) is not locked.

In some demonstrative aspects, as indicated at block 2808, the method may include determining the frequency of the LO, for example, when the PLL is at the locked state. For example, controller 824 (FIG. 8) may be configured to determine the frequency of LO 822 (FIG. 8), for example, based on a current frequency of PLL 820 (FIG. 8) when PLL 820 (FIG. 8) is locked, e.g., as described above.

In one example, the triad (b, x, $f_{meas}$) may be known, for example, when the PLL 820 (FIG. 8) is locked, for example, as the frequency measurement may be equal to the defined frequency, e.g., $f_{meas}=f_{old}$.

In some demonstrative aspects, as indicated at block 2810, the method may include determining an update factor, for example, based on the required frequency and the determined frequency of the LO 822 (FIG. 8). For example, controller 824 (FIG. 8) may be configured to determine the update factor u, e.g., as described above.

In one example, the update factor may be determined, for example, based on Equation 12, for example, by dividing the measured or known frequency $f_{meas}$ by the frequency computed from the mapping information, e.g., in the LUT 807 (FIG. 8), denoted $f_{LUT}$, having a same CT setting b and FT setting x, e.g., as follows:

$$u = \frac{f_{meas}}{f_{LUT}} = \frac{f(T_2, b, x)}{f(T_1, b, x)} \tag{14}$$

In some demonstrative aspects, as indicated at block 2812, the method may include determining a factored required frequency. For example, controller 824 (FIG. 8) may be configured to determine the factored required frequency corresponding to the required frequency, for example, based on the determined update factor, e.g., as described above.

In one example, controller 824 (FIG. 8) may be configured to determine the factored required frequency, denoted $f_{new}(T1)$, for example, by dividing the required frequency, denoted $f_{new}(T2)$, by the update factor, e.g., as follows:

$$f_{new}(T_1) = \frac{f_{new}(T_2)}{u} \tag{15}$$

In some demonstrative aspects, controller 824 (FIG. 8) may be configured to determine the setting of the LO 822 (FIG. 2) by accessing the mapping information, e.g., in the LUT 807 (FIG. 8), with the factored required frequency, e.g., without needing to update the entire mapping information, e.g., in LUT 807 (FIG. 8), for the new environmental conditions.

For example, casting the required frequency at the new conditions $f_{new}$ (T2) into the conditions which existed at the time of calibration of LO 822, e.g., the time T1, may be achieved by dividing the required frequency by the update factor u, e.g., as described above.

In some demonstrative aspects, as indicated at block 2814, the method may include accessing the mapping information, e.g., in the LUT, to determine a CT setting. For example, controller 824 (FIG. 8) may be configured to access the mapping information, e.g., in the LUT 2752 (FIG. 27), to determine the CT setting corresponding to the required frequency, e.g., as described above.

In one example, controller 824 (FIG. 8) may be configured to access the mapping information, e.g., in the LUT 807 (FIG. 8), for example, to find a best suited CT setting ("new CT setting"), denoted $b_{new}$, with the factored required frequency in the environment. For example, controller 824 (FIG. 8) may be configured to determine the CT setting 2751 (FIG. 27).

In some demonstrative aspects, as indicated at block 2816, the method may include determining a FT setting. For example, controller 824 (FIG. 8) may be configured to determine the FT setting 2759 (FIG. 27) corresponding to the required frequency.

In one example, controller 824 (FIG. 8) may be configured to determine the FT setting, denoted $x_{new}$, for example, based on a difference between a frequency in the mapping information, e.g., in the LUT, denoted $f_0(T1,b_{new})$, e.g., corresponding to the best suited CT setting $b_{new}$, and the factored required frequency $f_{new}(T1)$, e.g., as follows:

$$x_{new} = \frac{1}{k_{lin}(T_1, b_{new})} \cdot [f_{new}(T_1) - f_0(T_1, b_{new})] \tag{16}$$

In some demonstrative aspects, as indicated at block 2820, the method may include applying the new CT setting and the new FT setting to set the LO to the required frequency. For example, controller 824 (FIG. 8) may be configured to apply the new CT setting 2751 (FIG. 27) and the new FT setting 2759 (FIG. 27) to set LO 822 (FIG. 8) to the required frequency.

Figure 29:
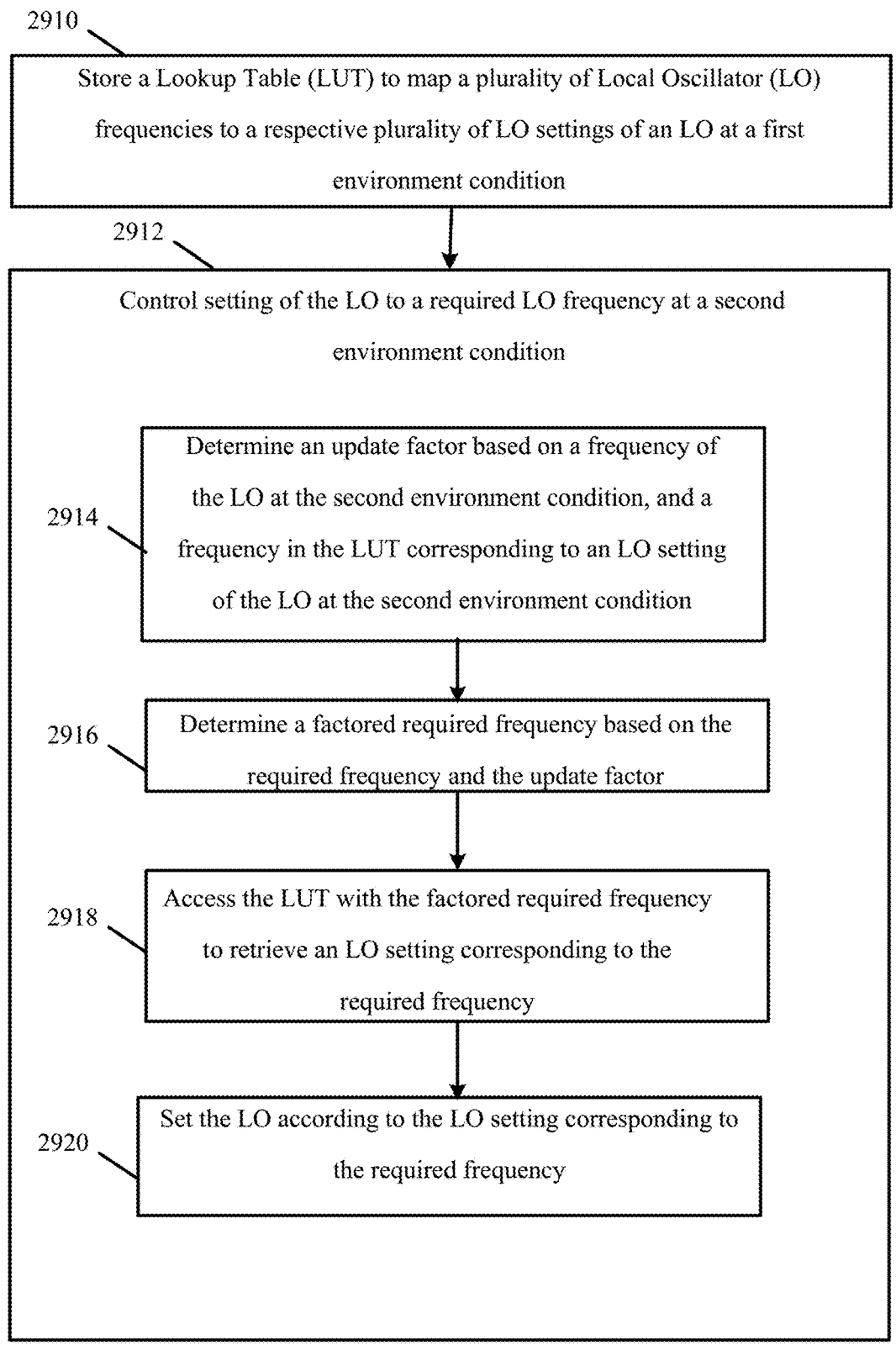
FIG. 29 is a schematic illustration of a method of setting an LO, in accordance with some demonstrative aspects.

Reference is made to FIG. 29, which schematically illustrates a method of setting an LO, in accordance with some demonstrative aspects. For example, one or more of the operations of the method of FIG. 29 may be performed by one or more elements of a radar frontend, e.g., radar frontend 804, a controller, e.g., controller 824 (FIG. 8), a PLL, e.g., PLL 820 (FIG. 8), an ABS, e.g., ABS 2724 (FIG. 27), and/or an LO, e.g., LO 822 (FIG. 8).

As indicated at block 2910, the method may include storing mapping information, e.g., in a LUT, to map a plurality of LO frequencies to a respective plurality of LO settings of an LO at a first environment condition. For example, PLL 820 (FIG. 8) may store LUT 807 (FIG. 8) to map a plurality of LO frequencies to a respective plurality of LO settings of LO 822 (FIG. 8) at a first environment condition, e.g., as described above.

As indicated at block 2912, the method may include controlling setting of the LO to a required LO frequency at a second environment condition. For example, controller 824 (FIG. 8) may control the setting of the LO 822 (FIG. 8) to the required LO frequency at the second environment condition, e.g., as described above.

As indicated at block 2914, controlling setting of the LO to the required LO frequency at the second environment condition may include determining an update factor, for example, based on a frequency of the LO at the second environment condition, and a frequency in the mapping information, e.g., in the LUT, corresponding to an LO setting of the LO at the second environment condition. For example, controller 824 (FIG. 8) may determine the update factor based on the frequency of the LO 822 (FIG. 8) at the second environment condition, and the frequency in the LUT 807 (FIG. 8) corresponding to the LO setting of the LO 822 (FIG. 8) at the second environment condition, e.g., as described above.

As indicated at block 2916, controlling setting of the LO to the required LO frequency at the second environment condition may include determining a factored required frequency, for example, based on the required frequency and the update factor. For example, controller 824 (FIG. 8) may determine the factored required frequency based on the required frequency and the update factor, e.g., as described above.

As indicated at block 2918, controlling setting of the LO to the required LO frequency at the second environment condition may include accessing the mapping information, e.g., in the LUT, with the factored required frequency to retrieve an LO setting corresponding to the required frequency. For example, controller 824 (FIG. 8) may access the LUT 8078 (FIG. 8) with the factored required frequency to retrieve the LO setting corresponding to the required frequency, e.g., as described above.

As indicated at block 2920, controlling setting of the LO to the required LO frequency at the second environment condition may include setting the LO according to the LO setting corresponding to the required frequency. For example, controller 824 (FIG. 8) may set the LO 822 (FIG. 8) according to the LO setting corresponding to the required frequency, e.g., as described above.

Figure 30:
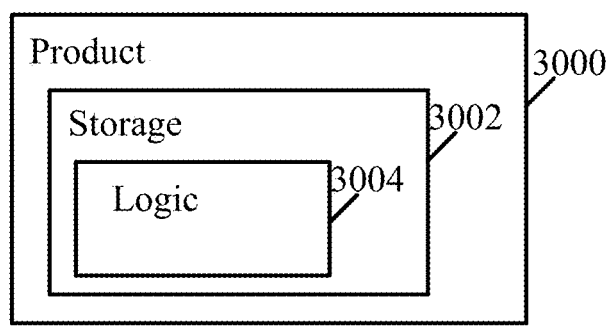
FIG. 30 is a schematic illustration of a product of manufacture, in accordance with some demonstrative aspects.

Reference is made to FIG. 30, which schematically illustrates a product of manufacture 3000, in accordance with some demonstrative aspects. Product 3000 may include one or more tangible computer-readable ("machine-readable") non-transitory storage media 3002, which may include computer-executable instructions, e.g., implemented by logic 3004, operable to, when executed by at least one computer processor, enable the at least one computer processor to implement one or more operations and/or functionalities described with reference to the FIGS. 1, 2, 3, 4, 5, 6, 7, 8, 9, 10, 11, 12, 13, 14, 15, 16, 17, 18, 19, 20, 21, 22, 23, 24, 25, 26, 27, 28, and/or 29, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative aspects, product 3000 and/or storage media 3002 may include one or more types of computer-readable storage media capable of storing data, including volatile memory, non-volatile memory, removable or non-removable memory, erasable or non-erasable memory, writeable or re-writeable memory, and the like. For example, storage media 3002 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative aspects, logic 3004 may include instructions, data, and/or code, which, if executed by a machine, may cause the machine to perform a method, process, and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative aspects, logic 3004 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner, or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

Examples

The following examples pertain to further aspects.

Example 1 includes an apparatus comprising a Receive (Rx) chain comprising a multi-core Low Noise Amplifier (LNA) configured to provide an amplified Radio-Frequency (RF) signal at an output node based on an input RF signal at an input node, the multi-core LNA comprising a plurality of LNA cores connected in parallel between the input node and the output node, the plurality of LNA cores comprising a first LNA core comprising a first LNA core input connected to the input node and a first LNA core output connected to the output node, the first LNA core biased by a first bias voltage; and a second LNA core comprising a second LNA core input connected to the input node and a second LNA core output connected to the output node, the second LNA core biased by a second bias voltage different from the first bias voltage, wherein at least one of the first bias voltage or the second bias voltage is based on a Baseband (BB) signal, the BB signal is based on the amplified RF signal.

Example 2 includes the subject matter of Example 1, and optionally, wherein the Rx chain comprises a mixer and BB circuitry, and wherein a total Output Intercept Point of an n-th order (OIPn) of Rx chain elements comprising the multi-core LNA, the mixer and the BB circuitry, is greater than an OIPn of the Rx chain elements excluding the multi-core LNA.

Example 3 includes the subject matter of Example 1 or 2, and optionally, wherein the Rx chain comprises a mixer and BB circuitry, and wherein a total Output Intercept Point of an n-th order (OIPn) of Rx chain elements comprising the multi-core LNA, the mixer and the BB circuitry, is greater than an OIPn of the multi-core LNA.

Example 4 includes the subject matter of any one of Examples 1-3, and optionally, wherein the first bias voltage and the second bias voltage are configured based on one or more Inter-Modulation (IM) products of BB circuitry of the Rx chain.

Example 5 includes the subject matter of Example 4, and optionally, wherein the IM products comprise third order IM (IM3) products.

Example 6 includes the subject matter of any one of Examples 1-5, and optionally, comprising a controller configured to adaptively calibrate at least one of the first bias voltage or the second bias voltage based on the BB signal.

Example 7 includes the subject matter of Example 6, and optionally, wherein the controller is configured to calibrate at least one of the first bias voltage or the second bias voltage based on a total Output Intercept Point of an n-th order (OIPn) of Rx chain elements comprising the multi-core LNA, a mixer, and BB circuitry.

Example 8 includes the subject matter of Example 7, and optionally, wherein the controller is configured to calibrate at least one of the first bias voltage or the second bias voltage to maximize the OIPn of the Rx chain elements.

Example 9 includes the subject matter of any one of Examples 1-8, and optionally, wherein the input RF signal comprises a radar signal.

Example 10 includes the subject matter of Example 9, and optionally, comprising a radar, the radar comprising a plurality of antennas connected to a plurality of Rx chains and a plurality of Transmit (Tx) chains, and a processor to generate radar information based on radar signals transmitted via the plurality of Tx chains and received via the plurality of Rx chains.

Example 11 includes the subject matter of Example 10, and optionally, comprising a vehicle, the vehicle comprising the radar, and a system controller to control one or more systems of the vehicle based on the radar information.

Example 12 includes a radar device comprising a plurality of antennas; a plurality of Tx chains; a plurality of Rx chains, the plurality of Rx chains comprising the Rx chain of any one of Examples 1-8; and a processor to generate radar information based on radar signals communicated by the plurality of Tx chains and the plurality of Rx chains via the plurality of antennas.

Example 13 includes a vehicle comprising the radar device of Example 12; and a system controller configured to control one or more vehicular systems of the vehicle based on the radar information.

Example 14 includes an apparatus comprising a circular multi-core oscillator comprising a plurality of linearized transconductance oscillator cores, a linearized transconductance oscillator core comprising a plurality of transistors; a ground resonator connected between sources of the plurality of transistors and a common ground node to which a plurality of ground resonators of the plurality of linearized transconductance oscillator cores are connected; an Inductor (L) choke (Lchoke) to provide Direct Current (DC) bias to drains of the plurality of transistors; and an Inductor Capacitor (C) (LC) tank connected to gates of the plurality of transistors, the LC tank comprising a Ctank and an Ltank, wherein a plurality of Ltanks of the plurality of linearized transconductance oscillator cores are serially coupled to form a circular resonator to inductively couple the plurality of linearized transconductance oscillator cores.

In one example, the apparatus of Example 14 may include, for example, one or more additional elements, for example, as described with respect to Examples 1, 30, 49 and/or 62.

Example 15 includes the subject matter of Example 14, and optionally, wherein the plurality of linearized transconductance oscillator cores are coupled to a respective plurality of power supplies, wherein an Lchoke of a first linearized transconductance oscillator core is connected to a first power supply of the plurality of power supplies, and an Lchoke of a second linearized transconductance oscillator core is connected to a second power supply of the plurality of power supplies.

Example 16 includes the subject matter of Example 15, and optionally, wherein the plurality of power supplies comprises a respective plurality of Low-Dropout (LDO) Regulators.

Example 17 includes the subject matter of any one of Examples 14-16, and optionally, wherein the linearized transconductance oscillator core comprises a voltage divider configured to divide a voltage of the Lchoke between the plurality of transistors.

Example 18 includes the subject matter of Example 17, and optionally, wherein the linearized transconductance oscillator core comprises a first node to connect the Lchoke to a drain of a first transistor of the plurality of transistors, and a second node to connect the Lchoke to a drain of a second transistor of the plurality of transistors, and wherein the voltage divider comprises a first capacitor connected between the first node and a gate of the second transistor, and a second capacitor connected between the second node and a gate of the first transistor.

Example 19 includes the subject matter of Example 18, and optionally, wherein the voltage divider comprises a plurality of capacitors connected in series between the first node and the second node.

Example 20 includes the subject matter of any one of Examples 14-19, and optionally, wherein the plurality of transistors comprises a first transistor and a second transistor, a gate of the first transistor is connected to a first node of the LC tank, and a gate of the second transistor is connected to a second node of the LC tank.

Example 21 includes the subject matter of any one of Examples 14-20, and optionally, wherein the plurality of linearized transconductance oscillator cores comprises a respective plurality of outputs, the plurality of outputs to output a respective plurality of electronic signals having a same phase, wherein an output of the linearized transconductance oscillator core is connected to the gates of the plurality of transistors.

Example 22 includes the subject matter of any one of Examples 14-21, and optionally, wherein the circular resonator surrounds the plurality of ground resonators.

Example 23 includes the subject matter of any one of Examples 14-22, and optionally, wherein the ground resonator comprises a folded common mode resonator.

Example 24 includes the subject matter of any one of Examples 12-23, and optionally, wherein the ground resonator is configured to trap a second harmonic of the LC tank.

Example 25 includes the subject matter of any one of Examples 14-24, and optionally, wherein the Ctank comprises a Coarse Tune (CT) capacitor and a Fine Tune (FT) capacitor.

Example 26 includes the subject matter of any one of Examples 14-25, and optionally, wherein the circular multi-core oscillator comprises a quad-core circular oscillator comprising four linearized transconductance oscillator cores.

Example 27 includes the subject matter of any one of Examples 14-26, and optionally, comprising a Phase Locked Loop (PLL) comprising the circular multi-core oscillator.

Example 28 includes the subject matter of Example 27, and optionally, comprising a radar, the radar comprising a plurality of antennas connected to a plurality of RF chains, and a processor to generate radar information based on radar signals communicated by the plurality of RF chains via the plurality of antennas based on a frequency of the circular multi-core oscillator.

Example 29 includes the subject matter of Example 28, and optionally, comprising a vehicle, the vehicle comprising the radar, and a system controller to control one or more systems of the vehicle based on the radar information.

Example 30 includes an apparatus comprising a direct-conversion Receive (Rx) chain configured to down-convert an Rx Radio-Frequency (RF) signal into an Rx Baseband (BB) signal, the direct-conversion Rx chain comprising an active mixer configured to down-convert the Rx RF signal into the Rx BB signal based on a Local Oscillator (LO) signal, the active mixer comprising a first mixer input to receive the Rx RF signal; a second mixer input to receive the LO signal; and a mixer output to provide the Rx BB signal.

In one example, the apparatus of Example 30 may include, for example, one or more additional elements, for example, as described with respect to Examples 1, 14, 49 and/or 62.

Example 31 includes the subject matter of Example 30, and optionally, wherein the active mixer is biased to consume current from a Direct Current (DC) supply.

Example 32 includes the subject matter of Example 31, and optionally, wherein the active mixer is configured to provide the Rx BB signal biased with the current from the DC supply.

Example 33 includes the subject matter of any one of Examples 30-32, and optionally, wherein the active mixer comprises a Gilbert-cell mixer.

Example 34 includes the subject matter of any one of Examples 30-33, and optionally, wherein the active mixer comprises a dual complementary mixer core comprising first and second complementary mixer cores.

Example 35 includes the subject matter of any one of Examples 30-34, and optionally, wherein the active mixer comprises an N-type Metal-Oxide-Semiconductor (NMOS) mixer core, and a P-type Metal-Oxide-Semiconductor (PMOS) mixer core.

Example 36 includes the subject matter of Example 35, and optionally, wherein the NMOS mixer core comprises a first NMOS mixer input coupled to the first mixer input, a second NMOS mixer input coupled to the second mixer input, and an NMOS mixer output coupled to the mixer output; and wherein the PMOS mixer core comprises a first PMOS mixer input coupled to the first mixer input, a second PMOS mixer input coupled to the second mixer input, and a PMOS mixer output coupled to the mixer output.

Example 37 includes the subject matter of Example 36, and optionally, comprising a first input transformer to transfer the Rx RF signal to the first NMOS input and the first PMOS input, and a second input transformer to transfer the LO signal to the second NMOS input and the second PMOS input.

Example 38 includes the subject matter of any one of Examples 35-37, and optionally, wherein the NMOS mixer core is biased with an NMOS bias, and the PMOS mixer core is biased with a PMOS bias.

Example 39 includes the subject matter of Example 38, and optionally, wherein the NMOS bias is different from the PMOS bias.

Example 40 includes the subject matter of Example 38 or 39, and optionally, wherein the NMOS bias and the PMOS bias are configured based on a predefined bias of the Rx BB signal.

Example 41 includes the subject matter of any one of Examples 38-40, and optionally, wherein the NMOS bias and the PMOS bias are configured based on a predefined current flow from a Direct Current (DC) supply via the active mixer.

Example 42 includes the subject matter of any one of Examples 30-41, and optionally, wherein the active mixer comprises a single-sideband mixer.

Example 43 includes the subject matter of any one of Examples 30-41, and optionally, wherein the active mixer comprises a dual-sideband mixer.

Example 44 includes the subject matter of any one of Examples 30-43, and optionally, comprising one or more RF elements to provide the Rx RF signal based on a signal received by an antenna, and BB circuitry to process the Rx BB signal.

Example 45 includes the subject matter of any one of Examples 30-44, and optionally, wherein the LO signal has a frequency of at least 30 Gigahertz (GHz).

Example 46 includes the subject matter of any one of Examples 30-45, and optionally, wherein the RF signal comprises a radar signal.

Example 47 includes the subject matter of Example 46, and optionally, comprising a radar, the radar comprising a plurality of antennas connected to a plurality of Rx chains and a plurality of Transmit (Tx) chains, and a processor to generate radar information based on radar signals transmitted via the plurality of Tx chains and received via the plurality of Rx chains, wherein an Rx chain of the plurality of Rx chains comprises the direct-conversion Rx chain.

Example 48 includes the subject matter of Example 47, and optionally, comprising a vehicle, the vehicle comprising the radar, and a system controller to control one or more systems of the vehicle bases on the radar information.

Example 49 includes an apparatus comprising a memory to store mapping information, e.g., in a Lookup Table (LUT), to map a plurality of Local Oscillator (LO) frequencies to a respective plurality of LO settings of an LO at a first environment condition; a controller configured to control setting of the LO to a required LO frequency at a second environment condition, the controller configured to: determine an update factor based on a frequency of the LO at the second environment condition, and a frequency in the mapping information, e.g., in the LUT, corresponding to an LO setting of the LO at the second environment condition; determine a factored required frequency based on the required frequency and the update factor; access the mapping information, e.g., in the LUT, with the factored required frequency to retrieve an LO setting corresponding to the required frequency; and set the LO according to the LO setting corresponding to the required frequency.

In one example, the apparatus of Example 49 may include, for example, one or more additional elements, for example, as described with respect to Examples 1, 14, 30, and/or 62.

Example 50 includes the subject matter of Example 49, and optionally, wherein the controller is configured to determine the update factor based on a division of the frequency of the LO at the second environment condition by the frequency in the mapping information, e.g., in the LUT, corresponding to the LO setting of the LO at the second environment condition.

Example 51 includes the subject matter of Example 49 or 50, and optionally, wherein the controller is configured to determine the factored required frequency based on a division of the required LO frequency by the update factor.

Example 52 includes the subject matter of any one of Examples 49-51, and optionally, wherein the controller is configured to determine a Coarse Tune (CT) frequency setting and a Fine-Tune (FT) frequency setting based on the factored required frequency, and to set the LO based on the CT frequency setting and the FT frequency setting.

Example 53 includes the subject matter of Example 52, and optionally, wherein the controller is configured to determine the CT frequency setting by accessing the mapping information, e.g., in the LUT, with the factored required frequency, and to determine the FT frequency setting based on a difference between the factored required frequency and a frequency in the mapping information, e.g., in the LUT, corresponding to the CT frequency setting.

Example 54 includes the subject matter of any one of Examples 49-53, and optionally, wherein the controller is configured to determine the frequency of the LO at the second environment condition based on a frequency of the LO at a locked state of a Phase Locked Loop (PLL) comprising the LO.

Example 55 includes the subject matter of any one of Examples 49-53, and optionally, wherein the controller is configured to determine the frequency of the LO at the second environment condition based on a frequency measurement of the LO at a non-locked state of a Phase Locked Loop (PLL) comprising the LO.

Example 56 includes the subject matter of any one of Examples 49-55, and optionally, wherein the controller is configured to set the LO by setting a capacitance of the LO based on the LO setting corresponding to the required frequency.

Example 57 includes the subject matter of any one of Examples 49-56, and optionally, wherein the controller is configured to calibrate a mapping of the plurality of LO frequencies to the plurality of LO settings, e.g., in the LUT, upon initialization of the LO.

Example 58 includes the subject matter of any one of Examples 49-57, and optionally, wherein the first environment condition comprises a first temperature, and the second environment condition comprises a second temperature different from the first temperature.

Example 59 includes the subject matter of any one of Examples 49-58, and optionally, comprising a Phase Locked Loop (PLL) comprising the LO.

Example 60 includes the subject matter of Example 59, and optionally, comprising a radar, the radar comprising a plurality of antennas connected to a plurality of PHY chains, and a processor to generate radar information based on radar signals communicated by the plurality of PHY chains via the plurality of antennas based on the required LO frequency.

Example 61 includes the subject matter of Example 60, and optionally, comprising a vehicle, the vehicle comprising the radar, and a system controller to control one or more systems of the vehicle based on the radar information.

Example 62 includes an apparatus comprising a Receive (Rx) chain comprising an amplifier configured to amplify a Radio-Frequency (RF) signal, the amplifier comprising an amplifier core biased according to a Direct Current (DC) bias voltage from a bias circuit; a switch switchable between a closed mode and an open mode, wherein at the closed mode the switch is to connect the amplifier core to a supply voltage, and wherein at the open mode the switch is to disconnect the amplifier core from the supply voltage; and a switch activator configured to cause the switch to switch from the closed mode to the open mode based on a DC current flow between the bias circuit and the amplifier core, the DC current flow based on a power of the RF signal.

In one example, the apparatus of Example 62 may include, for example, one or more additional elements, for example, as described with respect to Examples 1, 14, 30, and/or 49.

Example 63 includes the subject matter of Example 62, and optionally, wherein the switch activator comprises a voltage detector to detect a voltage difference between the DC bias voltage and a DC amplifier core voltage, which is based on the power of the RF signal, the voltage detector configured to cause the switch to switch from the closed mode to the open mode based on the voltage difference.

Example 64 includes the subject matter of Example 63, and optionally, comprising a resistor in a path between the bias circuit and the amplifier core, the voltage detector to detect the voltage difference based on a voltage drop across the resistor.

Example 65 includes the subject matter of Example 64, and optionally, wherein the resistor has a resistance of at least 0.5 kilo-Ohm.

Example 66 includes the subject matter of Example 64, and optionally, comprising a first resistor and a second resistor in the path between the bias circuit and the amplifier core, the first resistor connected between the bias circuit and the second resistor, the second resistor connected between the first resistor and the amplifier core, wherein the voltage detector is to detect the voltage difference based on a voltage drop across the first resistor.

Example 67 includes the subject matter of Example 66, and optionally, wherein the first resistor has a resistance of at least 0.5 kilo-Ohm, and the second resistor has a resistance of at least 0.5 kilo-Ohm.

Example 68 includes the subject matter of any one of Examples 62-67, and optionally, wherein the voltage detector is configured to cause the switch to switch from the closed mode to the open mode based on a comparison between the voltage difference and a DC voltage threshold.

Example 69 includes the subject matter of Example 68, and optionally, wherein the voltage detector is configured to cause the switch to switch from the closed mode to the open mode when the voltage difference is greater than the DC voltage threshold.

Example 70 includes the subject matter of Example 69, and optionally, wherein the voltage difference between the DC bias voltage and the DC core voltage is based on a positive half clipping of current at the amplifier core.

Example 71 includes the subject matter of Example 68, and optionally, wherein the voltage detector is configured to cause the switch to switch from the closed mode to the open mode when the voltage difference is less than the DC voltage threshold.

Example 72 includes the subject matter of Example 71, and optionally, wherein the voltage difference between the DC bias voltage and the DC core voltage is based on a negative half clipping of current at the amplifier core.

Example 73 includes the subject matter of Example 71 or 72, and optionally, wherein the amplifier comprises a class B amplifier, a class C amplifier, or a class AB amplifier.

Example 74 includes the subject matter of any one of Examples 62-73, and optionally, wherein the amplifier core comprises one or more Electrostatic Discharge (ESD) diodes to protect transistors of the core amplifier, and wherein the DC current flow between the bias circuit and the amplifier core is based on a voltage clamping by the ESD diodes.

Example 75 includes the subject matter of any one of Examples 72-74, and optionally, wherein the switch activator is configured to cause the switch to switch from the closed mode to the open mode when the power of the RF signal is above an RF power threshold.

Example 76 includes the subject matter of any one of Examples 72-75, and optionally, wherein the amplifier comprises a Low Noise Amplifier (LNA).

Example 77 includes the subject matter of any one of Examples 72-76, and optionally, wherein the amplifier is a first amplifier in the Rx chain to receive the RF signal from an antenna.

Example 78 includes the subject matter of any one of Examples 72-77, and optionally, wherein the RF signal comprises a radar signal.

Example 79 includes the subject matter of Example 78, and optionally, comprising a radar, the radar comprising a plurality of antennas connected to a plurality of Rx chains and a plurality of Transmit (Tx) chains, and a processor to generate radar information based on radar signals transmitted via the plurality of Tx chains and received via the plurality of Rx chains.

Example 80 includes the subject matter of Example 79, and optionally, comprising a vehicle, the vehicle comprising the radar, and a system controller to control one or more systems of the vehicle based on the radar information.

Example 81 includes an apparatus comprising means for executing any of the described operations of Examples 1-80.

Example 82 includes a machine-readable medium that stores instructions for execution by a processor to perform any of the described operations of Examples 1-80.

Example 83 includes an apparatus comprising a memory; and processing circuitry configured to perform any of the described operations of Examples 1-80.

Example 84 includes a method including any of the described operations of Examples 1-80.

Functions, operations, components and/or features described herein with reference to one or more aspects, may be combined with, or may be utilized in combination with, one or more other functions, operations, components and/or features described herein with reference to one or more other aspects, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
a plurality of Transmit (Tx) chains to transmit radar Tx signals; and
a plurality of Receive (Rx) chains to process radar Rx signals, the radar Rx signals based on the radar Tx signals, wherein an Rx chain of the plurality of Rx chains comprises a multi-core Low Noise Amplifier (LNA) configured to provide an amplified Radio-Frequency (RF) signal at an output node based on an input RF signal at an input node, the multi-core LNA comprising a plurality of LNA cores connected in parallel between the input node and the output node, the plurality of LNA cores comprising:
a first LNA core comprising a first LNA core input connected to the input node and a first LNA core output connected to the output node, the first LNA core biased by a first bias voltage; and
a second LNA core comprising a second LNA core input connected to the input node and a second LNA core output connected to the output node, the second LNA core biased by a second bias voltage different from the first bias voltage, wherein at least one of the first bias voltage or the second bias voltage is based on a Baseband (BB) signal, the BB signal is based on the amplified RF signal, wherein the first bias voltage and the second bias voltage are configured such that a total Output Intercept Point of an n-th order (OIPn) of a plurality of Rx chain elements of the Rx chain, which comprises the multi-core LNA, a mixer, and BB circuitry, is greater than an OIPn of the plurality of Rx chain elements excluding the multi-core LNA.

2. The apparatus of claim 1, wherein the first bias voltage and the second bias voltage are configured based on one or more Inter-Modulation (IM) products of the BB circuitry of the Rx chain.

3. The apparatus of claim 2, wherein the IM products comprise third order IM (IM3) products.

4. The apparatus of claim 1 comprising a controller configured to adaptively calibrate at least one of the first bias voltage or the second bias voltage based on the BB signal.

5. The apparatus of claim 4, wherein the controller is configured to calibrate at least one of the first bias voltage or the second bias voltage based on the total OIPn of the plurality of Rx chain elements comprising the multi-core LNA, the mixer, and the BB circuitry.

6. The apparatus of claim 1 comprising a controller configured to calibrate at least one of the first bias voltage or the second bias voltage to maximize the total OIPn of the plurality of Rx chain elements.

7. The apparatus of claim 1, wherein n is 3.

8. The apparatus of claim 1, wherein the total OIPn of the plurality of Rx chain elements comprising the multi-core LNA, the mixer and the BB circuitry, is greater than an OIPn of the multi-core LNA.

9. The apparatus of claim 1 comprising a Local Oscillator (LO) to generate a LO signal having a frequency of at least 30 Gigahertz (GHz), wherein the mixer is configured to generate a mixer output signal based on a mixer input signal and the LO signal, wherein the mixer input signal is based on the amplified RF signal, and the BB signal is based on the mixer output signal.

10. A radar device comprising:
a plurality of Transmit (Tx) antennas;
a plurality of Tx chains to transmit radar Tx signals via the plurality of Tx antennas;
a plurality of Receive (Rx) antennas;
a plurality of Rx chains to process radar Rx signals received via the plurality of Rx antennas, the radar Rx signals based on the radar Tx signals, wherein an Rx chain of the plurality of Rx chains comprises a multi-core Low Noise Amplifier (LNA) configured to provide an amplified Radio-Frequency (RF) signal at an output node based on an input RF signal at an input node, the multi-core LNA comprising a plurality of LNA cores connected in parallel between the input node and the output node, the plurality of LNA cores comprising:
a first LNA core comprising a first LNA core input connected to the input node and a first LNA core output connected to the output node, the first LNA core biased by a first bias voltage; and
a second LNA core comprising a second LNA core input connected to the input node and a second LNA core output connected to the output node, the second LNA core biased by a second bias voltage different from the first bias voltage, wherein at least one of the first bias voltage or the second bias voltage is based on a Baseband (BB) signal, the BB signal is based on the amplified RF signal, wherein the first bias voltage and the second bias voltage are configured such that a total Output Intercept Point of an n-th order (OIPn) of a plurality of Rx chain elements of the Rx chain, which comprises the multi-core LNA, a mixer, and BB circuitry, is greater than an OIPn of the plurality of Rx chain elements excluding the multi-core LNA; and
a processor to generate radar information based on the radar Rx signals processed by the Rx chains.

11. The radar device of claim 10, wherein the first bias voltage and the second bias voltage are configured based on one or more Inter-Modulation (IM) products of the BB circuitry of the Rx chain.

12. The radar device of claim 11, wherein the IM products comprise third order IM (IM3) products.

13. The radar device of claim 10 comprising a controller configured to adaptively calibrate at least one of the first bias voltage or the second bias voltage based on the BB signal.

14. The radar device of claim 13, wherein the controller is configured to calibrate at least one of the first bias voltage or the second bias voltage based on the total OIPn of the plurality of Rx chain elements comprising the multi-core LNA, the mixer, and the BB circuitry.

15. The radar device of claim 10 comprising a controller configured to calibrate at least one of the first bias voltage or the second bias voltage to maximize the total OIPn of the plurality of Rx chain elements.

16. The radar device of claim 10, wherein n is 3.

17. The radar device of claim 10, wherein the total OIPn of the Rx chain elements comprising the multi-core LNA, the mixer and the BB circuitry, is greater than an OIPn of the multi-core LNA.

18. The radar device of claim 10 comprising a Local Oscillator (LO) to generate a LO signal having a frequency of at least 30 Gigahertz (GHz), wherein the mixer is configured to generate a mixer output signal based on a mixer input signal and the LO signal, wherein the mixer input signal is based on the amplified RF signal, and the BB signal is based on the mixer output signal.

19. A vehicle comprising:
a system controller configured to control one or more vehicular systems of the vehicle based on radar information; and
a radar device configured to provide the radar information to the system controller, the radar device comprising:
a plurality of Transmit (Tx) antennas;
a plurality of Tx chains to transmit radar Tx signals via the plurality of Tx antennas;
a plurality of Receive (Rx) antennas;
a plurality of Rx chains to process radar Rx signals received via the plurality of Rx antennas, the radar Rx signals based on the radar Tx signals, wherein an Rx chain of the plurality of Rx chains comprises a multi-core Low Noise Amplifier (LNA) configured to provide an amplified Radio-Frequency (RF) signal at an output node based on an input RF signal at an input node, the multi-core LNA comprising a plurality of LNA cores connected in parallel between the input node and the output node, the plurality of LNA cores comprising:
a first LNA core comprising a first LNA core input connected to the input node and a first LNA core output connected to the output node, the first LNA core biased by a first bias voltage; and
a second LNA core comprising a second LNA core input connected to the input node and a second LNA core output connected to the output node, the second LNA core biased by a second bias voltage different from the first bias voltage, wherein at least one of the first bias voltage or the second bias voltage is based on a Baseband (BB) signal, the BB signal is based on the amplified RF signal, wherein the first bias voltage and the second bias voltage are configured such that a total Output Intercept Point of an n-th order (OIPn) of a plurality of Rx chain elements of the Rx chain, which comprises the multi-core LNA, a mixer, and BB circuitry, is greater than an OIPn of the plurality of Rx chain elements excluding the multi-core LNA; and
a processor to generate the radar information based on the radar Rx signals processed by the Rx chains.

20. The vehicle of claim 19, wherein the first bias voltage and the second bias voltage are configured based on one or more Inter-Modulation (IM) products of the BB circuitry of the Rx chain.

21. The vehicle of claim 19, wherein the radar device comprises a controller configured to adaptively calibrate at least one of the first bias voltage or the second bias voltage based on the BB signal.

22. The vehicle of claim 21, wherein the controller is configured to calibrate at least one of the first bias voltage or the second bias voltage based on the total OIPn of the Rx chain elements comprising the multi-core LNA, a mixer, and BB circuitry.

23. The vehicle of claim 19, wherein n is 3.

24. The vehicle of claim 19, wherein the total OIPn of the Rx chain elements comprising the multi-core LNA, the mixer and the BB circuitry, is greater than an OIPn of the multi-core LNA.

25. The vehicle of claim 19 comprising a Local Oscillator (LO) to generate a LO signal having a frequency of at least 30 Gigahertz (GHz), wherein the mixer is configured to generate a mixer output signal based on a mixer input signal and the LO signal, wherein the mixer input signal is based on the amplified RF signal, and the BB signal is based on the mixer output signal.

* * * * *